United States Patent
Waters et al.

(10) Patent No.: US 10,234,476 B2
(45) Date of Patent: Mar. 19, 2019

(54) EXTRACTING INERTIAL INFORMATION FROM NONLINEAR PERIODIC SIGNALS

(71) Applicant: Lumedyne Technologies Incorporated, San Diego, CA (US)

(72) Inventors: Richard Lee Waters, San Diego, CA (US); Mark Steven Fralick, San Diego, CA (US); Charles Harold Tally, IV, Carlsbad, CA (US); John David Jacobs, San Diego, CA (US)

(73) Assignee: Google LLC, Mountain View, CA (US)

( * ) Notice: Subject to any disclaimer, the term of this patent is extended or adjusted under 35 U.S.C. 154(b) by 182 days.

(21) Appl. No.: 15/160,091

(22) Filed: May 20, 2016

(65) Prior Publication Data

US 2016/0341758 A1    Nov. 24, 2016

Related U.S. Application Data

(60) Provisional application No. 62/164,378, filed on May 20, 2015.

(51) Int. Cl.
*G06F 11/30*    (2006.01)
*G01P 15/08*    (2006.01)
(Continued)

(52) U.S. Cl.
CPC .......... *G01P 15/0802* (2013.01); *G01C 19/04* (2013.01); *G01P 15/093* (2013.01); *G01P 15/097* (2013.01); *G01P 15/125* (2013.01); *G01P 15/13* (2013.01); *B81B 2201/0235* (2013.01); *B81B 2203/051* (2013.01); *G01D 5/2415* (2013.01); *G01P 21/00* (2013.01);
(Continued)

(58) Field of Classification Search
CPC .................................................. G01P 15/0802
See application file for complete search history.

(56) References Cited

U.S. PATENT DOCUMENTS

| 3,925,642 A | 12/1975 | Roantree et al. |
| 4,930,351 A | 6/1990 | Macy et al. |

(Continued)

FOREIGN PATENT DOCUMENTS

| CN | 1164147 | 11/1997 |
| CN | 1783725 | 6/2006 |

(Continued)

OTHER PUBLICATIONS

International Search Report and Written Opinion dated Aug. 31, 2016 in PCT/US2016/033566, filed May 20, 2016 (11 pages).

(Continued)

*Primary Examiner* — Phuong Huynh
(74) *Attorney, Agent, or Firm* — Colby Nipper

(57) ABSTRACT

Systems and methods are described herein for extracting inertial information from nonlinear periodic signals. A system for determining an inertial parameter can include circuitry configured for receiving a first periodic analog signal from a first sensor that is responsive to motion of a proof mass, converting the first periodic analog signal to a first periodic digital signal, determining a result of trigonometrically inverting a quantity, the quantity based on the first periodic digital signal, and determining the inertial parameter based on the result.

37 Claims, 33 Drawing Sheets

(51) Int. Cl.
*G01C 19/04* (2006.01)
*G01P 15/125* (2006.01)
*G01P 15/13* (2006.01)
*G01P 15/093* (2006.01)
*G01P 15/097* (2006.01)
G01P 21/00 (2006.01)
G01D 5/241 (2006.01)

(52) U.S. Cl.
CPC ............ *G01P 2015/0814* (2013.01); *G01P 2015/0865* (2013.01)

(56) References Cited

U.S. PATENT DOCUMENTS

| | | |
|---|---|---|
| 5,561,400 A | 10/1996 | Iguchi et al. |
| 5,572,057 A | 11/1996 | Yamamoto et al. |
| 5,635,638 A | 6/1997 | Green |
| 5,703,292 A | 12/1997 | Ward |
| 5,747,690 A | 5/1998 | Park et al. |
| 5,894,282 A | 4/1999 | Betts et al. |
| 5,955,668 A | 9/1999 | Hsu |
| 5,992,233 A | 11/1999 | Clark |
| 5,996,411 A | 12/1999 | Leonardson et al. |
| 6,044,707 A | 4/2000 | Kato |
| 6,067,858 A | 5/2000 | Clark et al. |
| 6,109,114 A | 8/2000 | Hartley et al. |
| 6,122,962 A | 9/2000 | Yoshino et al. |
| 6,158,280 A | 12/2000 | Nonomura et al. |
| 6,248,610 B1 | 6/2001 | Leonardson et al. |
| 6,250,156 B1 | 6/2001 | Seshia et al. |
| 6,259,999 B1 | 7/2001 | Pantle |
| 6,393,913 B1 | 5/2002 | Dyck et al. |
| 6,422,076 B1 | 7/2002 | Prokofiev et al. |
| 6,526,826 B2 | 3/2003 | Kurachi et al. |
| 6,584,864 B2 | 7/2003 | Greenwood |
| 6,629,448 B1 | 10/2003 | Cvancara |
| 6,629,460 B2 | 10/2003 | Challoner |
| 6,679,995 B1 | 1/2004 | Banjac et al. |
| 6,715,353 B2 | 4/2004 | Johnson |
| 6,725,719 B2 | 4/2004 | Cardarelli |
| 6,767,758 B1 | 7/2004 | Geen |
| 6,796,178 B2 | 9/2004 | Jeong |
| 6,859,751 B2 | 2/2005 | Cardarelli |
| 6,955,086 B2 | 10/2005 | Yoshikawa et al. |
| 6,966,224 B2 | 11/2005 | Yan et al. |
| 7,088,030 B2 | 8/2006 | Hsieh et al. |
| 7,107,841 B2 | 9/2006 | Mori |
| 7,119,555 B2 | 10/2006 | Takekawa et al. |
| 7,302,848 B2 | 12/2007 | Kourepenis et al. |
| 7,377,167 B2 | 5/2008 | Acar et al. |
| 7,444,868 B2 | 11/2008 | Johnson |
| 7,481,110 B2 | 1/2009 | Handrich et al. |
| 7,505,865 B2 | 3/2009 | Ohkubo et al. |
| 7,836,765 B2 | 11/2010 | Challoner |
| 7,997,137 B2 | 8/2011 | Lee et al. |
| 8,061,201 B2 | 11/2011 | Ayazi et al. |
| 8,141,426 B2 | 3/2012 | Ikeuchi |
| 8,220,328 B2 | 7/2012 | Rudolf et al. |
| 8,375,791 B2 | 2/2013 | Huang |
| 8,378,756 B2 | 2/2013 | Huang |
| 8,427,249 B1 | 4/2013 | Swanson et al. |
| 8,453,504 B1 | 6/2013 | Mao |
| 8,474,316 B2 | 7/2013 | Blomqvist |
| 8,527,228 B2 | 9/2013 | Panagas |
| 8,650,955 B2 | 2/2014 | Swanson et al. |
| 8,833,162 B2 | 9/2014 | Seeger et al. |
| 8,875,576 B2 | 11/2014 | Swanson et al. |
| 8,952,838 B2 | 2/2015 | Waters et al. |
| 8,981,834 B2 | 3/2015 | Spinella et al. |
| 8,991,250 B2 | 3/2015 | Waters et al. |
| 9,128,496 B2 | 9/2015 | Waters et al. |
| 9,157,814 B2 | 10/2015 | Swanson et al. |
| 9,170,107 B2 | 10/2015 | Anac et al. |
| 9,194,704 B2 | 11/2015 | Lin et al. |
| 9,246,017 B2 | 1/2016 | Van Der Heide et al. |
| 9,274,136 B2 | 3/2016 | Trusov et al. |
| 9,278,846 B2 | 3/2016 | Acar |
| 9,423,254 B2 | 8/2016 | Waters et al. |
| 9,618,533 B2 | 4/2017 | Waters et al. |
| 9,645,166 B2 | 5/2017 | Waters et al. |
| 9,910,061 B2 | 3/2018 | Waters et al. |
| 9,910,062 B2 | 3/2018 | Waters et al. |
| 9,989,553 B2 | 6/2018 | Waters et al. |
| 2001/0022107 A1 | 9/2001 | Kato et al. |
| 2001/0029784 A1 | 10/2001 | Kurachi et al. |
| 2001/0039834 A1 | 11/2001 | Hsu |
| 2001/0044165 A1 | 11/2001 | Lee et al. |
| 2002/0000124 A1 | 1/2002 | Sakai |
| 2002/0005976 A1 | 1/2002 | Benin et al. |
| 2002/0020219 A1 | 2/2002 | DeRoo et al. |
| 2002/0093908 A1 | 7/2002 | Yeap |
| 2002/0158293 A1 | 10/2002 | Lee et al. |
| 2002/0164833 A1 | 11/2002 | Cho et al. |
| 2003/0084722 A1 | 5/2003 | Kim et al. |
| 2003/0159510 A1 | 8/2003 | Stewart et al. |
| 2003/0173981 A1 | 9/2003 | Fasen et al. |
| 2004/0211258 A1 | 10/2004 | Geen |
| 2005/0031140 A1 | 2/2005 | Browning |
| 2005/0091006 A1 | 4/2005 | Rober |
| 2005/0132804 A1 | 6/2005 | Park et al. |
| 2006/0074338 A1* | 4/2006 | Greenwald .......... A61B 5/0002 600/549 |
| 2006/0079191 A1 | 4/2006 | Parssinen et al. |
| 2006/0162450 A1 | 7/2006 | Harada et al. |
| 2006/0201250 A1 | 9/2006 | Kourepenis et al. |
| 2006/0222107 A1 | 10/2006 | Neubauer et al. |
| 2006/0284514 A1 | 12/2006 | Ko et al. |
| 2007/0032748 A1 | 2/2007 | McNeil et al. |
| 2007/0062282 A1 | 3/2007 | Akashi et al. |
| 2007/0163324 A1 | 7/2007 | McMahan et al. |
| 2007/0194857 A1 | 8/2007 | Schwarzelbach |
| 2007/0210951 A1 | 9/2007 | Yamaji |
| 2007/0214883 A1 | 9/2007 | Durante et al. |
| 2008/0000296 A1 | 1/2008 | Johnson |
| 2008/0275664 A1 | 11/2008 | Schmid et al. |
| 2009/0064780 A1 | 3/2009 | Coronato et al. |
| 2009/0183570 A1 | 7/2009 | Acar et al. |
| 2010/0071467 A1 | 3/2010 | Nasiri et al. |
| 2010/0107758 A1 | 5/2010 | Kandori et al. |
| 2010/0107759 A1 | 5/2010 | Kato |
| 2010/0117167 A1 | 5/2010 | Yokura et al. |
| 2010/0288047 A1 | 11/2010 | Takagi |
| 2010/0319451 A1 | 12/2010 | Trusov et al. |
| 2010/0326191 A1 | 12/2010 | Foster et al. |
| 2011/0004444 A1* | 1/2011 | Farrow ................... G01P 1/127 702/187 |
| 2011/0016973 A1 | 1/2011 | Hamatani et al. |
| 2011/0041601 A1 | 2/2011 | Hsu et al. |
| 2011/0056750 A1 | 3/2011 | Lucon |
| 2011/0138913 A1 | 6/2011 | Je |
| 2011/0167891 A1 | 7/2011 | Geen |
| 2011/0197674 A1 | 8/2011 | Prandi et al. |
| 2012/0061172 A1 | 3/2012 | Yacine |
| 2012/0065524 A1 | 3/2012 | Morren et al. |
| 2012/0096942 A1 | 4/2012 | Hayashi et al. |
| 2012/0096943 A1 | 4/2012 | Potasek et al. |
| 2012/0132002 A1 | 5/2012 | Dube et al. |
| 2012/0272711 A1 | 11/2012 | Supino et al. |
| 2012/0272732 A1 | 11/2012 | Leverrier |
| 2012/0279300 A1 | 11/2012 | Walther |
| 2012/0297873 A1 | 11/2012 | Zou et al. |
| 2012/0326700 A1 | 12/2012 | Swanson et al. |
| 2013/0061675 A1 | 3/2013 | Kim et al. |
| 2013/0104622 A1 | 5/2013 | Swanson et al. |
| 2013/0104656 A1 | 5/2013 | Smith |
| 2013/0111990 A1 | 5/2013 | Wang et al. |
| 2013/0180333 A1 | 7/2013 | Swanson et al. |
| 2013/0192363 A1 | 8/2013 | Loreck et al. |
| 2013/0218504 A1 | 8/2013 | Fall et al. |
| 2013/0239679 A1 | 9/2013 | Kornilovich |
| 2013/0247669 A1 | 9/2013 | Swanson et al. |
| 2013/0249615 A1 | 9/2013 | Lai et al. |
| 2013/0283908 A1 | 10/2013 | Geen et al. |
| 2013/0298670 A1 | 11/2013 | Tsugai et al. |

(56) References Cited

U.S. PATENT DOCUMENTS

| | | |
|---|---|---|
| 2013/0298675 A1 | 11/2013 | Thiruvenkatanathan et al. |
| 2014/0007681 A1 | 1/2014 | Lin |
| 2014/0047918 A1 | 2/2014 | Swanson et al. |
| 2014/0055124 A1 | 2/2014 | Kim et al. |
| 2014/0060184 A1 | 3/2014 | Walther |
| 2014/0069188 A1 | 3/2014 | Waters et al. |
| 2014/0083190 A1 | 3/2014 | Kaack et al. |
| 2014/0116134 A1 | 5/2014 | Classen et al. |
| 2014/0144230 A1 | 5/2014 | Magnoni et al. |
| 2014/0144232 A1 | 5/2014 | Lin et al. |
| 2014/0208823 A1 | 7/2014 | Trusov et al. |
| 2014/0260508 A1 | 9/2014 | Dar et al. |
| 2014/0260608 A1 | 9/2014 | Lin et al. |
| 2014/0300425 A1 | 10/2014 | Cazzaniga et al. |
| 2014/0305213 A1 | 10/2014 | Swanson et al. |
| 2014/0361348 A1 | 12/2014 | Yoneoka et al. |
| 2015/0046737 A1 | 2/2015 | Hattori et al. |
| 2015/0114117 A1 | 4/2015 | Nakagawa |
| 2015/0211853 A1 | 7/2015 | Anac et al. |
| 2015/0377622 A1 | 12/2015 | Waters et al. |
| 2015/0377623 A1 | 12/2015 | Waters et al. |
| 2015/0377916 A1 | 12/2015 | Waters et al. |
| 2015/0377917 A1 | 12/2015 | Waters et al. |
| 2015/0377918 A1 | 12/2015 | Waters et al. |
| 2016/0123735 A1 | 5/2016 | Gregory et al. |
| 2016/0126890 A1 | 5/2016 | Swanson et al. |
| 2016/0299873 A1 | 10/2016 | Tally et al. |
| 2016/0332872 A1 | 11/2016 | Iihola et al. |
| 2016/0341761 A1 | 11/2016 | Waters et al. |
| 2016/0341762 A1 | 11/2016 | Waters et al. |
| 2017/0003314 A1 | 1/2017 | Waters et al. |
| 2017/0122974 A1 | 5/2017 | Lin |
| 2017/0153266 A1 | 6/2017 | Dao |
| 2018/0031601 A1 | 2/2018 | Anac et al. |
| 2018/0031602 A1 | 2/2018 | Huang et al. |
| 2018/0031603 A1 | 2/2018 | Huang et al. |
| 2018/0135985 A1 | 5/2018 | Song et al. |
| 2018/0299269 A1 | 10/2018 | Anac et al. |

FOREIGN PATENT DOCUMENTS

| | | |
|---|---|---|
| CN | 102449433 | 5/2012 |
| CN | 107636473 | 1/2018 |
| EP | 1083430 | 3/2001 |
| EP | 1172657 | 1/2002 |
| EP | 2259019 | 12/2010 |
| GB | 947310 | 1/1964 |
| GB | 2529277 | 2/2016 |
| JP | 02119314 | 5/1990 |
| JP | 2001135039 | 5/2001 |
| JP | 2006304035 | 11/2006 |
| JP | 2012242286 | 12/2012 |
| TW | 594016 | 6/2004 |
| TW | 200807887 | 2/2008 |
| TW | I305578 | 5/2008 |
| TW | I471567 | 1/2012 |
| TW | 201346263 | 11/2013 |
| TW | I495848 | 8/2015 |
| TW | I497078 | 8/2015 |
| WO | 0005552 | 2/2000 |
| WO | WO-00/05552 | 2/2000 |
| WO | WO 01/69266 | 9/2001 |
| WO | 2006039560 | 4/2006 |
| WO | 2012037538 | 3/2012 |
| WO | 2014149085 | 9/2014 |
| WO | 2015200850 | 12/2015 |
| WO | 2016187560 | 11/2016 |
| WO | 2017004443 | 1/2017 |
| WO | 2017095819 | 6/2017 |
| WO | 2018022803 | 2/2018 |
| WO | 2018022811 | 2/2018 |
| WO | 2018022877 | 2/2018 |
| WO | 2018022892 | 2/2018 |

OTHER PUBLICATIONS

Office Action dated Dec. 22, 2016 in U.S. Appl. No. 14/751,465, (20 pages).
"Ex Parte Quayle Action", U.S. Appl. No. 14/751,465, Sep. 15, 2017, 5 pages.
"Final Office Action", U.S. Appl. No. 14/751,536, dated May 18, 2017, 14 pages.
"Non-Final Office Action", U.S. Appl. No. 14/954,749, dated Jul. 3, 2017, 9 pages.
"Non-Final Office Action", U.S. Appl. No. 14/751,536, dated Sep. 13, 2017, 8 pages.
"Non-Final Office Action", U.S. Appl. No. 14/751,536, dated Dec. 28, 2016, 20 pages.
"Signal Averaging", retrieved from http://en.wikipedia.org/w/index.php?title=Signal_averaging&oldid=382909172 on Oct. 13, 2017; As cited on EP Supplemental Search from EP Application 12825824.1 dated Jun. 16, 2015, 3 pages.
"Written Opinion", PCT Application No. PCT/US2016/040538, dated Jan. 11, 2017, 11 pages.
"Written Opinion", PCT Application No. PCT/US2016/064023, dated Jun. 8, 2017, 7 pages.
"Written Opinion", PCT Application No. PCT/US2016/033566, dated Nov. 24, 2016, 6 pages.
Alshehri, et al., "Experimental Evaluation of a Two Degree of Freedom Capacitive MEMS Sensor for Velocity Measurements", Procedia Engineering, vol. 25, ISSN 1877-7058;, 2011, pp. 619-622.
Alshehri, et al., "Two-degree of Freedom Capacitive MEMS Velocity Sensor with Two Coupled Electrically Isolated Mass-Spring-Damper Systems", Sensors, IEEE, Valencia, 2014, pp. 1603-1606.
Kuijpers, "Micromachined Capacitive Long-Range Displacement Sensor for Nano-Positioning of Microactuator Systems", ISBN 90-365-2119-X, Dec. 8, 2004, 208 pages.
"International Search Report and Written Opinion", PCT Application No. PCT/US2017/044028, dated Jan. 9, 2018, 15 pages.
"International Search Report and Written Opinion", PCT Application No. PCT/US2017/044188, dated Oct. 30, 2017, 14 pages.
"International Search Report and Written Opinion", PCT Application No. PCT/US2017/044164, dated Nov. 6, 2017, 12 pages.
"International Search Report and Written Opinion", PCT Application No. PCT/US2017/044043, dated Nov. 6, 2017, 15 pages.
"Invitation to Pay Additional Fees and Partial Search Report", PCT Application No. PCT/US2017/044028, dated Nov. 17, 2017, 13 pages.
"Non-Final Office Action", U.S. Appl. No. 15/160,098, dated Jan. 2, 2018, 16 pages.
"Notice of Allowance", U.S. Appl. No. 14/751,465, dated Nov. 28, 2017, 5 pages.
"Notice of Allowance", U.S. Appl. No. 14/751,536, dated Nov. 28, 2017, 7 pages.
"Preliminary Report on Patentability", PCT Application No. PCT/US2016/033566, dated Nov. 30, 2017, 8 pages.
International Search Report and Written Opinion dated Jan. 26, 2016 in PCT/US2015/038100, filed Jun. 26, 2015 (26 pages).
International Search Report and Written Opinion dated Mar. 24, 2016 in PCT/US2015/038107, filed Jun. 26, 2015 (23 pages).
Invitation to Pay Additional Fees dated Nov. 5, 2015 in PCT/US2015/038100, filed Jun. 26, 2015 (8 pages).
Invitation to Pay Additional Fees dated Oct. 23, 2015 in PCT/US2015/038107 filed Jun. 26, 2015 (8 pages).
Office Action dated Dec. 31, 2015 in U.S. Appl. No. 14/751,347, (16 pages).
Office Action dated Mar. 31, 2016 in U.S. Appl. No. 14/751,347, (16 pages).
"Final Office Action", U.S. Appl. No. 15/221,563, dated Jul. 27, 2018, 11 pages.
"Foreign Office Action", European Application No. 16816074.5, dated Jul. 6, 2018, 3 pages.
"Non-Final Office Action", U.S. Appl. No. 14/954,749, dated Jul. 17, 2018, 6 pages.
"Non-Final Office Action", U.S. Appl. No. 15/227,773, dated Jul. 25, 2018, 25 pages.

(56) References Cited

OTHER PUBLICATIONS

"Final Office Action", U.S. Appl. No. 14/954,749, dated Feb. 12, 2018, 12 pages.
"First Action Interview Office Action", U.S. Appl. No. 15/221,563, dated May 11, 2018, 5 pages.
"Foreign Office Action", Taiwanese Application No. 106125144, dated Apr. 10, 2018, 5 pages.
"Foreign Office Action", Taiwanese Application No. 106125142, dated Apr. 10, 2018, 7 pages.
"Foreign Office Action", Taiwanese Application No. 106125143, dated Apr. 25, 2018, 5 pages.
"Foreign Office Action—Needs Translation", Taiwanese Application No. 106125146, dated Jun. 21, 2018, 7 pages.
"Foreign Office Action—Needs Translation", Taiwanese Application No. 105115787, dated Jun. 5, 2018, 4 pages.
"Foreign Office Action—Needs Translation", Taiwanese Application No. 105120796, dated Jun. 5, 2018, 8 pages.
"International Preliminary Report on Patentability", PCT Application No. PCT/US2016/064023, dated Jun. 5, 2018, 8 pages.
"Notice of Allowance", U.S. Appl. No. 15/160,098, dated Mar. 28, 2018, 7 pages.
"Pre-Interview Communication", U.S. Appl. No. 15/221,563, dated Apr. 9, 2018, 4 pages.
"Restriction Requirement", U.S. Appl. No. 15/227,773, dated Apr. 23, 2018, 9 pages.
"Restriction Requirement", U.S. Appl. No. 15/198,924, dated Apr. 4, 2018, 5 pages.
"Restriction Requirement", U.S. Appl. No. 15/221,566, dated May 18, 2018, 8 pages.
"Restriction Requirement", U.S. Appl. No. 15/267,024, dated May 29, 2018, 6 pages.
"Written Opinion", PCT Application No. PCT/US2017/044188, dated Jun. 11, 2018, 8 pages.
"Written Opinion", PCT Application No. PCT/US2017/044164, dated Jun. 5, 2018, 7 pages.
"Foreign Office Action", Taiwanese Application No. 105120796, dated Oct. 16, 2018, 6 pages.
"Foreign Office Action", Taiwanese Application No. 106125143, dated Nov. 8, 2018, 7 pages.
"International Preliminary Report on Patentability", PCT Application No. PCT/US2017/044164, dated Oct. 18, 2018, 20 pages.
"International Preliminary Report on Patentability", PCT Application No. PCT/US2017/044188, dated Nov. 21, 2018, 19 pages.
"Non-Final Office Action", U.S. Appl. No. 15/267,024, dated Sep. 7, 2018, 10 pages.
"Non-Final Office Action", U.S. Appl. No. 15/198,924, dated Sep. 11, 2018, 9 pages.
"Non-Final Office Action", U.S. Appl. No. 15/221,566, dated Sep. 14, 2018, 30 pages.
"Notice of Allowance", U.S. Appl. No. 15/275,188, dated Oct. 25, 2018, 17 pages.
"Foreign Office Action", Chinese Application No. 201610629158.4, dated Jan. 16, 2019, 8 pages.

\* cited by examiner

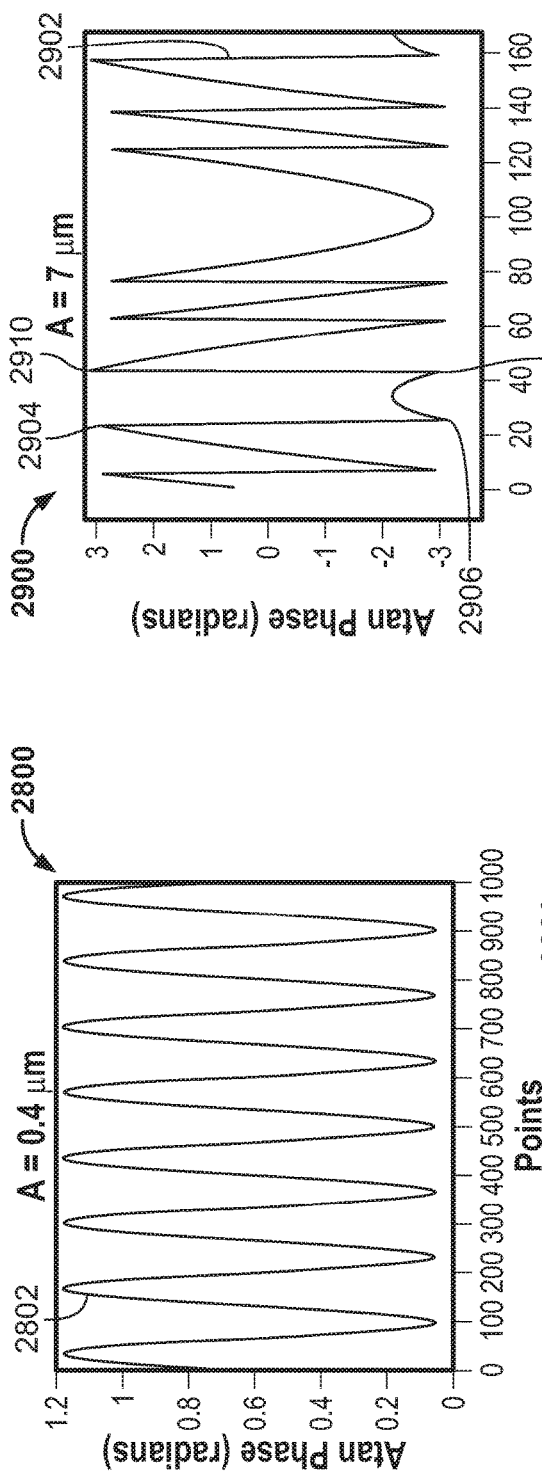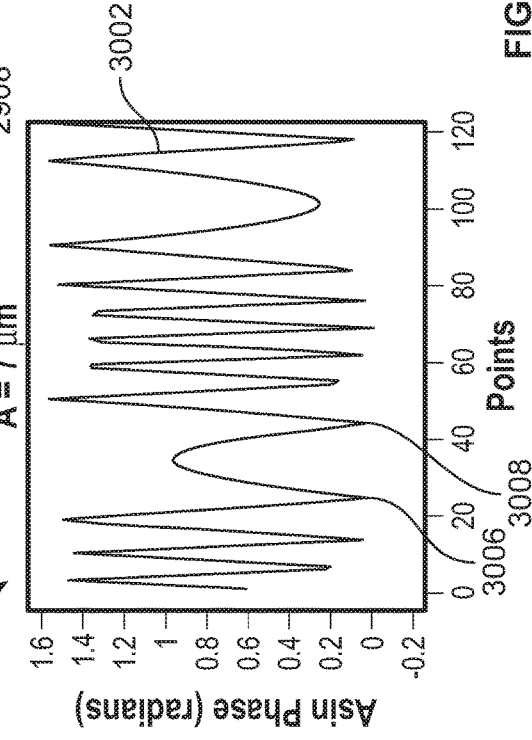

EXTRACTING INERTIAL INFORMATION FROM NONLINEAR PERIODIC SIGNALS

CROSS REFERENCE TO RELATED APPLICATIONS

This application claims priority to U.S. Provisional Application Ser. No. 62/164,378, filed May 20, 2015, the entire contents of which are hereby incorporated by reference.

BACKGROUND

Linear inertial sensors, those which use linear signals to determine inertial information, are subject to error due to drift. These linear inertial sensors scale linear signals by one or more predetermined quantities to determine inertial information such as acceleration or rotation. These predetermined quantities can account for spring constants, amplifier gain, and other factors. However, since spring constants, gain, and these other factors can drift over time, linear inertial sensors can develop an error due to this drift.

SUMMARY

Accordingly, systems and methods are described herein for extracting inertial information from nonlinear periodic signals. A system for determining an inertial parameter can include circuitry configured for receiving a first periodic analog signal from a first sensor that is responsive to motion of a proof mass, converting the first periodic analog signal to a first periodic digital signal, determining a result of trigonometrically inverting a quantity, the quantity based on the first periodic digital signal, and determining the inertial parameter based on the result.

In some examples, the first sensor is a first electrode interacting with the proof mass. In some examples, the first electrode electrostatically interacts with the proof mass.

In some examples, the inertial parameter includes a displacement of the proof mass. In some examples, determining the inertial parameter can include multiplying the unwrapped inverted signal by a geometric dimension to obtain the displacement of the proof mass.

In some examples, the system can include circuitry configured for unwrapping the result. Determining the inertial parameter based on the result can include determining the inertial parameter based on the unwrapped result.

In some examples, the system can include circuitry configured for conditioning the first periodic digital signal by scaling the first periodic digital signal to a predetermined amplitude and offsetting the first periodic digital signal. The quantity can be based on the conditioned first periodic digital signal.

In some examples, determining the result of trigonometrically inverting includes determining the result of applying an arcsine function to the quantity. In some examples, determining the result of trigonometrically inverting includes determining the result of applying an arccosine function to the quantity. In some examples, determining the result of trigonometrically inverting includes determining the result using a lookup table, the result corresponding to the conditioned digital signal.

In some examples, unwrapping includes determining that a phase wrap has occurred by determining that a slope of the result has changed sign, determining that the result has changed by a predetermined increment, and determining that the sum of a prior slope and a prior value of the result would exceed a threshold. Unwrapping can further include adjusting the present value of and one or more future values of the result.

In some examples, the system can include circuitry configured for low-pass filtering the displacement to determine an inertial displacement and multiplying the inertial displacement by a square of a natural frequency of the proof mass to determine an acceleration of the proof mass.

In some examples, the first periodic digital signal includes a quotient of a first digital signal and a second digital signal.

In some examples, the system further includes circuitry configured for conditioning the first periodic digital signal by scaling the first periodic digital signal to a predetermined amplitude, and offsetting the first periodic digital signal. The quantity can be based on the conditioned periodic digital signal.

In some examples, offsetting includes integrating the first periodic digital signal for a predetermined time interval to determine an integral and subtracting the integral from the first periodic digital signal.

In some examples, the system includes circuitry configured for amplifying the first periodic analog signal to a first periodic analog voltage.

In some examples, the system includes circuitry configured for receiving a second analog signal from a second sensor that is responsive to motion of the proof mass, amplifying the second analog signal to a second analog voltage, converting the second analog voltage to a second periodic digital signal, and conditioning the second periodic digital signal. Conditioning the second periodic digital signal can include scaling the second periodic digital signal to the predetermined amplitude and offsetting the second periodic digital signal to the predetermined offset. The quantity can be based on a quotient of the first and second conditioned digital signals.

In some examples, the system can include circuitry configured for receiving a second analog signal from a second electrode adjacent to the proof mass. Amplifying the first analog signal to the first analog voltage can include amplifying a difference between the first and second analog signals to the first analog voltage.

In some examples, the system can include circuitry configured for receiving third and fourth analog signals from third and fourth sensors, respectively, each sensor responsive to motion of the proof mass. The system can also include circuitry configured for amplifying a second difference between the third and fourth analog signals to a second analog voltage, converting the second analog voltage to a second digital representation to generate a second periodic digital signal, and conditioning the second periodic digital signal. Conditioning the second periodic digital signal can include scaling the second periodic digital signal to the predetermined amplitude and offsetting the second periodic digital signal to the predetermined offset. The quantity can include a quotient of the first and second conditioned digital signals.

In some examples, the second, third, and fourth sensors are second, third, and fourth electrodes, respectively, each electrostatically interacting with the proof mass.

In some examples, the system includes the proof mass and the first sensor. In some examples, the system includes the second sensor. In some examples, the system includes the third and fourth sensors.

BRIEF DESCRIPTION OF THE DRAWINGS

The above and other features of the present disclosure, including its nature and its various advantages, will be more apparent upon consideration of the following detailed description, taken in conjunction with the accompanying drawings in which:

FIG. 28 depicts a graph that shows the digital output of the arctangent algorithm for a low amplitude of proof mass oscillation, an amplitude that does not result in phase wrap events, according to an illustrative implementation;

FIG. 29 depicts a graph showing the output of the arctangent algorithm when a proof mass has an oscillation amplitude larger than one-half the pitch distance of a TDS structure, according to an illustrative implementation;

FIG. 30 depicts a graph showing a digital output signal of the arcsine algorithm, where the proof mass has an oscillation amplitude greater than one-half the pitch, causing phase wraps, according to an illustrative implementation;

DETAILED DESCRIPTION

Figure 1:
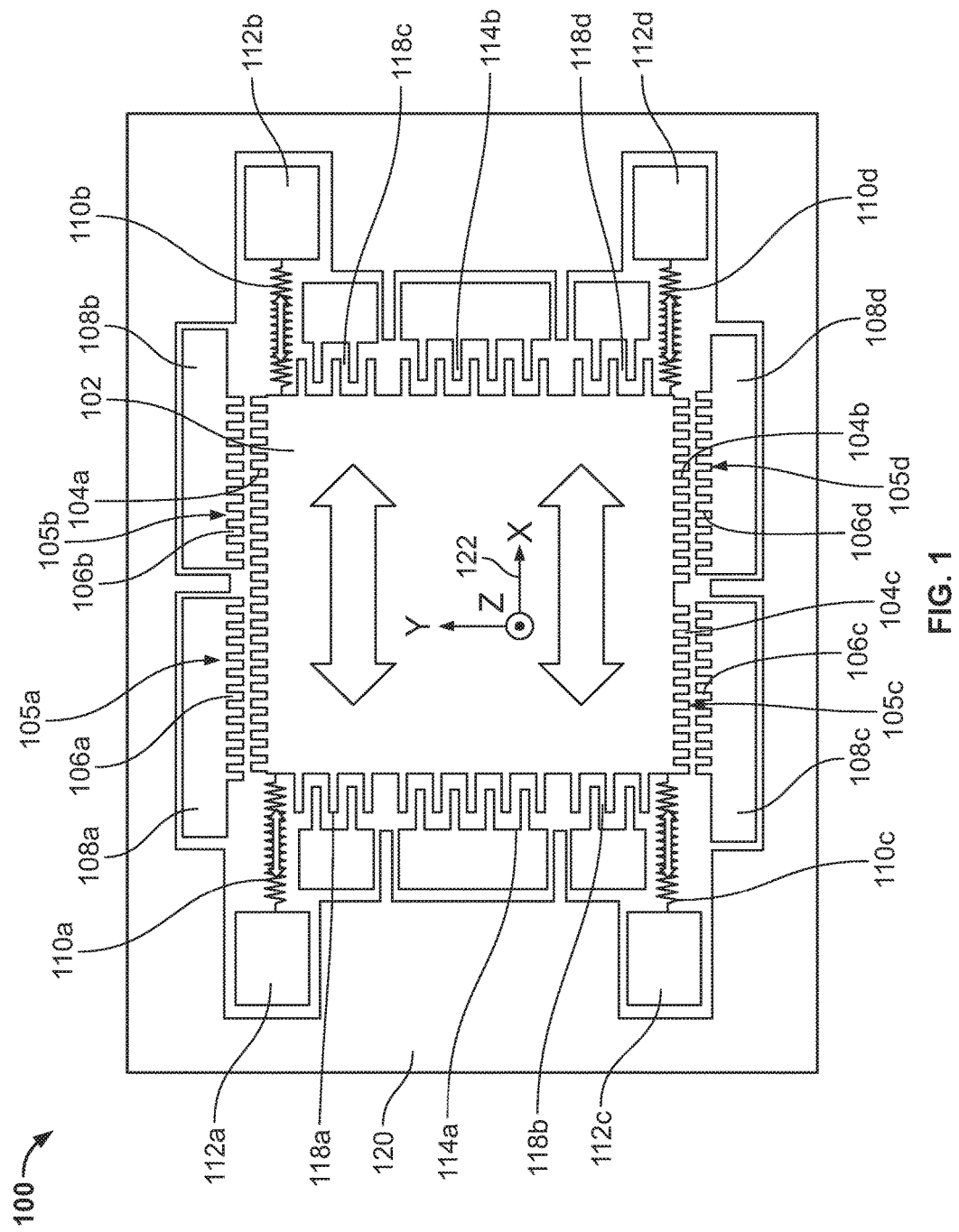
FIG. 1 depicts an inertial device that extracts inertial information from nonlinear periodic signals, according to an illustrative implementation.

The systems and methods described herein extract inertial information from nonlinear periodic signals. In particular, the systems and methods described herein produce an analog signal that varies nonlinearly and nonmonotonically in response to monotonic motion of a proof mass. In some examples, the proof mass is oscillated periodically, and so the analog signal also oscillates periodically. Inertial information is extracted from the nonlinear, nonmonotonic analog signal.

In some examples, the proof mass is driven to oscillate in a substantially sinusoidal motion, which causes the analog signal to oscillate substantially sinusoidally. The proof mass can be driven in an open-loop manner, or it can be driven by an analog or a digital closed-loop drive. One way to produce a nonmonotonic signal from a monotonic motion of the proof mass is to oscillate a surface of the proof mass relative to an opposing surface, both surfaces having some nonplanarity. In some examples, the opposing surface is located on a frame of the inertial device, such that the opposing surface experiences the same acceleration as the inertial device.

One example of a surface nonplanarity is a single asperity, or a tooth. Teeth on opposing surfaces can be aligned when the proof mass is in a rest position, or the teeth can be shifted with respect to each other at rest. As the proof mass moves with respect to the opposing surface in a motion that maintains the nominal gap between the proof mass and the opposing surface, the spacing between the tips of the teeth changes. As the teeth approach and then move past each other, the spacing between the respective teeth varies nonmonotonically, because it decreases and then increases. The spacing changes nonmonotonically even though the motion of the proof mass is monotonic over this region. This nonmonotonic change in spacing between the teeth produces an analog signal that also changes nonmonotonically based on a monotonic motion of the proof mass. The analog signal can be received by a sensor that responds to motion of the proof mass. The sensor can comprise an electrode. The electrode can electrostatically interact with the proof mass. The analog signal can be produced as a result of electrostatic interaction between the proof mass and the opposing surface. Depending on the configuration of the sensor, the analog signal can be a capacitance, a capacitive current, an inductance, an inductive current, a tunneling current, an optical signal, an electromagnetic signal, or another similar signal. An electrical voltage can be applied between the proof mass and the opposing surface to aid in generating the analog signal.

There are other possible ways to create a spatial frequency that is higher than the drive frequency and that would be to use coupled oscillator systems where sums and differences of the two resonator frequencies are generated. For the coupled oscillator example, the geometric dimension is tied to the length, width and thickness of the complaint spring structures used to establish the resonant frequencies of each of the coupled oscillators.

Another possibility is an optical shuttering system (where optics are used instead of electrostatics). The shuttering mechanism is attached to the oscillating proof mass and a sensor is positioned to detect light from a source. The shuttering mechanism modulates the intensity of the transmitted light. Changes in the light transmission resulting from movement of the shuttering mechanism with the proof mass are sensed by the optical sensor. In this case, as a result of changes in the position of the shutter, there can be an increase, such as a doubling, in modulation frequency as the light is passed through the shutter relative to an oscillation of the proof mass, such as two times per oscillation cycle of the proof mass. The sensor responds to the changes in transmission resulting from motion of the proof mass, such that the reference mass interacts with the sensor, and produces a resulting analog signal.

Alternatively, again using optics, is to create an optically resonant cavity such as a Fabry-Perot wherein one of the mirrors is attached to the proof mass. If the proof mass oscillates such that the cavity spacing between the mirrors changes, and if the oscillation amplitude is large enough, the cavity will spatially pass multiples of $n*\lambda/2$ where $\lambda$ is the wavelength of light and n is the index of refraction of the optical cavity. Every time the spatial mirror gap reaches $n*\lambda/2$, a maximum in optical transmission occurs. So as long as the drive amplitude>$n*\lambda/2$ multiple max or min values will be reached every oscillation cycle. In this way, the optical sensor will sense the variation in transmission resulting from motion of the proof mass, such that the reference mass interacts with the sensor, and the sensor responds to the position (and motion) of the proof mass to produce an analog signal. For the optical resonator, the geometrical dimension is tied to the wavelength of light used.

In some examples, it is desirable to amplify the analog signal by using a proof mass with an array of teeth and an opposing surface with another array of teeth. Each array of teeth is regularly spaced, with a pitch defining the distance between adjacent teeth in the array. The two arrays of teeth have the same pitch so that amplification of the produced signal is maximized. In other words, there exists a relative position of the proof mass such that all of the teeth in the array on the proof mass are at the minimum separation from the opposing teeth in the array on the opposing surface. In some examples, the produced signal can be amplified further by interdigitating the proof mass with the opposing surface and arranging arrays of teeth on each of the interdigitated surfaces of the proof mass and the opposing surface.

The teeth can be rectangular, triangular, or another shape. The shape of the teeth determines the specific relationship between the produced signal and the motion of the proof mass, but does not change the nonmonotonicity.

An analog front end (AFE) converts the analog signal produced by the teeth to an analog voltage signal. The AFE does this by generating an analog voltage that is linearly proportional to the analog signal produced by the teeth. Thus, the analog voltage signal is also nonlinear and nonmonotonic. The AFE can be selected based on the type of analog signal to be measured. If the analog signal to be measured is a capacitance, the AFE can be a capacitance-to-voltage (C-to-V) converter such as a charge amplifier (CA) or a bridge with a general impedance converter (GIC). If the produced signal is a current such as a capacitive current or a tunneling current, the AFE can include a current amplifier such as a transimpedance amplifier (TIA). If the analog signal to be measured is optical, the AFE can include an optical device such as a photodiode or a charge coupled device. If the produced signal is electromagnetic, the AFE can include an antenna.

In some examples the inertial devices includes a time-to-digital converter (TDC) to convert the analog voltage signal to a digital signal. The TDC measures times at which the analog signal crosses certain thresholds, such as when the analog signal experiences maxima, minima, zeros, or other values. In some examples, the TDC produces a binary output that switches between two values when the analog voltage signal crosses these thresholds.

In some examples, the inertial device uses an analog-to-digital converter (ADC) to convert the analog voltage signal to a digital signal. The digital signal can then be used to determine inertial information. In some examples, the inertial device can include digital circuitry which extracts inertial information from the digital signal produced by the ADC or the TDC.

FIG. 1 depicts an inertial device 100 that extracts inertial information from nonlinear periodic signals. The inertial device 100 includes a proof mass 102 that is connected to anchors 112a, 112b, 112c, and 112d (collectively, anchors 112) by springs 110a, 110b, 110c, 110d (collectively, springs 110), respectively. FIG. 1 also depicts a coordinate system 122 with an x axis, a y axis perpendicular to the x axis, and a z axis perpendicular to each of the x and y axes. The proof mass 102 is driven along the x axis by drive combs 114a and 114b (collectively, drive combs 114). An AC voltage applied to the drive combs 114 causes the proof mass 102 to oscillate along the x axis. The inertial device 100 includes sense combs 118a, 118b, 118c, and 118d (collectively sense combs 118) used to detect motion of the proof mass 102. As the proof mass 102 oscillates along the x axis, the capacitance between the sense combs 118 and the proof mass 102 varies. This varying capacitance causes a capacitive current to flow when a DC sense voltage is applied between the sense combs 118 and the proof mass 102. This capacitive current, which is proportional to the position of the proof mass 102, can be used to determine drive amplitude and velocity of the proof mass 102. The sense combs 118 are linear in that they produce an analog output signal (e.g., current or capacitance) that is a monotonic and linear (or substantially linear) function of the position of the proof mass 102.

The inertial device 100 can include a digital closed-loop drive which regulates the amplitude of the motion of the proof mass 102 to a desired value. The digital closed-loop drive can use the drive amplitude and velocity of the proof mass determined using the sense combs 118. The digital (closed-loop drive) compares the measured motion of the proof mass 102 to the desired value and regulates the voltage applied to the drive combs 114 to maintain the amplitude of the proof mass 102 at the desired value.

The proof mass 102 includes arrays of movable teeth 104a and 104b (collectively, movable teeth 104). The movable teeth 104 are spaced along the x axis. The inertial device 100 includes fixed beams 108a, 108b, 108c, and 108d (collectively, fixed beams 108). The fixed beams 108 include arrays of fixed teeth 106a, 106b, 106c, and 106d (collectively, fixed teeth 106), respectively. The fixed teeth 106 are spaced along the x axis and adjacent to the movable teeth 104. The fixed teeth 106 and the movable teeth 104 electrostatically interact with each other. As teeth of the movable teeth 104 align with adjacent teeth of the fixed teeth 106, capacitance between the beams 106 and 108 is at a maximum. As teeth of the movable teeth 104 align with gaps between teeth of the fixed teeth 106, capacitance between the beams 106 and 108 is at a minimum. Thus, as the proof mass 102 moves monotonically along the x axis, capacitance between the proof mass 102 and the fixed beams 108 varies nonmonotonically, increasing as teeth align with adjacent teeth and decreasing as teeth align with gaps. In some examples, as is depicted in FIG. 1, the inertial device includes arrays of teeth arranged with phase offsets. In the example depicted in FIG. 1, when the proof mass 102 is in its neutral position, teeth of the movable teeth 104 align with teeth of the fixed teeth 106b and 106c. When the proof mass 102 is in the neutral position, as shown in FIG. 1, teeth of the fixed teeth 106a and 106d do not align with teeth of the movable teeth 104, but instead align with the centers of gaps between respective teeth of the movable teeth 104. In this configuration, when the teeth 106b and 106c experience a maximum in capacitance, the teeth 106a and 106d experience a minimum in capacitance, and vice-versa. Likewise, as the capacitances of the teeth 106b and 106c are increasing, the capacitances of the teeth 106a and 106d are decreasing, and vice-versa. These differences in phase between arrays of teeth can be used as described herein to perform a differential measurement of capacitance between the proof mass 102 and the fixed beams 108.

The inertial device 100 includes a device layer comprising the features depicted in FIG. 1. The inertial device 100 also includes a top layer (not shown) above the device layer and a bottom layer (not shown) below the device layer. The anchors 112, the fixed beams 108, the drive combs 114, and the sense combs 118 are connected to one or both of the top layer (not shown) and the bottom layer (not shown). The proof mass 102 can move freely within the plane of the device layer.

In some examples, the proof mass 102 is at a ground voltage, as it is electrically connected to the anchors 112 by the springs 110. In these examples, the anchors 112 are grounded through their connection to the bottom layer (not shown) or the top layer (not shown). In some examples, a DC voltage is applied to the fixed beams 108. In some examples, the DC voltage applied is 2.5 V. In some examples, DC voltages of opposite polarities are applied to the sense combs 118 to enable a differential capacitance measurement. In some examples, a voltage of +2.5 V is applied to the sense combs 118c and 118d, and a DC voltage of −2.5 V is applied to the sense combs 118a and 118b. In some examples, the AC voltages applied to the respective drive combs 114a and 114b are of equal amplitudes, but 180° out of phase. In these examples, the drive combs 114 alternately electrostatically attract, or "pull," the proof mass.

Figure 2:
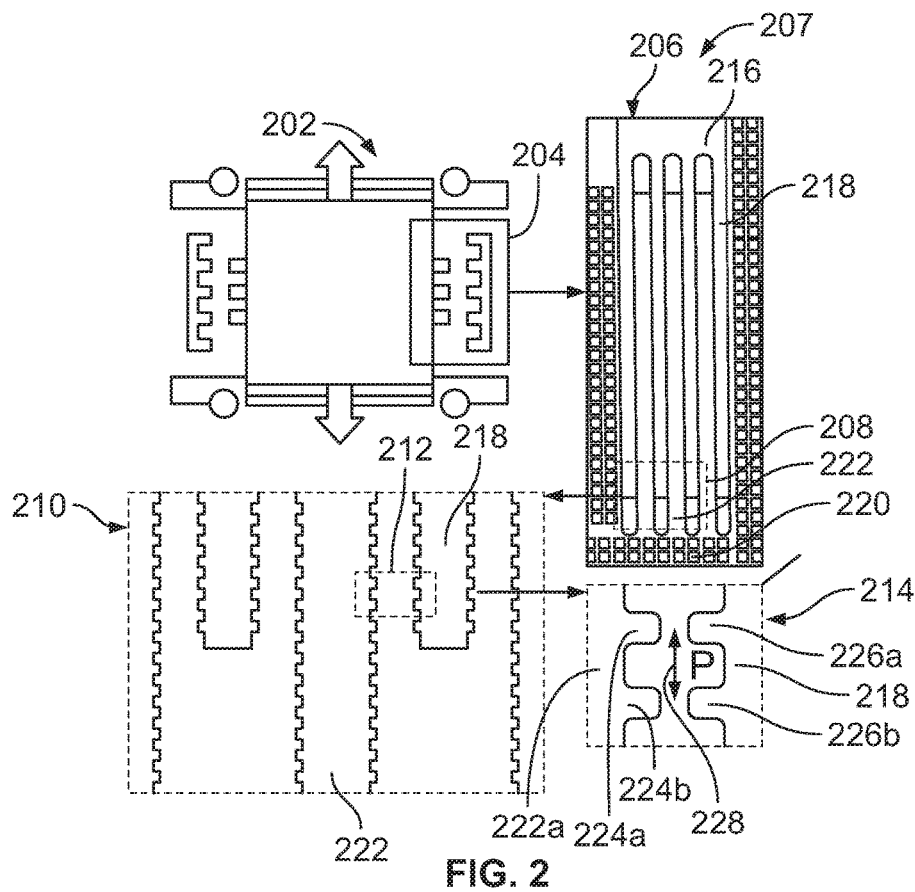
FIG. 2 depicts a schematic of an inertial device and enlarged views that depict fixed and movable teeth of an inertial device, according to an illustrative implementation.

FIG. 2 depicts a schematic of an inertial device 202 and enlarged views 206, 210, and 214 that depict fixed and movable teeth of the inertial device 202. The view of the inertial device 202 schematically depicts a proof mass and movable and fixed teeth. The view of inertial device 202 includes an area of interest 204 that includes both movable teeth connected to the proof mass and fixed teeth connected to an anchor. The enlarged view 206 is an enlarged view of features of the area of interest 204. The enlarged view 206 depicts a time-domain-switched (TDS) structure 207 that includes a fixed element 216 and a movable element 220. The movable element 220 is connected to the proof mass 203, while the fixed element 216 is anchored to a bottom layer (not shown) and/or a top layer (not shown) of the inertial device 202. The fixed element 216 includes a plurality of fixed beams, including a fixed beam 218. Likewise, the movable element 220 includes a plurality of movable beams, including a movable beam 222. The enlarged view 206 also includes an area of interest 208.

The enlarged view 210 is an enlarged view of the area of interest 208 and depicts fixed and movable beams, including the fixed beam 218 and the movable beam 222. The enlarged view 210 also includes an area of interest 212.

The enlarged view 214 is an enlarged view of the area of interest 212. The enlarged view 214 depicts the fixed beam 218 and the movable beam 222. The fixed beam 218 includes fixed teeth 226a and 226b (collectively, fixed teeth 226). The movable beam 222 includes movable teeth 224a and 224b (collectively, movable teeth 224). The centers of the fixed teeth 226 are separated by a pitch distance 228, and the centers of the movable teeth 224 are separated by the same pitch distance 228. Furthermore, the teeth of the movable beam 222 and the teeth of the fixed beams 218 have the same widths and have the same gaps between adjacent teeth.

Figure 3:
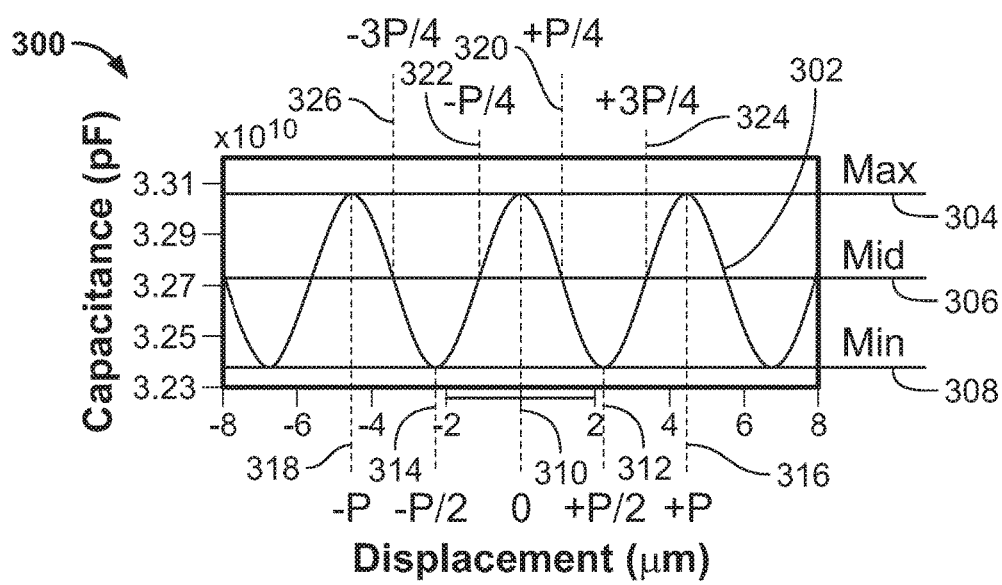
FIG. 3 depicts a graph that shows the relationship between capacitance of a time-domain-switched (TDS) structure and displacement of a movable element, according to an illustrative implementation.

FIG. 3 depicts a graph 300 that shows the relationship between capacitance of the TDS structure 207 (FIG. 2) and displacement of the movable element 220 (FIG. 2). The graph 300 includes a capacitance curve 302 representing capacitance as a function of displacement of the movable element 220 (FIG. 2). The capacitance curve 302 is centered at a middle level 306 and ranges between a maximum level 304 and a minimum level 308. The capacitance curve 302 reaches the maximum level 304 when the teeth of the movable element 220 (FIG. 2) are aligned with teeth of the fixed element 216 (FIG. 2). The capacitance curve 302 reaches the minimum level 308 when the teeth of the movable element 220 (FIG. 2) are anti-aligned (e.g., aligned with gaps between) the teeth of the fixed element 216 (FIG. 2). While changes in voltage applied between the fixed element 216 (FIG. 2) and the movable element 220 (FIG. 2) can affect the amplitude of the capacitance curve 302, the capacitive curve 302 and the maximum level 304 and the minimum level 308, changes in voltage will not affect the displacement at which the capacitive curve reaches a maximum or minimum. The capacitance curve 302 reaches maximum and minimum levels at permanently fixed positions that are defined during fabrication of the inertial device 202 (FIG. 2), because the capacitance curve 302 reaches these level when teeth are aligned or anti-aligned. Thus, the displacement at which the capacitive curve reaches the maximum level 304 or the minimum level 308 are unaffected by drift in the voltage applied between the fixed element 216 (FIG. 2) and the movable element 220 (FIG. 2).

The graph 300 also depicts displacement levels that include a −P displacement level 318, a −3P/4 displacement level 326, a −P/2 displacement level 314, a −P/4 displacement level 322, a 0 displacement level 310, a +P/4 displacement level 320, a +P/2 displacement level 312, a +3 P/4 displacement level 324, and a +P displacement level 316. The graph 302 reaches the maximum capacitance level 304 at the displacement levels 318, 310, and 316, and reaches the minimum capacitance level 308 at the displacement levels 314 and 312. The capacitance curve 302 intersects the middle level 306 at the displacement levels 326, 322, 320, and 324. Thus, the capacitance curve 302 experiences maxima when the movable element 220 (FIG. 2) has moved integer multiples of the pitch distance from its neutral position. The capacitance curve 302 experiences minima when the movable element 220 (FIG. 2) has moved one-half the pitch distance from its neutral position in either direction.

The movable element 220 (FIG. 2) is resonated with the respect to the fixed element 206 (FIG. 2). As the movable element oscillates in sinusoidal motion, the capacitance varies periodically according to the capacitance curve 302. The periodic variation depends on factors including the shape of the teeth of the movable element 220 and the fixed element 206, the size of gaps between the teeth, and manufacturing variations. In some examples, the periodic variation is sinusoidal, in some examples, the periodic variation is semi-sinusoidal, and in some examples, the periodic variation is not sinusoidal. Because the movable element 220 (FIG. 2) is connected to the proof mass 203 (FIG. 2), an acceleration applied to the inertial device will affect the motion of the proof mass 203 (FIG. 2) and the movable element 220 (FIG. 2). The acceleration applied to the inertial device 202 (FIG. 2) will affect the capacitance curve 302 by shifting the maximum level 304, the middle level 306, and the minimum level 308 in proportion to the magnitude of the acceleration. This offset in the capacitance curve 302 can be measured and used to determine the applied acceleration. The applied acceleration is measured with respect to the pitch distance, which is a fixed spatial constant defined by the fabrication process.

Figure 4:
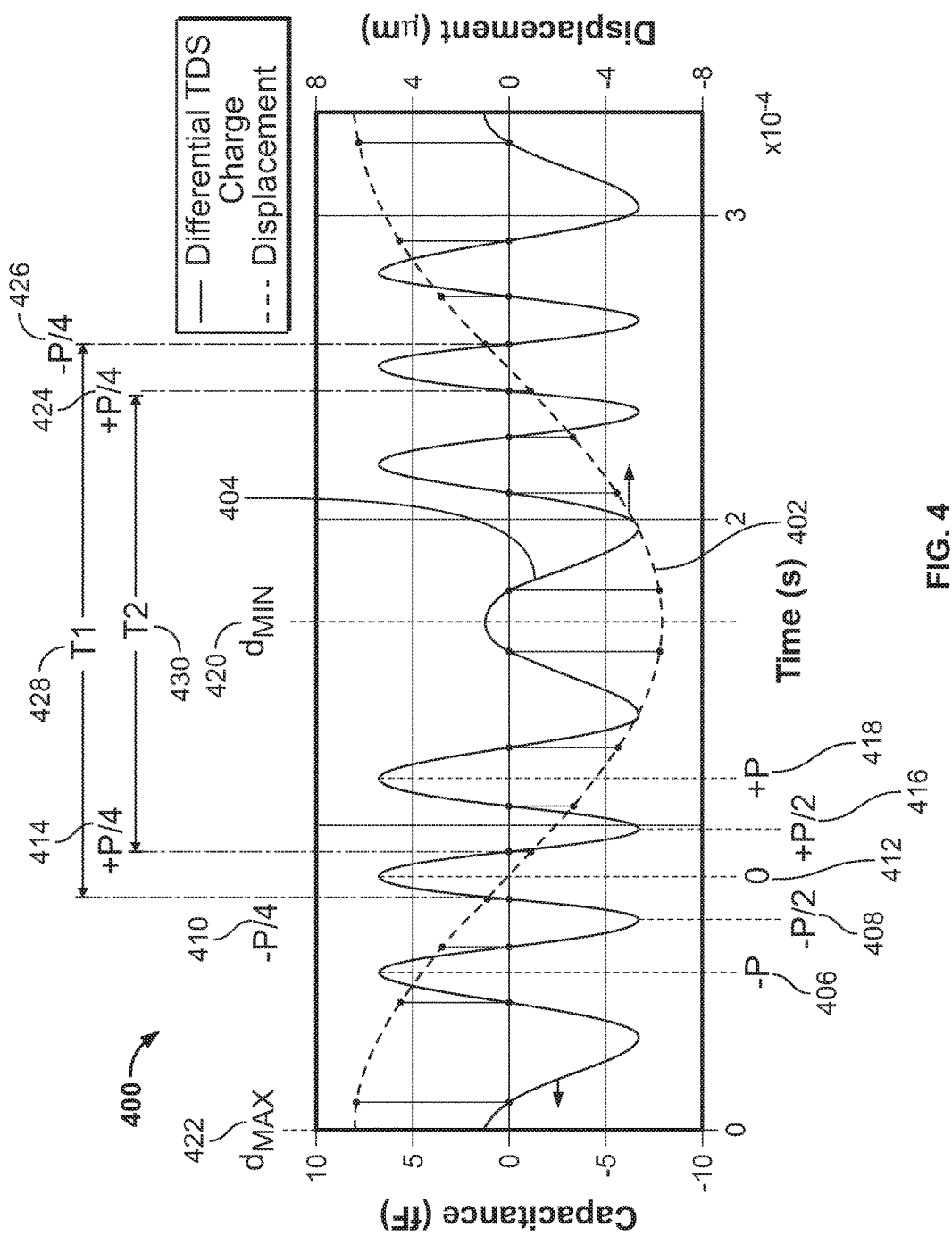
FIG. 4 depicts a graph showing differential capacitance and displacement of a TDS structure, according to an illustrative implementation.

FIG. 4 depicts a graph 400 showing differential capacitance and displacement of a TDS structure such as the TDS structure 207 (FIG. 2). The graph 400 includes a differential TDS capacitance curve 404 and a displacement curve 402. The displacement curve 402 represents the motion of a proof mass (e.g., 102 (FIG. 1)) as a function of time. The differential TDS capacitance curve 404 represents a difference in capacitance between an in-phase TDS structure (e.g., 105b, 105c (FIG. 1)) and an out-of-phase TDS structure (e.g., 105a, 105d (FIG. 1)). The graph 400 includes times 406, 412, and 418 at which the differential TDS capacitance curve 404 reaches a maximum and at which a proof mass (e.g., 102 (FIG. 1)) is displaced at integer multiples of the pitch distance from a neutral position. The graph 400 also includes times 408 and 416 at which the proof mass is displaced by one-half the pitch distance from its neutral position and at which the differential TDS capacitance curve 404 reaches a minimum. The graph 400 also includes times 410, 414, 424, and 426 at which the proof mass is displaced by one-half the pitch distance from its neutral position and at which the differential TDS capacitance curve crosses a zero level. The graph 400 also includes a displacement level 420 at which the displacement curve 402 reaches a minimum and a displacement level 422 at which the displacement curve 402 reaches a maximum. The differential TDS capacitance curve 404 also reaches a maximum at the times 420 and 422, but the differential TDS capacitance at the times 420 and 422 is lower than at the times 406, 412, and 418. The differential TDS capacitance curve 404 only reaches a maximum at the times 420 and 422 because the proof mass (e.g., 102 (FIG. 1)) reverses direction at these times. Thus, the maximum in capacitance at the times 420 and 422 is not defined by the pitch of the TDS structures, but instead by the drive amplitude of the proof mass (e.g., 102, 203 (FIGS. 1 and 2)). As, as such, the maximum in capacitance at the times 420 and 422 is not used for determining acceleration. Equation 1 illustrates the dependence on time and displacement of the differential TDS capacitance curve 404.

$$C(t)=C[x(t)] \quad [1]$$

Equation 2 shows the relationship between displacement and time of the displacement curve 402.

$$x(t)=A\cdot\sin(\omega_0(t)+\ldots x(t)_{INERTIAL} \quad [2]$$

As shown in equation 2, the displacement curve 402 is affected by a sinusoidal drive component and an inertial component.

The time interval $T_1$ 428 corresponds to the interval between times 410 and 426 of successive crossings of the −P/4 level. The time interval $T_2$ 430 corresponds to the interval between times 414 and 424 of successive crossings of the +P/4 level. The time intervals $T_1$ 428 and $T_2$ 430 can be used as shown in equations 3-6 to determine oscillation offset A of the proof mass (e.g., 102 (FIG. 1)) and acceleration A of the inertial device (e.g., 100 (FIG. 1)).

$$\Delta - A \cdot \cos\left(w_0 \frac{T_1}{2}\right) = +\frac{P}{4} \quad [3]$$

$$\Delta - A \cdot \cos\left(w_0 \frac{T_2}{2}\right) = -\frac{P}{4} \quad [4]$$

$$A = \frac{P/2}{\left[\cos\left(\omega_0 \frac{T_1}{2}\right) - \cos\left(\omega_0 \frac{T_2}{2}\right)\right]} \quad [5]$$

$$\Delta = \frac{A}{2}\left[\cos\left(w_0 \frac{T_1}{2}\right) + \cos\left(w_0 \frac{T_2}{2}\right)\right] \quad [6]$$

Figure 5:
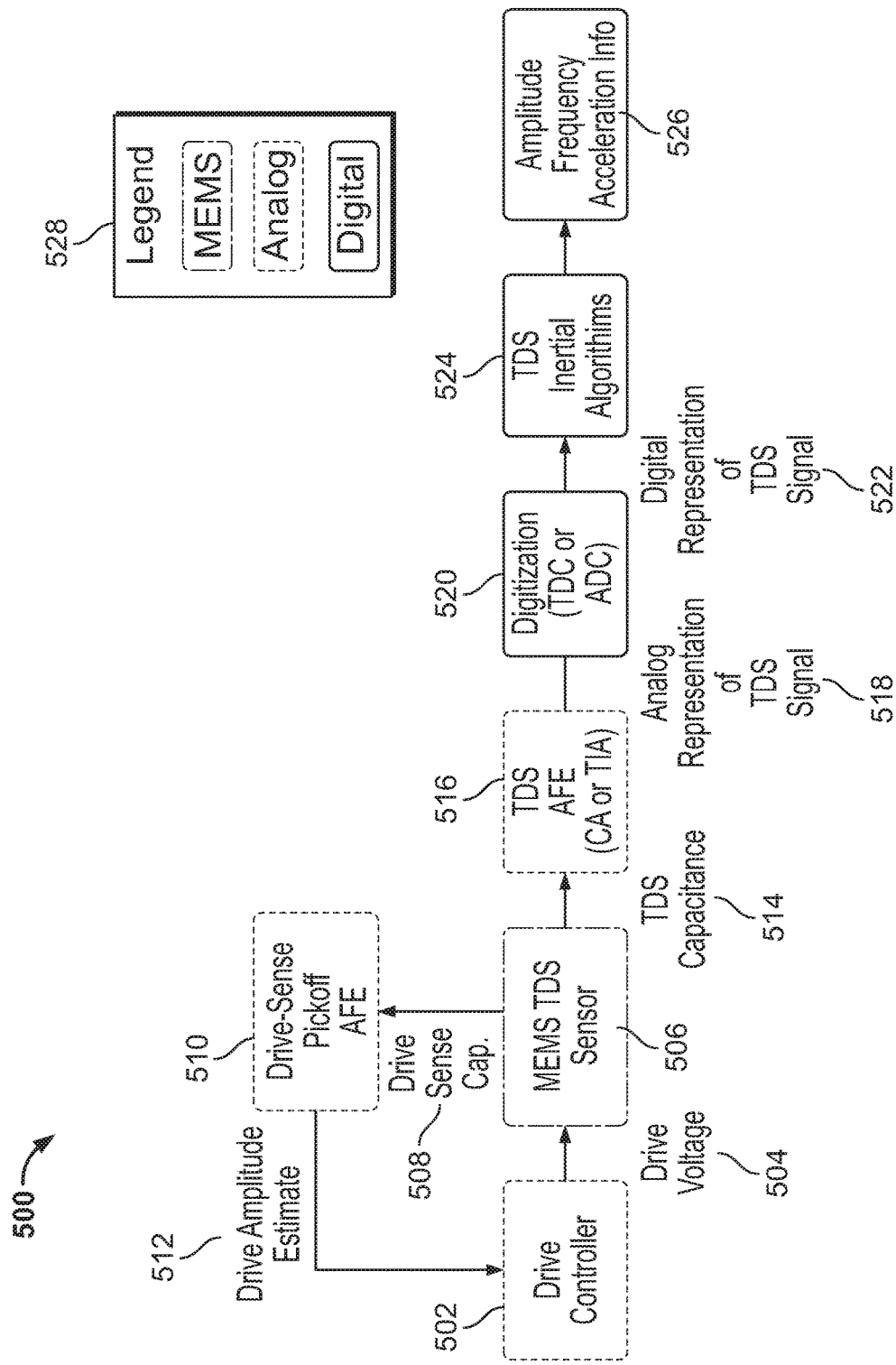
FIG. 5 depicts a block diagram illustrating signal flows of a system for determining inertial perimeters from an inertial device, according to an illustrative implementation.

FIG. 5 depicts a block diagram 500 illustrating signal flows of a system for determining inertial perimeters from an inertial device (e.g., 100, 202 (FIGS. 1 and 2)). The block diagram 500 includes a drive controller 502 that applies a drive voltage 504 to a MEMS TDS sensor 506. The MEMS TDS sensor 506 can be the inertial device 100 (FIG. 1) or the inertial device 202 (FIG. 2), and the drive voltage 504 can be applied to the drive combs 114 (FIG. 1) to oscillate a proof mass (e.g., 102). A drive sense capacitance 508 of the MEMS TDS sensor 506 is detected by a drive sense pickoff AFE 510. The drive sense capacitance 508 can be a capacitance of the sense combs 118 (FIG. 1). The AFE 510 generates an analog output 512 that is proportional to an estimate of drive amplitude. The analog output 512 is received by the drive controller 502 and used to adjust the drive voltage 504 to regulate the motion of the proof mass (e.g., 102, 203 (FIGS. 1 and 2)) to a constant amplitude. The MEMS TDS sensor 506 generates a TDS capacitance 514 that is detected by a TDS AFE 516. The TDS AFE 516 can be a charge amplifier (CA), a transimpedence amplifier (TIA), or a bridge with a general impedance converter (GIC). The TDS AFE 516 produces an analog output 518 that is a representation of the TDS capacitance signal 514. The analog output 518 is digitized by digitization circuitry 520. The digitization circuitry 520 can be a time-to-digital converter (TDC) or an analog-to-digital converter (ADC). The digitization circuitry 520 produces a digital signal 522 that is a digital representation of the TDS capacitance signal 514. The digital signal 522 is received by digital circuitry 524 that implements one or more TDS inertial algorithms (including the cosine, arcsine, arccosine, and arctangent algorithms) to determine amplitude, frequency, and acceleration information 526 of the MEMS TDS sensor 506.

Figure 6:
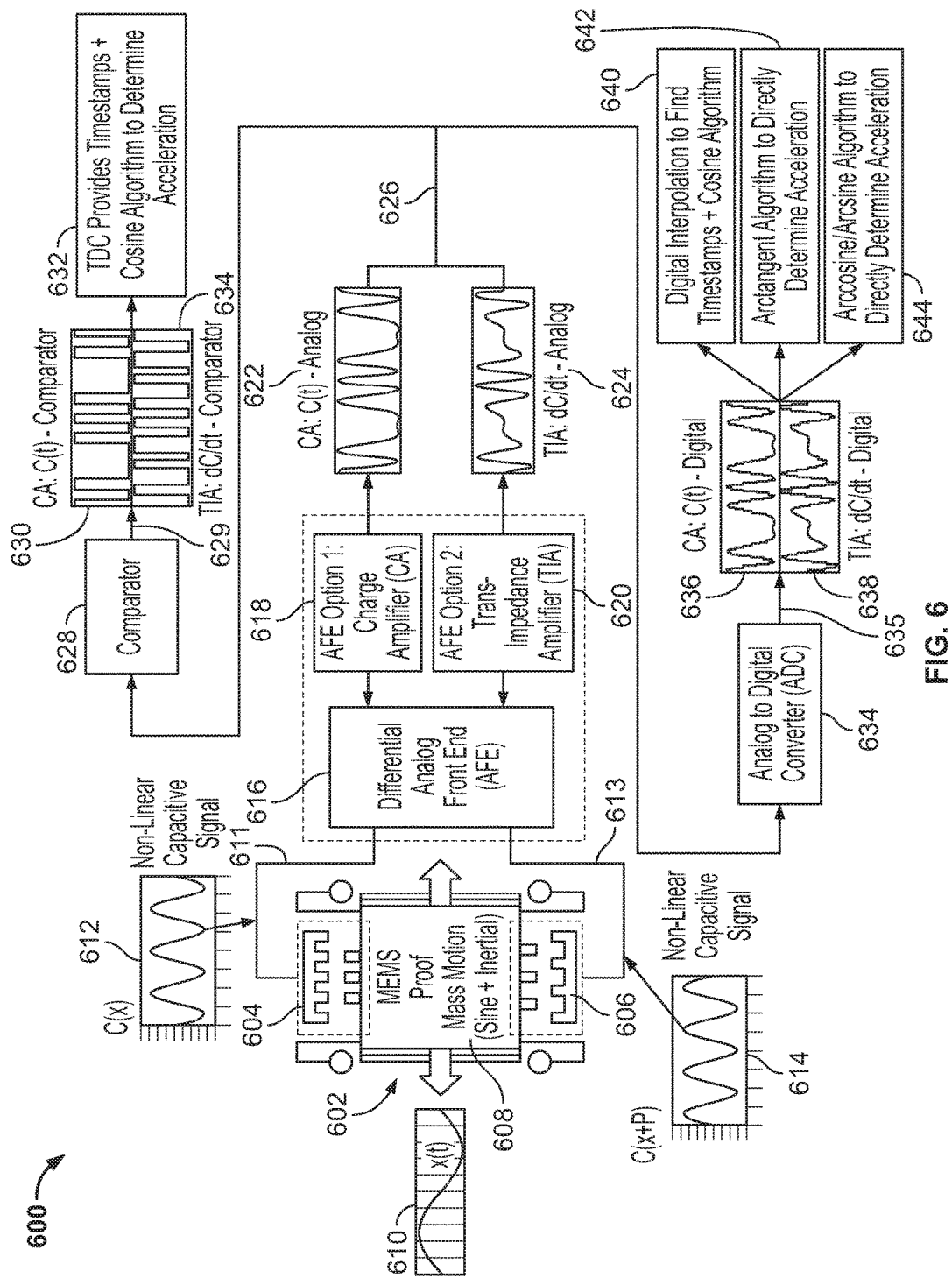
FIG. 6 depicts a block diagram showing signal flows and exemplary implementations of the systems and methods described herein, according to an illustrative implementation.

FIG. 6 depicts a block diagram 600 showing signal flows and exemplary implementations of the systems and methods described herein. The block diagram 600 schematically depicts a MEMS structure 602 that includes a proof mass 608 and TDS structures 604 and 606. The TDS structure 604 is an in-phase TDS structure and the TDS structure 606 is an out-of-phase TDS structure. In some examples, the out-of-phase TDS structure 606 may be shifted by a portion of the pitch distance. The proof mass 608 oscillates with its motion schematically depicted by graph 610. As a result of the motion of the proof mass 608, the TDS structures 604 and 606 produce non-linear capacitive signals 611 and 613, respectively. The non-linear capacitive signals 611 and 613 are illustrated by graphs 612 and 614, respectively. The non-linear capacitive signals 611 and 613 are received by a differential AFE 616. The differential AFE 616 can be CA 618 or a TIA 620. The differential AFE 616 outputs an analog signal 626 that corresponds to the difference between the non-linear capacitive signals 611 and 613. If the AFE 616 is a CA 618, the analog signal 626 is a voltage that represents capacitance of the TDS structures 604 and 606, and is illustrated by the graph 622. If the AFE 616 is a TIA 620, the analog signal 626 is a voltage that represents a time rate of change of capacitance of the TDS structures 604 and 606, and is illustrated by graph 624.

In some examples, the analog signal 626 is received by a comparator 628 that outputs an rectangular-wave signal 629 based on comparing the analog signal 626 to one or more thresholds. If the AFE 616 is a CA 618, the rectangular-wave signal 629 represents times at which the capacitance of the TDS structure 604 and 606 crosses the one or more thresholds and is illustrated by graph 630. If the AFE 616 is a TIA 620, the rectangular-wave signal 629 represents times at which the time rate of change of capacitance of the TDS structures 604 and 606 crosses the one or more thresholds and is illustrated by graph 634. The rectangular-wave signal 629 is received by a time-to-digital converter (TDC) which provides digital signals representing timestamps of threshold crossings to digital circuitry that implements a cosine algorithm to determine acceleration of the inertial device 602.

In some examples, the analog signal 626 is received by an ADC 634. The ADC 634 generates a digital signal 635 that represents the analog signal 626. If the AFE 616 is a CA 618, the digital signal 635 represents a capacitance of the TDS structures 604 and 636. If the AFE 616 is a TIA 620, the digital signal 635 represents a time rate of change of capacitance of the TDS structures 604 and 606, and is illustrated by graph 638. In some examples, digital circuitry 640 receives the digital signal 635 and performs digital interpolation to determine times at which the digital signal 635 crosses a threshold, and then implements the cosine algorithm to determine proof mass displacement and/or acceleration of the inertial device 602 based on the timestamps. In some examples, digital circuitry 642 receives the digital signal 635 and implements an arctangent algorithm to determine proof mass displacement and/or acceleration of the inertial device 602 based on the digital signal 635. In some examples, digital circuitry 644 receives the digital signal 635 and implements an arccosine or an arcsine algorithm to determine proof mass displacement and/or acceleration of the inertial device based on the digital signal 635. Accordingly, a CA 618 or a TIA 620 can be used in conjunction with a comparator 628 or an ADC 634 and digital circuitry to implement the cosine algorithm, the arctangent algorithm, the arccosine algorithm, or the arcsine algorithm.

Figure 7:
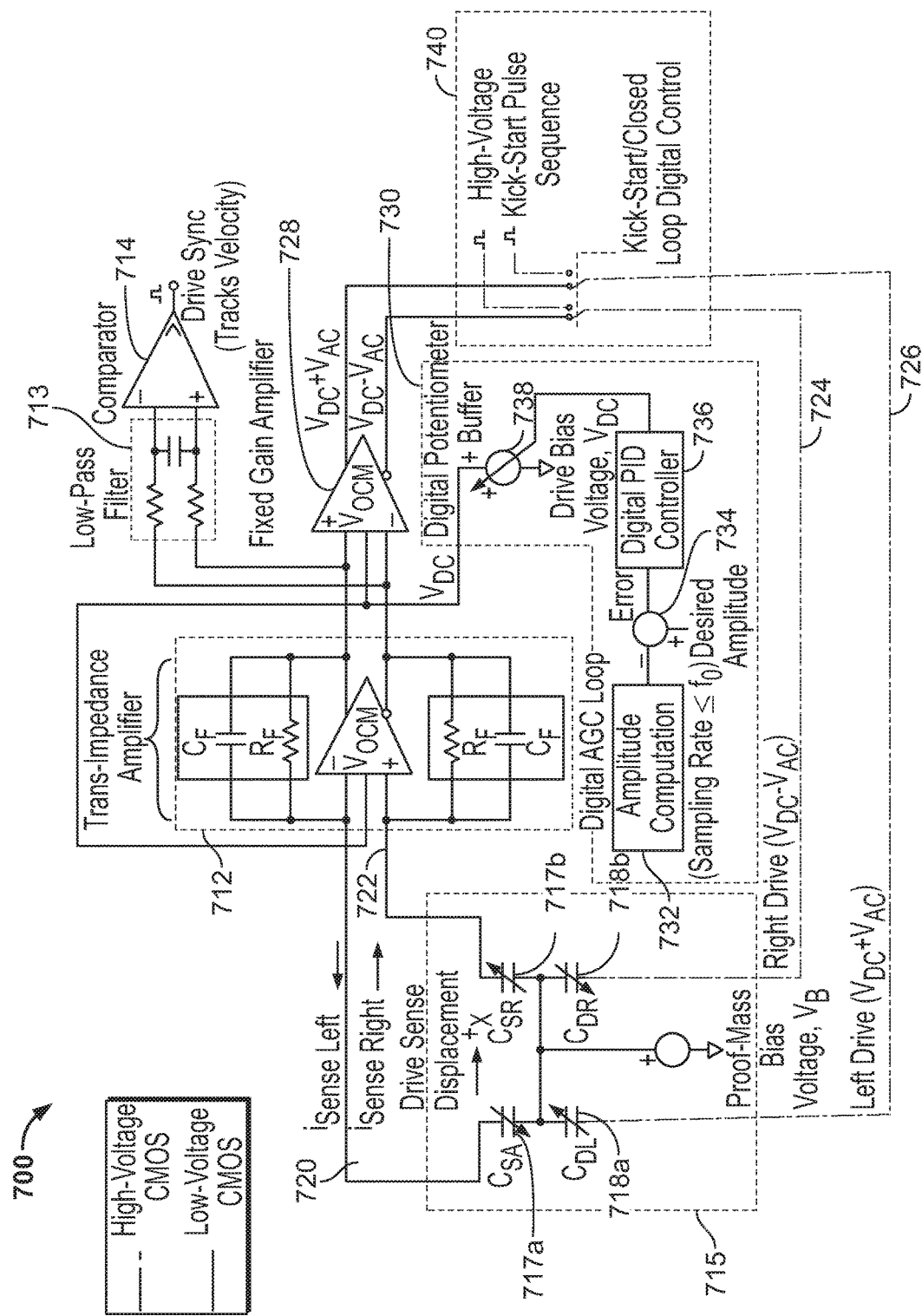
FIG. 7 depicts a system using digital control to control drive velocity, according to an illustrative implementation.

FIG. 7 depicts a system 700 using digital control to control drive velocity. The system 700 includes an oscillating structure 715. The oscillating structure 715 can be the drive frame 120 (FIG. 1). The oscillating structure 715 includes drive capacitors 718a and 718b (collectively, drive capacitors 718) that cause the oscillating structure 715 to oscillate. The oscillating structure 715 also includes sense capacitors 717a and 717b (collectively, sense capacitors 717). The sense capacitors 717 produce current signals 720 and 722 which are provided to a transimpedance amplifier system 712. The transimpedance amplifier system produces differential output signals that are provided to a fixed gain amplifier 728 and a low-pass filter 713. The output of the low-pass filter 713 is provided to a comparator 714 which produces a rectangular-wave drive sync signal.

The outputs of the fixed gain amplifier 728 are provided to a kick-start subsystem 740. The kick-start subsystem 740 includes a set of switches and a high voltage kick-start pulse sequence used to initiate oscillations of the oscillating structure 715. When the oscillating structure 715 is oscillating in steady state, the kick-start subsystem 740 simply passes the outputs of the fixed gain amplifier 728 on as the drive signals 724 and 726. The drive signals 724 and 726 are provided to the drive capacitors 718 and cause the drive capacitors 718 to drive the oscillating structure 715 into oscillation.

The system 700 includes a digital automatic gain control loop 730. The digital automatic gain control loop 730 includes amplitude computation circuitry 732. The amplitude computation circuitry 732 uses time intervals from nonlinear periodic capacitors such as the TDS structures (e.g., 105, 207, 506, 604, 606, 1501, 1503, 1606, 1608, 1806, 1808 (FIGS. 1, 2, 5, 6, 15, 16, and 18)) to determine amplitude of the oscillations of the oscillating structure 715. The amplitude computation circuitry 732 produces an amplitude output which is subtracted from a desired amplitude at block 734 to produce an error signal which is provided to a digital controller 736. The digital controller 736 can use proportional-integral-derivative (PID) control to adjust a bias voltage 738 that is provided to the common mode offset terminals of the amplifier 728 and the amplifier in the amplifier system 712. By using digital control to adjust the output common mode voltage level of the amplifiers, the system 700 maintains a desired drive amplitude. The system 700 could also maintain a desired drive frequency. By controlling drive amplitude and/or frequency, the velocity of the oscillating structure 715 is controlled.

Figure 8:
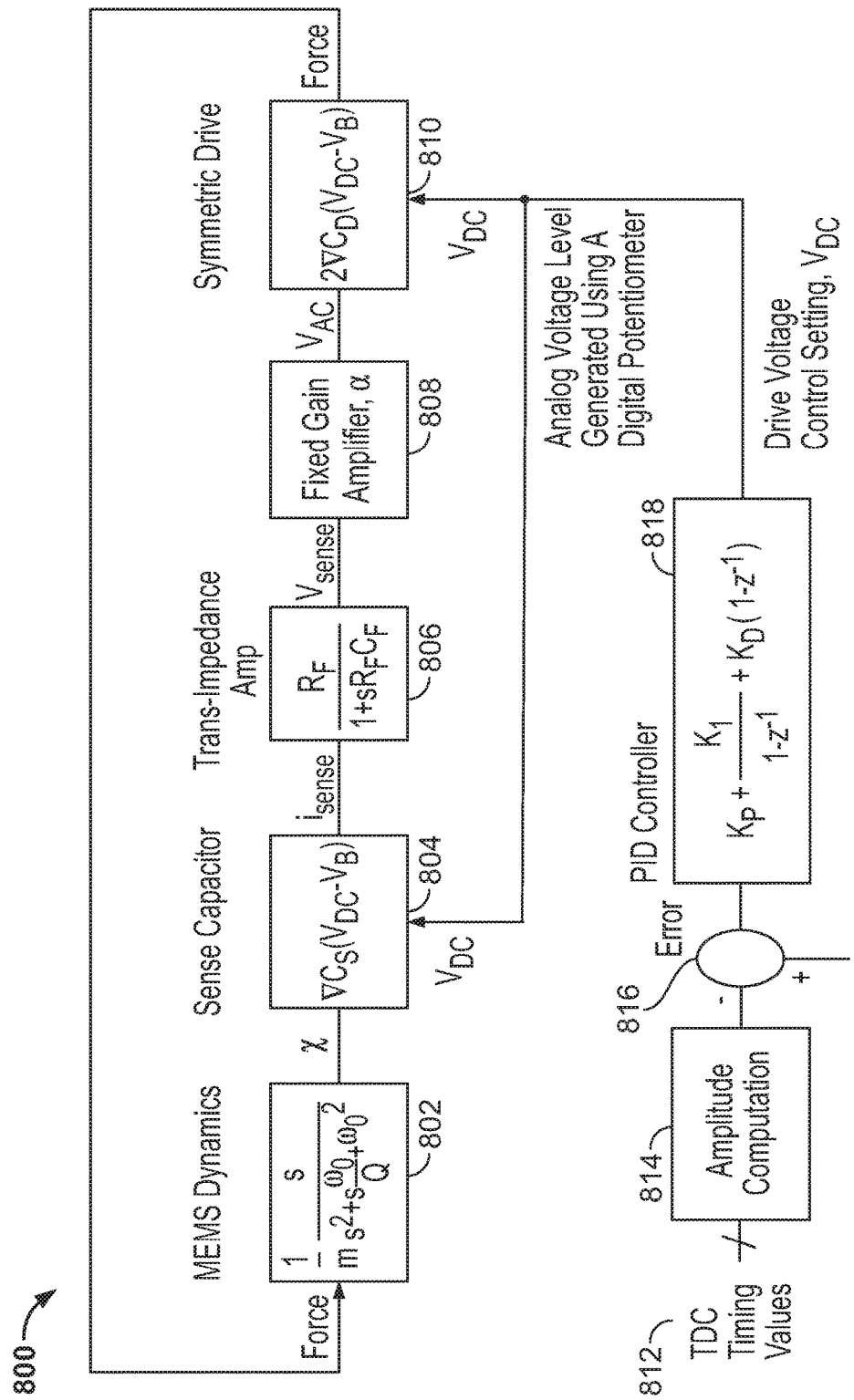
FIG. 8 depicts a block diagram representing signal flows and transfer functions of the system depicted in FIG. 7, according to an illustrative implementation.

FIG. 8 depicts a block diagram 800 representing signal flows and transfer functions of the system 700 (FIG. 7). The block diagram 800 includes a MEMS dynamics block 802 reflecting the transfer function of force into oscillator velocity. The oscillator velocity from the MEMS dynamics block 802 is provided to a sense capacitor block 804 which includes a transfer function for transferring oscillator velocity into sense current. The sense current produced by the sense capacitor block 804 is provided to a transimpedance amplifier block 806 which converts sense current into a sense voltage. The sense voltage is provided to a fixed gain amplifier block 808 which converts the sense voltage into an AC voltage to power the drive capacitors. The AC voltage is provided to a symmetric drive block 810 which represents the drive capacitors. The symmetric drive 810 transforms the AC voltage into a force acting on the oscillator. The block diagram 800 also includes TDC timing values 812 provided to an amplitude computation block 814. The amplitude computation block 814 computes an amplitude which is provided to a summing block 816. The summing block 816 subtracts the computed amplitude from an amplitude setpoint and provides an output error to a PID controller block 818. The PID controller block 818 provides a drive voltage control setting to the sense capacitor block 804 and the symmetric drive block 810.

Figure 9:
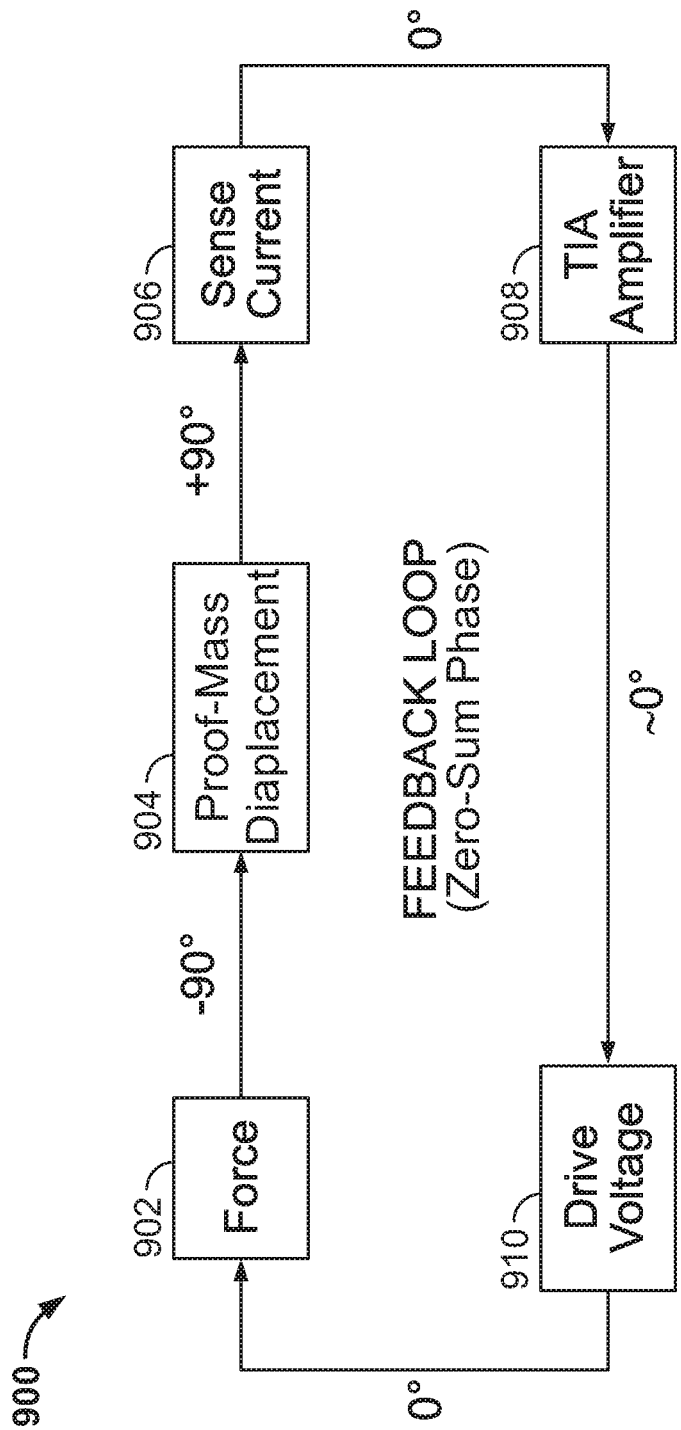
FIG. 9 schematically depicts a feedback loop that represents the closed-loop feedback of the system depicted in FIG. 7, according to an illustrative implementation.

FIG. 9 schematically depicts a feedback loop 900 that represents the closed-loop feedback of the system 700 (FIG. 7). The feedback loop 900 includes a drive voltage block 910 that provides a voltage to drive capacitors. The drive voltage produced by the drive voltage block 910 results in a force 902 that is in phase with the drive voltage 910. The force 902 produces a proof mass displacement 904 that has a −90° phase offset from the force 902. The proof mass displacement 904 produced a sense current 906 that has a +90° phase offset from the proof mass displacement 904. Thus, the sense current 906 is in phase with the drive voltage 910 and the force 902. A transimpedance amplifier 908 produces a voltage based on the sense current 906 that is approximately in phase with the sense current 906. The voltage produced by the transimpedance amplifier 908 is provided to the drive voltage block 910, which adjusts the drive voltage accordingly. Thus, appropriate phase offsets are maintained throughout the feedback loop 900.

Interdigitated electrode (IDE) capacitors provide a means for driving and sensing inertial motion of a MEMS proof mass. The drive combs 114 (FIG. 1) and the sense combs 118 (FIG. 1) are examples of IDE capacitors. Expressions for the IDE capacitance and associated gradient terms of each of the drive combs 114 (FIG. 1) and each of the sense combs 118 (FIG. 1) are shown in equations 7-14.

The capacitance and gradient in capacitance of the left-side drive combs (e.g., 114a (FIG. 1)) is given by equations 7 and 8.

$$C_{DL} = \frac{N\varepsilon h(g_o - x)}{d} + C_{fringeDL} \quad [F] \qquad [7]$$

$$\nabla C_{DL} = \frac{dC_{DL}}{dx} = -\frac{N\varepsilon h}{d} = -\frac{C_o}{g_o} \equiv -\nabla C_D \quad \left[\frac{F}{m}\right] \qquad [8]$$

The capacitance and gradient in capacitance of the right-side drive combs (e.g., 114b (FIG. 1)) is given by equations 9 and 10.

$$C_{DR} = \frac{N\varepsilon h(g_o + x)}{d} + C_{fringeDR} \quad [F] \qquad [9]$$

$$\nabla C_{DR} = \frac{dC_{DR}}{dx} = +\frac{N\varepsilon h}{d} = +\frac{C_o}{g_o} \quad \left[\frac{F}{m}\right] \qquad [10]$$

The capacitance and gradient in capacitance of the left-side sense combs (e.g., 118a (FIG. 1)) is given by equations 11 and 12.

$$C_{SL} = \frac{N\varepsilon h(g_o - x)}{d} + C_{fringeSL} \quad [F] \qquad [11]$$

$$\nabla C_{SL} = \frac{dC_{SL}}{dx} = -\frac{N\varepsilon h}{d} = -\frac{C_o}{g_o} \equiv -\nabla C_S \quad \left[\frac{F}{m}\right] \qquad [12]$$

The capacitance and gradient in capacitance of the right-side sense combs (e.g., 118b (FIG. 1)) is given by equations 13 and 14.

$$C_{SR} = \frac{N\varepsilon h(g_o + x)}{d} + C_{fringeSR} [F] \qquad [13]$$

$$\nabla C_{SR} = \frac{dC_{SR}}{dx} = +\frac{N\varepsilon h}{d} = +\frac{C_o}{g_o}\left[\frac{F}{m}\right] \qquad [14]$$

It is assumed that fringe capacitance does not vary with position and that nonlinear capacitance contributions (e.g., parallel plate effects) are negligible. The differential force applied to the proof mass (e.g., 102, 203, 608 (FIGS. 1, 2, and 6)) subject to a symmetric sinusoidal drive voltage with static DC offset is given by equations 15-19.

$$v_{AC} = V_{AC}\cos(\omega_D t)) \quad [15]$$

$$\text{Force} = -\frac{dW_{Total}}{dx} [N] \quad [16]$$

$$\text{Force} = \quad [17]$$
$$\frac{1}{2}\nabla C_{DL}(V_{DC} - V_{Proof} - v_{AC})^2 + \frac{1}{2}\nabla C_{DR}(V_{DC} - V_{Proof} + v_{AC})^2 +$$
$$\frac{1}{2}\nabla C_{SL}(V_{DC} - V_{Proof})^2 + \frac{1}{2}\nabla C_{SR}(V_{DC} - V_{Proof})^2$$

$$\text{Force} = -\frac{1}{2}\nabla C_D((V_{DC} - V_{Proof})^2 + v_{AC}^2 - 2(V_{DC} - V_{Proof})v_{AC}) + \quad [18]$$
$$\frac{1}{2}\nabla C_D((V_{DC} - V_{Proof})^2 + v_{AC}^2 + 2(V_{DC} - V_{Proof})v_{AC})$$

$$\text{Force} = 2\nabla C_D(V_{DC} - V_{Proof})v_{AC} = 2\frac{C_o}{g_o}(V_{DC} - V_{Proof})v_{AC} \quad [19]$$

This implicitly assumes that the forces produced by the drive sense and TDS pick-off capacitor pairs approximately cancel resulting in negligible influence on the overall forcing vector. The collective force is in-phase with the applied AC drive voltage excitation.

Applied force leads to a mechanical displacement. Equation 20 below generally provides an adequate representation of the mechanical behavior of the proof mass.

$$H(s) = \frac{\Delta x}{\text{Force}} = \mathcal{L}\left\{\frac{\Delta x}{m\ddot{x}}\right\} = \frac{1/m}{s^2 + s\frac{\omega_o}{Q} + \omega_o^2} \quad [20]$$

At resonance, the transfer of force to displacement imparts a −90° phase shift, as shown in equation 21.

$$H(j\omega_o) = -j\frac{Q}{m\omega_o^2} \quad [21]$$

Motion of the proof mass causes a change in capacitance of the drive sense electrodes (e.g., 118 (FIG. 1)). The drive sense electronics maintain a fixed bias voltage across the drive sense electrodes, which in turn produces a detectable motion-induced current as shown in equations 22 and 23.

$$i_{sense} = \dot{q}_{sense} = \dot{C}_S(V_{DC} - V_{Proof}) + C_S(\dot{V}_{DC} - \dot{V}_{Proof}) [A] \quad [22]$$

$$i_{sense} = \dot{x}\nabla C_S(V_{DC} - V_{Proof}) + C_S(\dot{V}_{DC}\dot{V}_{Proof}) \approx \dot{x}\nabla C_S(V_{DC} - V_{Proof}) \quad [23]$$

Given the symmetric nature of the drive design, the left and right sense currents are 180° out of phase with each other, as shown in equations 24 and 25. This lends itself well to the fully-differential closed-loop architecture shown in FIG. 7.

$$i_{SL} = \dot{x}\nabla C_{SL}(V_{DC} - V_B) = -\dot{x}\frac{C_o}{g_o}(V_{DC} - V_{Proof}) \quad [24]$$

-continued $$i_{SR} = \dot{x}\nabla C_{SR}(V_{DC} - V_B) = +\dot{x}\frac{C_o}{g_o}(V_{DC} - V_{Proof}) \quad [25]$$

The first-stage amplifier converts this transduced current of equations 24 and 25 into a voltage signal. The voltage at the output terminals of the amplifier (non-inverting/inverting, respectively) is given by equations 26 and 27.

$$V_+ = V_{DC} + I_{SL}Z_F \quad [26]$$
$$= V_{DC} - j\omega\Delta x \frac{C_o}{g_o}(V_{DC} - V_{Proof})Z_F$$
$$\equiv V_{DC} - V_{AC}$$

$$V_- = V_{DC} + I_{SR}Z_F \quad [27]$$
$$= V_{DC} + j\omega\Delta x \frac{C_o}{g_o}(V_{DC} - V_{Proof})Z_F$$
$$\equiv V_{DC} + V_{AC}$$

The feedback impedance transfer function, $Z_F$, determines the gain and phase lag introduced into the closed loop drive as shown in equation 28. The goal is to provide an adequate gain with minimal imposed phase lag.

$$Z_F(\omega) = \frac{R_F}{1 + j\omega R_F C_F} [\Omega] \quad [28]$$

For charge amplifier (i.e., current integrator) C-to-V drive loop designs, $(R_F C_F)^{-1} \ll \omega_o$. For transimpedance (i.e., current to voltage) I-to-V designs, $(R_F C_F)^{-1} \gg \omega_o$.

A secondary gain stage provides an additional signal boost ($\alpha$) along with a required signal inversion. As a result, a positive AC voltage change will pull the proof mass in the +x direction. Effectively, the output signals following the secondary stage are oriented such that the detected sense current provides the necessary reinforcing drive behavior (see FIG. 7).

A comparator is used to extract a timing reference signal (i.e., a "sync" trigger) used to coordinate the processing of timing events in one or more of the cosine, arcsine, arccosine, and arctangent algorithms. For drive designs using a transimpedance amplifier, the timing reference signal tracks proof mass velocity because sense current is directly proportional the rate of change of MEMS displacement (see equation 23).

Examination of equation 19 reveals that applied force is proportional to both the AC and DC drive voltage levels. This suggests that one can linearly control the force by manipulating either signal variable (or both). The method described here makes use of the DC drive level to effect automatic control of the displacement amplitude.

A digital proportional-integral-derivative (PID) controller compares an active measurement of proof mass displacement amplitude (obtained by one or more of the cosine, arcsine, arccosine, and arctangent algorithms) to a desired setpoint level to produce an error signal. The PID controller determines a computed drive voltage level based on the error signal. With the appropriate setting of the PID coefficients, feedback action drives the steady-state error signal to zero thus enforcing automatic regulation of the displacement amplitude.

In general, for steady-state oscillation, the loop must satisfy the Barkhausen stability criteria, which are necessary by not sufficient conditions for stability. The Barkhausen criteria require, first, that the magnitude of the loop gain, |T(jω)|, is equal to unity and, second, that the phase shift around the loop is zero or an integer multiple of 2π: ∠T(jω)=2πn, n ∈ 0, 1, 2 . . . .

Using the closed-loop transfer functions summarized in FIG. 8, one can determine the DC drive voltage requirement for stable oscillation (i.e., |T(jω$_o$)|=1), as shown in equation 29.

$$V_{DC} = \sqrt{\frac{m\omega_o}{2QR_F \nabla C_S \nabla C_D \alpha}} + V_{Proof} \quad [29]$$

The electronics can induce a phase shift which can move the oscillation frequency away from the desired mechanical resonance frequency. A transimpedance amplifier will cause a phase lag which produces a negative frequency shift as shown in equations 30 and 31.

$$\Delta \theta_S = -\tan^{-1}(\omega R_F C_F)[\text{rad}] \quad [30]$$

$$\omega_* = \text{positive root}\left\{\omega^2 + \omega \frac{\omega_o}{Q\tan(\Delta\theta_S - \frac{\pi}{2})} - \omega_o^2\right\}\left[\frac{\text{rad}}{\text{sec}}\right] \quad [31]$$

In comparison, a charge amplifier produces a positive frequency shift resulting from its induced phase lead, as shown in equation 32.

$$\Delta\theta_S = \frac{\pi}{2} - \tan^{-1}(\omega R_F C_F) \quad [32]$$

The gain loss is a measure of the degradation of the mechanical displacement resulting from a phase-shifted isolation frequency ω* as shown in equation 33 and 34.

$$\text{Gain Loss} = 20\text{Log}_{10}\left(\frac{|H(j\omega_*)|}{|H(j\omega_o)|}\right) \quad [33]$$

$$H(s) = \mathcal{L}\left\{\frac{x}{\ddot{x}}\right\} = \frac{1}{s^2 + s\frac{\omega_0}{Q} + \omega_0^2} \quad [34]$$

Figure 10:
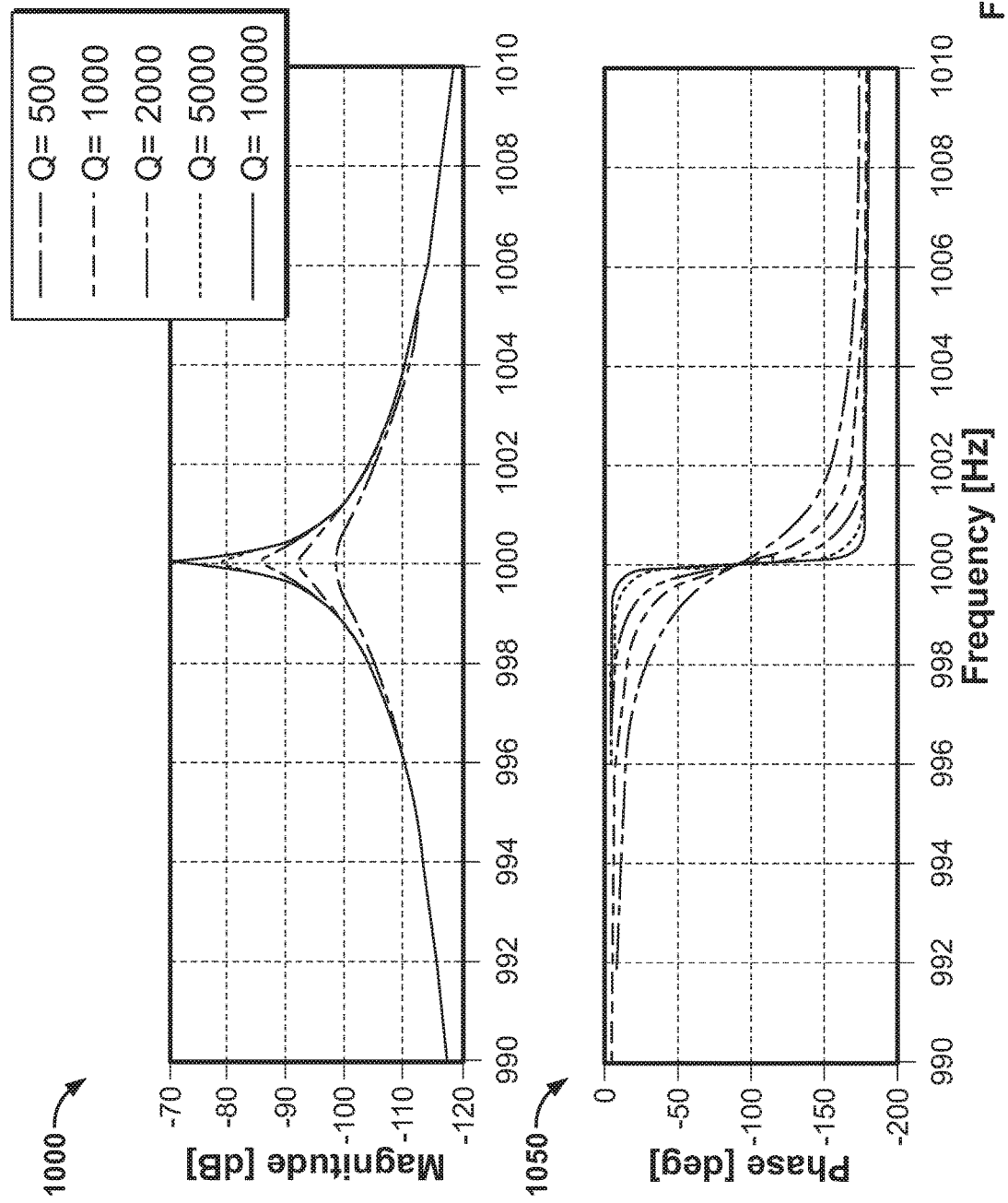
FIG. 10 depicts a Bode plot with a magnitude graph and a phase graph of the system depicted in FIG. 7, according to an illustrative implementation.

FIG. 10 depicts a Bode plot with a magnitude graph 1000 and a phase graph 1050. The magnitude graph 1000 depicts the magnitude of the transfer function of equation 34 at various quality factors Q. The phase graph 1050 depicts the phase of the transfer function of equation 34 as a function of frequency for various quality factors Q.

Figure 11:
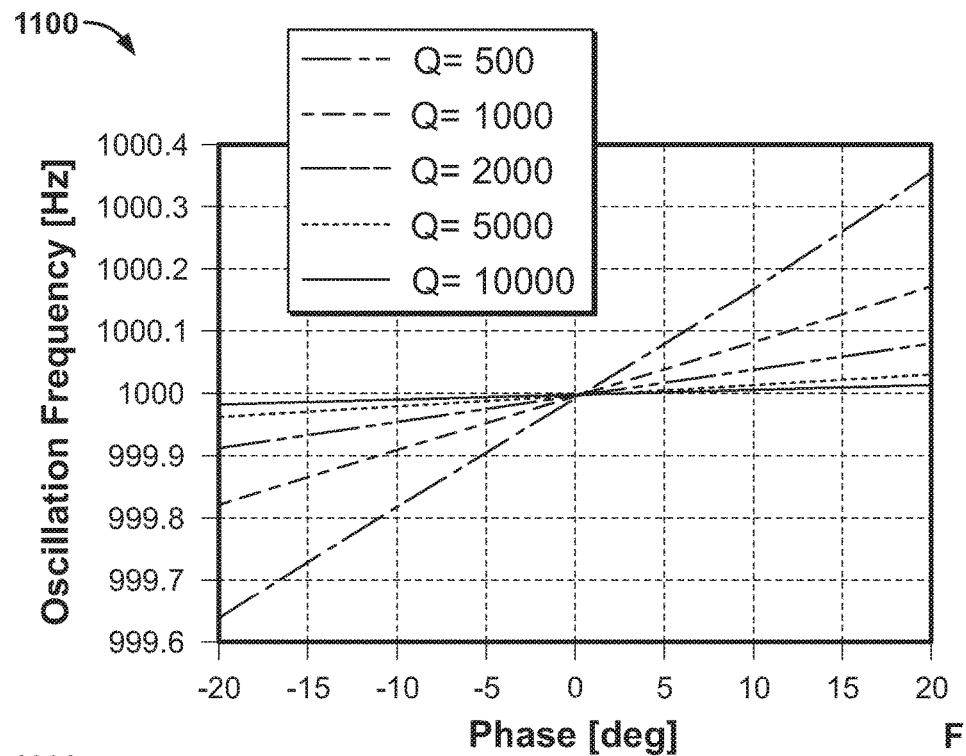
FIG. 11 depicts a graph showing the change in oscillation frequency of the system depicted in FIG. 7 as a function of phase shift for various quality factors, according to an illustrative implementation.

FIG. 11 depicts a graph 1100 showing the change in oscillation frequency as a function of phase shift for various quality factors Q. As the quality factor decreases, the oscillation frequency exhibits a greater dependence on the phase shift.

Figure 12:
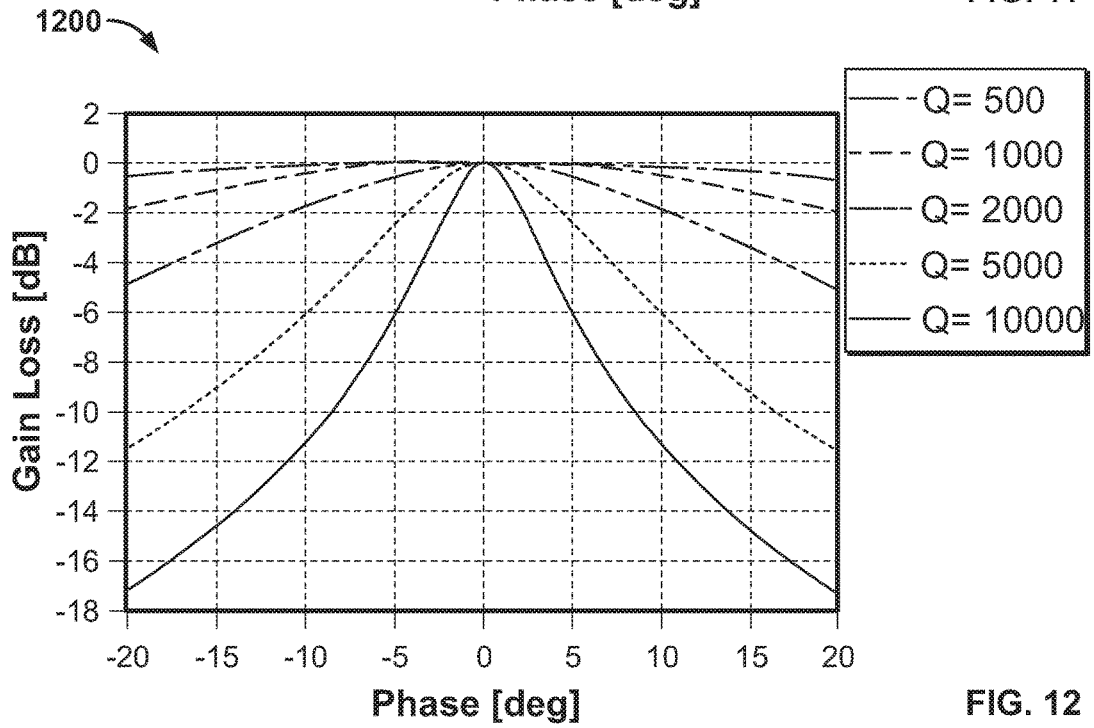
FIG. 12 depicts a graph showing the gain loss of the system depicted in FIG. 7 as a function of phase shift, according to an illustrative implementation.

FIG. 12 depicts a graph 1200 showing the gain loss as a function of phase shift. As the quality factor Q increases, the gain loss becomes more dependent on phase shift. Thus, for a given phase shift, low-Q resonators demonstrate a larger shift in oscillation frequency with minimal loss of displacement amplitude. The contrary is true for high-Q devices; gain loss is more severe while oscillation frequency deviation remains small.

Figure 13:
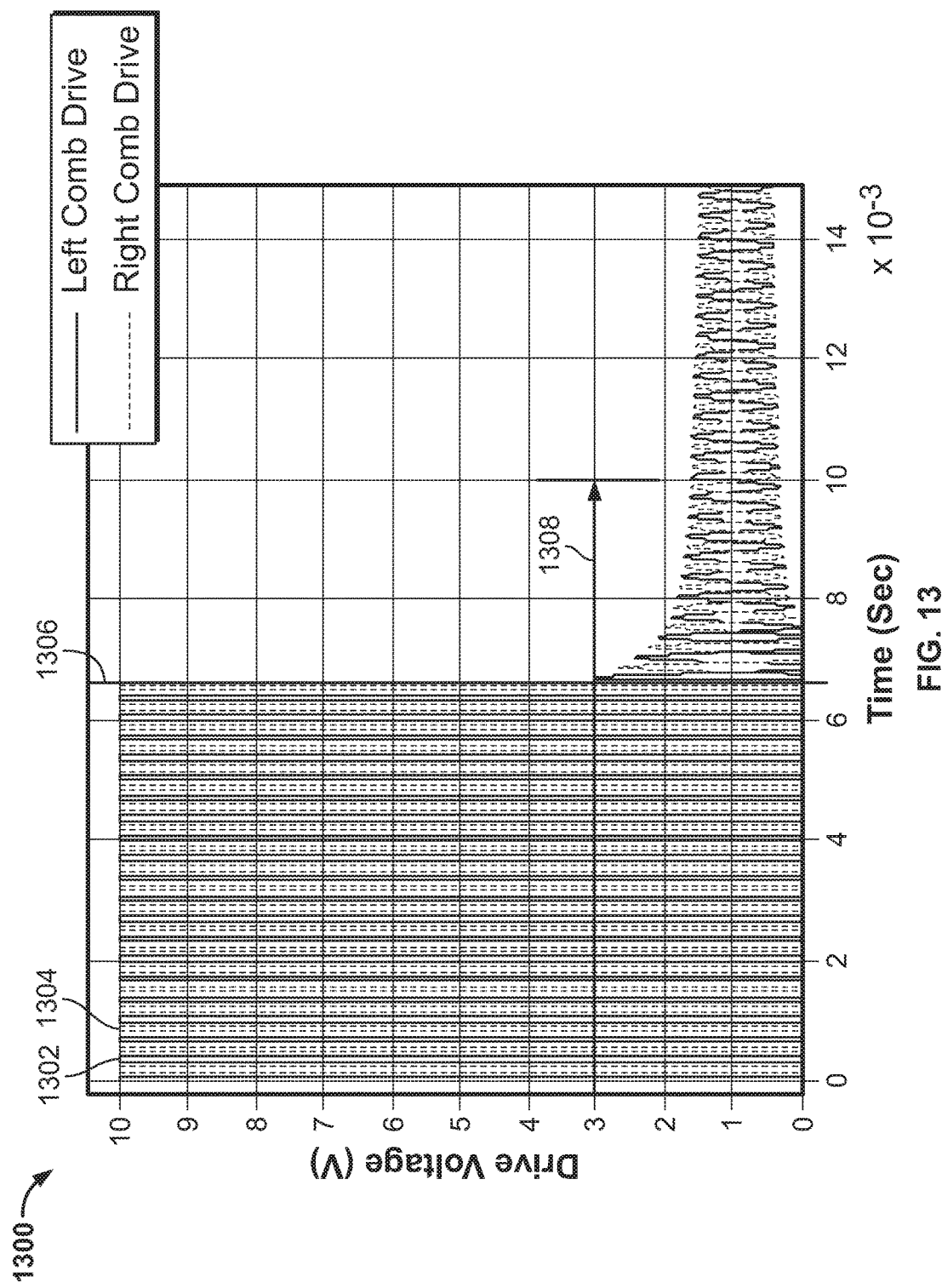
FIG. 13 depicts a graph illustrating a start-up procedure of a resonating proof mass, according to an illustrative implementation.

FIG. 13 depicts a graph 1300 illustrating a start-up procedure of a resonating proof mass (e.g., 102, 203, 608 (FIGS. 1, 2, and 6)). The resonator's start-up procedure includes a sequence of open-loop high-voltage pulses that are alternately applied to left and right drive capacitors (e.g., 114a and 114b, respectively (FIG. 1)) at the expected resonant frequency of the proof mass (e.g., 102, 203, 608 (FIGS. 1, 2, and 6)). In some examples, the pulses are applied with a duty cycle of approximately 20-25%. The graph 1300 includes a left comb drive voltage curve 1302 and a right comb drive voltage curve 1304. The graph 1300 also includes a time 1306 at which the open-loop start-up sequence ends and the resonator is oscillated in closed-loop drive mode at a lower voltage. The graph 1300 also includes a time interval 1308 depicting the settling time of the resonator, corresponding to the time required for the resonator to enter into steady-state oscillations. In the example depicted in FIG. 13, the settling time interval 1308 is approximately 10 milliseconds from initiation of the start-up sequence. As depicted in FIG. 13, an initial set of open-loop high-voltage drive pulses are used to rapidly increase the amplitude of the oscillation of the proof mass. The left and right comb drive voltage curves 1302 and 1304 include alternating pulses, so that the proof mass (e.g., 102, 203, 608 (FIGS. 1, 2, and 6)) is driven for a greater proportion of the time. The symmetric pulse depicted in FIG. 13 rapidly drives the proof mass (e.g., 102, 203, 608 (FIGS. 1, 2, and 6)) from rest to an amplitude close to the desired steady-state amplitude prior to engaging the digital closed-loop controller. In the example depicted in FIG. 13, after an initial set of twenty pulses per drive comb (e.g., 114a, 114b (FIG. 1)), the digital closed-loop controller is engaged to regulate the displacement amplitude of the proof mass (e.g., 102, 203, 608 (FIGS. 1, 2, and 6)) to the desired level. The number of required pulses and rate are predetermined for a given inertial device (e.g., 100, 202, 602 (FIGS. 1, 2, and 6)). Pulse rate can be adjusted based on temperature and/or previously measured data, such as resonant frequency.

Figure 14:
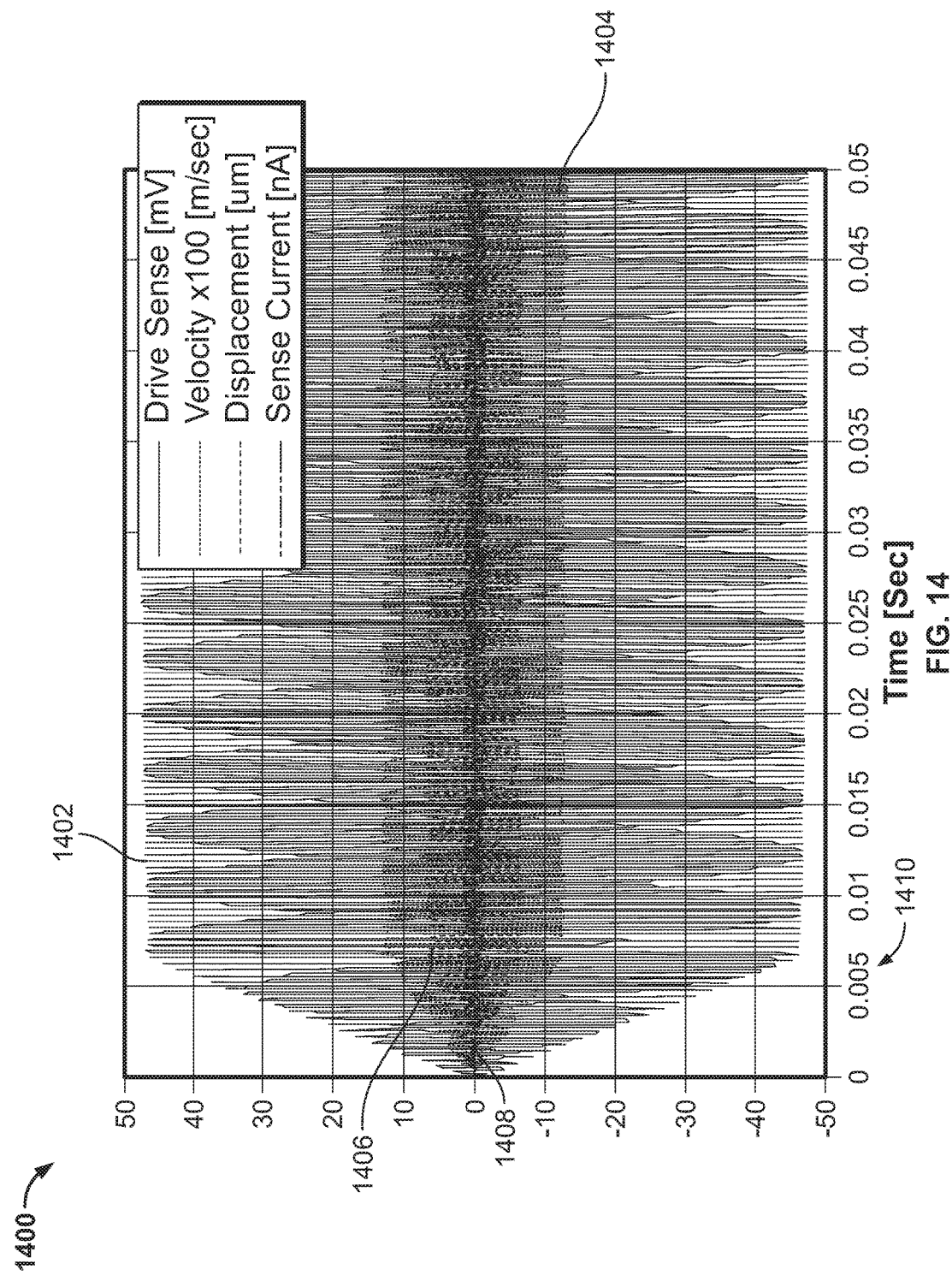
FIG. 14 depicts a graph showing sense signals of an inertial device during resonator start-up, according to an illustrative implementation.

FIG. 14 depicts a graph 1400 showing sense signals of an inertial device (e.g., 100, 202, 602 (FIGS. 1, 2, and 6)) during resonator start-up. The graph 1400 includes a drive sense signal 102, a drive velocity curve 1404, a proof mass displacement curve 1406, and a sense current curve 1408. The graph 1400 also includes a time 1410 at which the open-loop start-up ends and the digital closed-loop controller is engaged. The time 1410 corresponds to the time 1306 (FIG. 13). The open-loop sequence prior to the time 1410 lasts approximately 7 milliseconds and the proof mass (e.g., 102, 203, 608 (FIGS. 1, 2, and 6)) experiences an approximately linear increase in amplitude with time. After the time 1410, closed-loop regulation maintains the desired displacement amplitude and rejects disturbances. By applying alternating high-voltage open-loop pulses prior to engaging the digital closed-loop controller, the proof mass (e.g., 102, 203, 608 (FIGS. 1, 2, and 6)) is rapidly brought to the desired oscillation amplitude.

Once the initial start-up sequence is complete and the displacement of the proof mass (e.g., 102, 203, 608 (FIGS. 1, 2, and 6)) is sufficiently large to produce timing measurements for use in determining inertial perimeters, a TDS algorithm (e.g., one or more of the cosine, arcsine, arccosine, and arctangent algorithms) can determine amplitude estimates of the proof mass displacement. A digital proportional-integral-derivative (PID) scheme can provide effective closed-loop regulation of resonator oscillation. The digital controller (e.g., 736, 818 (FIGS. 7 and 8)) is derived from an equivalent continuous time PID controller design.

The digital controller (e.g., 736, 818 (FIGS. 7 and 8)) accepts digital displacement measurements that are subtracted from a desired setpoint to produce an error signal, which is processed to produce an updated drive DC voltage setting ($V_{DC}$). The drive force is proportional to the DC and AC drive voltage levels. The DC drive voltage is controlled using a digital potentiometer and a buffer circuit. The controller's maximum update rate is set by the sample rate, which is in turn determined by the resonant frequency of the proof mass (e.g., 102, 203, 608 (FIGS. 1, 2, and 6)). The digital controller (e.g., 736, 818 (FIGS. 7 and 8)) determines the DC drive voltage according to equation 35 below.

$$v_{DC}(t) = K_p e(t) + K_i \int_0^t e(\tau)d\tau + K_d \frac{d}{dt}e(t)[V] \qquad [35]$$

Where e(t) is the difference between the desired setpoint and the measured displacement.

The Laplace transform of equation 35 is shown in equation 36.

$$V_{DC}(s) = \left[K_p + \frac{K_i}{s} + sK_d\right]E(s) \qquad [36]$$

For digital implementations, the Z-transform is more appropriate and is shown in equation 37.

$$V_{DC}(z) = \left[K_p + \frac{K_i}{1-z^{-1}} + (1-z^{-1})K_d\right]E(z) \qquad [37]$$

Equation 37 can be rearranged as shown in equation 38.

$$V_{DC}(z) = \frac{[(K_p + K_i + K_d) - (K_p + 2K_d)z^{-1} + K_d z^{-2}]}{1-z^{-1}}E(z) \qquad [38]$$

The digital PID coefficients can be defined in terms of the more intuitive continuous-time coefficients as shown in equations 39, 40, and 41.

$$K_1 = K_p + K_i + K_d \qquad [39]$$

$$K_2 = -K_p - 2K_d \qquad [40]$$

$$K_3 = K_d \qquad [41]$$

Equations 39, 40, and 41 can be used to rewrite equation 38 as shown in equation 42.

$$V_{DC}(z) - z^{-1}V_{DC}(z) = [K_1 + K_2 z^{-1} + K_3 z^{-2}]E(z) \qquad [42]$$

Equation 42 can be converted to a difference equation suitable for implementation as shown in equation 43.

$$v_{DC}(n) = v_{DC}(n-1) + K_1 e(n) + K_2 e(n-1) + K_3 e(n-2) \qquad [43]$$

The digital error signal e(n) in equation 43 represents the difference between the desired displacement and displacement amplitude measurements, as shown in equation 44.

$$e(n) = \Delta x_{Setpoint} - \Delta x_n \ [m] \qquad [44]$$

The block diagram 800 (FIG. 8) can be used to determine a $V_{DC}$ gain setting required to stabilize the closed-loop drive when the digital loop converges to steady state as shown in equation 45 and 46.

$$(|T(j\omega)| = 1), \qquad [45]$$

$$V_{DC} = \sqrt{\frac{m\omega_o}{2QR_F \nabla C_S \nabla C_D \alpha}} + V_{Proof} \qquad [46]$$

Selection of PID perimeters can be performed either manually or automatically using additional algorithms to obtain adequate enclosed-loop performance. When properly tuned, a good regulator design should provide a favorable balance between robust stability and rejection of disturbances in the resonator's displacement amplitude.

Figure 15:
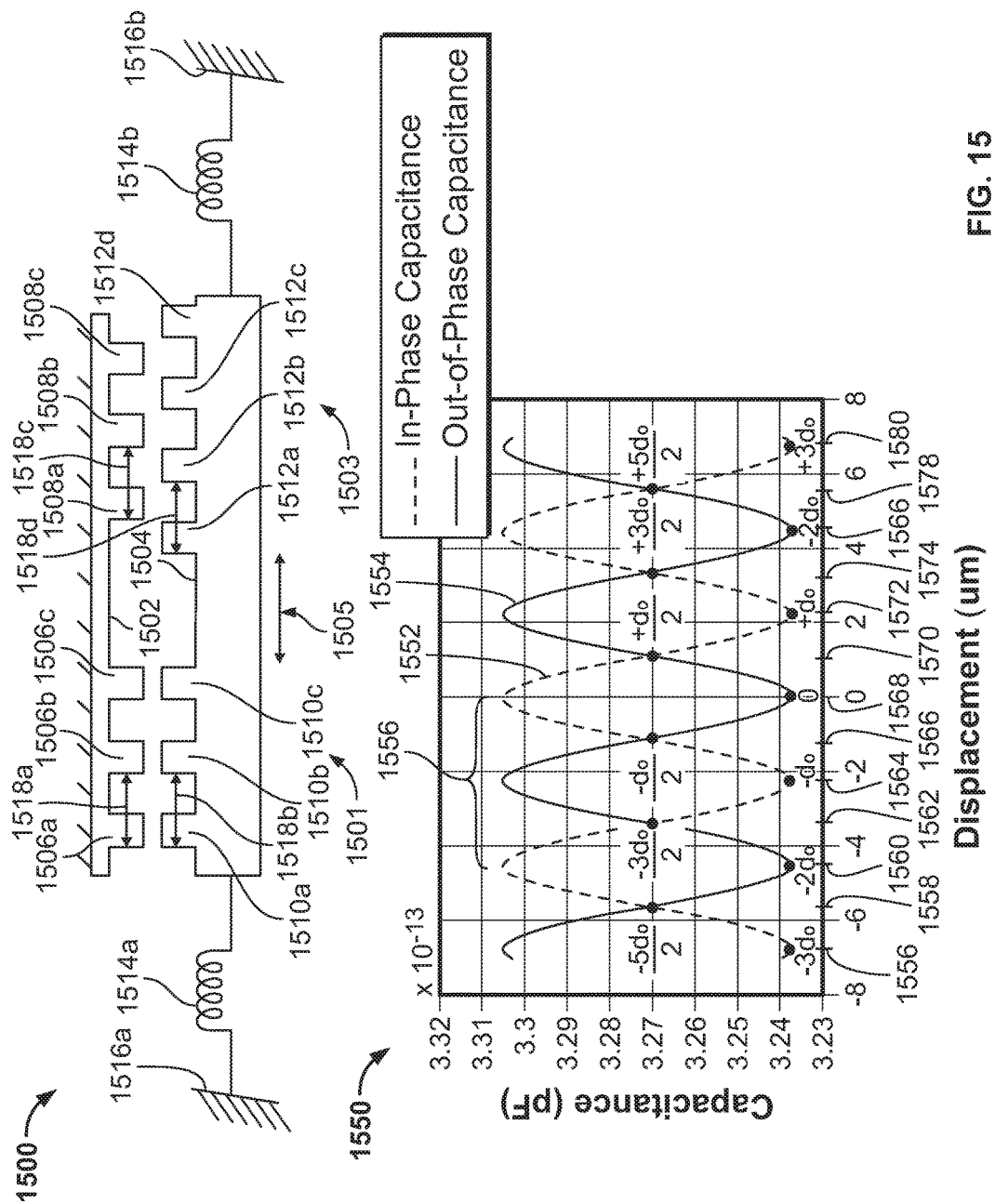
FIG. 15 depicts a system that includes two TDS structures and a graph that depicts capacitance profiles of the TDS structures, according to an illustrative implementation.

FIG. 15 depicts a system 1500 that includes two TDS structures and a graph 1550 that depicts capacitance profiles of the TDS structures. The system 1500 includes an in-phase TDS structure 1501 and an out-of-phase TDS structure 1503. The system 1500 includes a fixed beam 1502 and a movable beam 1504. The in-phase TDS structure 1501 includes movable teeth 1510a, 1510b, and 1510c (collectively, movable teeth 1510) on the movable beam 1504 and fixed teeth 1506a, 1506b, and 1506c (collectively, fixed teeth 1506) on the fixed beam 1502. The out-of-phase TDS structure 1503 includes movable teeth 1512a, 1512b, 1512c, and 1512d (collectively, movable teeth 1512) on the movable beam 1504 and fixed teeth 1508a, 1508b, and 1508c (collectively, fixed teeth 1508) on the fixed beam 1502. The fixed beam 1502 is connected by an anchor (not shown) to a top layer (not shown) and/or a bottom layer (not shown). The movable beam 1504 is connected by a spring 1514a to an anchor 1516a and by a spring 1514b to an anchor 1516b. The movable beam 1504 oscillates as shown by the arrow 1505. As the movable beams 1504 oscillates, the capacitance of the TDS structures 1501 and 1503 varies. FIG. 15 depicts pitch distances 1518a, 1518b, 1518c, and 1518d, all of which are equal, and any of which can be referred to as the pitch distance 1518.

The graph 1550 illustrates the variation of capacitance of the TDS structures 1501 and 1503 with displacement of the movable beam 1504. The graph 1550 includes capacitance curves 1552 and 1554 corresponding to capacitance of the TDS structures 1501 and 1503, respectively. The graph 1550 includes a pitch distance 1556, corresponding to the pitch distance 1518. The graph 1550 includes displacement levels 1556, 1558, 1560, 1562, 1564, 1566, 1568, 1570, 1572, 1574, 1576, 1578, and 1580, spaced by one-fourth the pitch distance 1556. Because of the movable teeth 1512 are offset by one-half the pitch distance 1518 from the fixed teeth 1508 when the movable beam 1504 is in the rest position, while the movable teeth 1510 are aligned with the fixed teeth 1506 when the movable beam 1504 is in the rest position, the capacitance curve 1554 is 180° out of phase from the capacitance curve 1552. The out-of-phase capacitance curve 1554 can be subtracted from the in-phase capacitance curve 1552 to generate a differential capacitance signal. The quantity $d_0$ is defined by equation 47.

$$d_0 \equiv \frac{\text{Pitch}}{2} \qquad [47]$$

Figure 16:
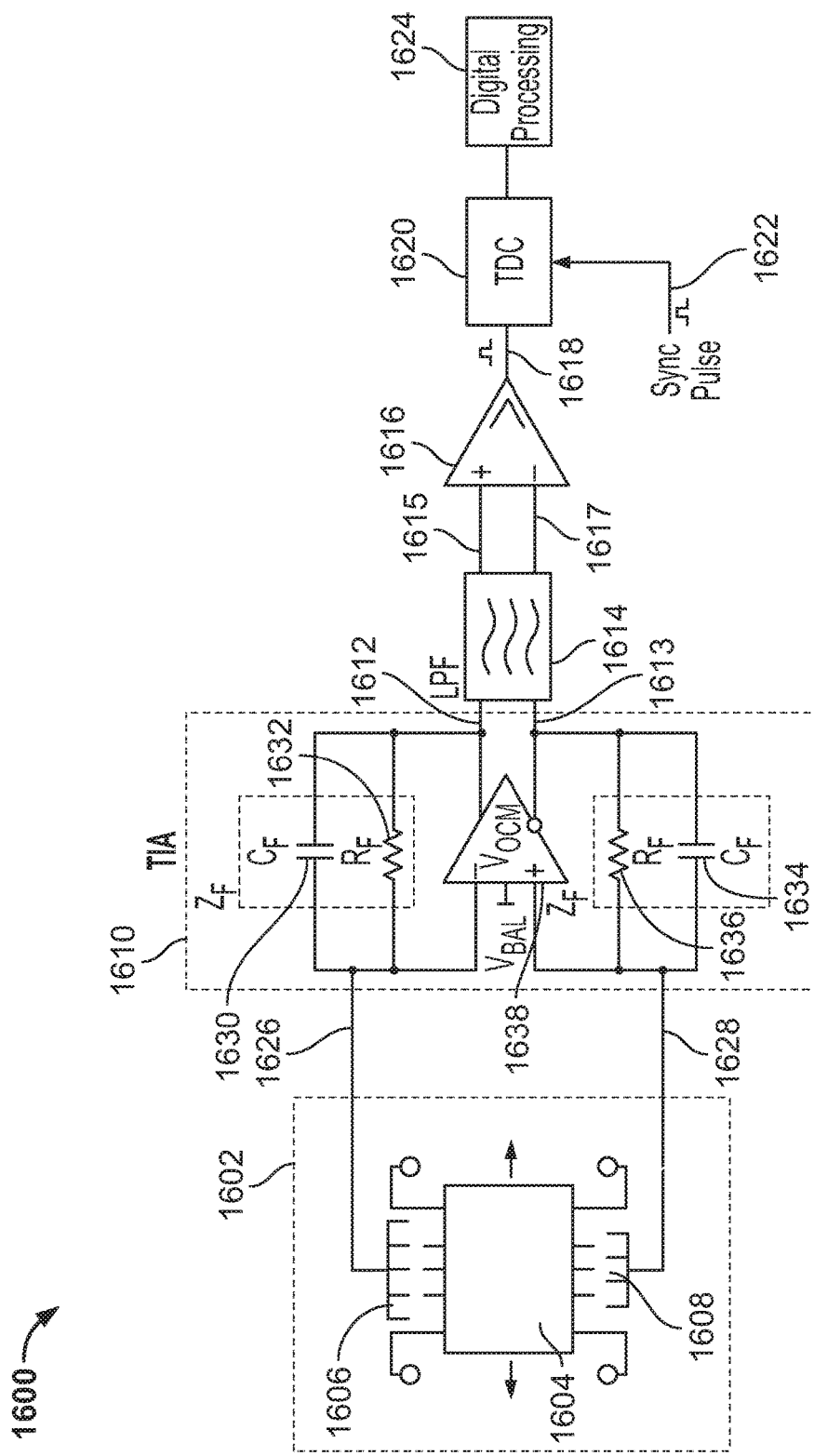
FIG. 16 depicts a system for determining acceleration with a transimpedance amplifier (TIA), according to an illustrative implementation.

FIG. 16 depicts a system 1600 for determining acceleration with a TIA. The system 1600 includes an inertial device 1602 which can include any or all of the features of the inertial devices described herein (e.g., 100, 202, 602 (FIGS. 1, 2, and 6)). The inertial device 1602 includes a proof mass 1604 which can include any or all of the features of the proof masses as described herein (e.g., 102, 203, 608 (FIGS. 1, 2, and 6)). The inertial device 1602 includes an in-phase TDS structure 1606 and an out-of-phase TDS structure 1608. The TDS structures 1606 and 1608 can include any and all the features of the TDS structures described herein (e.g., 105, 207, 506, 604, 606, 1501, 1503 (FIGS. 1, 2, 5, 6, and 15)). The TDS structures 1606 and 1608 produce analog output signals 1626 and 1628, respectively. The analog output signals 1626 and 1628 are received by a differential transimpedance amplifier 1610. The differential transimpedance amplifier 1610 includes an operational amplifier 1638, feedback resistors 1632 and 1636 and feedback capacitors 1634 and 1630. The values of the feedback capacitor 1630 and the feedback resistor 1632 are selected to satisfy equation 48, where $\omega_0$ is the oscillation frequency of the proof mass 1604.

$$\frac{1}{R_F C_F} \gg \omega_\sigma \qquad [48]$$

The values of the feedback capacitor 1634 and the feedback resistor 1636 are also chosen to satisfy equation 48. The transimpedance amplifier 1610 generates an in-phase TIA output signal 1612 and an out-of-phase TIA output signal 1613. The TIA output 1612 and 1613 are received by a low-pass filter 1614 which removes higher-frequency components to generate respective analog signals 1616 and 1617. The analog signals 1615 and 1617 are received by a comparator 1616 which compares the two signals and generates a rectangular-wave signal 1618 with pulse edges corresponding to times at which a difference of the output signals 1612 and 1613 crosses zero.

The rectangular-wave signal 1618 is received by a TDC 1620 which generates digital timestamps of rising and falling edges of the rectangular-wave signal 1618. The TDC 1620 receives a sync signal 1622 comprising a sync pulse and uses the sync pulse as an index for determining the timestamps. The timestamps generated by the TDC 1620 are received by digital circuitry 1624 which implements the cosine algorithm to determine inertial parameters, including acceleration of the inertial device 1602. By using the differential transimpedance amplifier 1610 to measure differential signals of the inertial device 1602, the system 1600 can reject common-mode noise.

Figure 17:
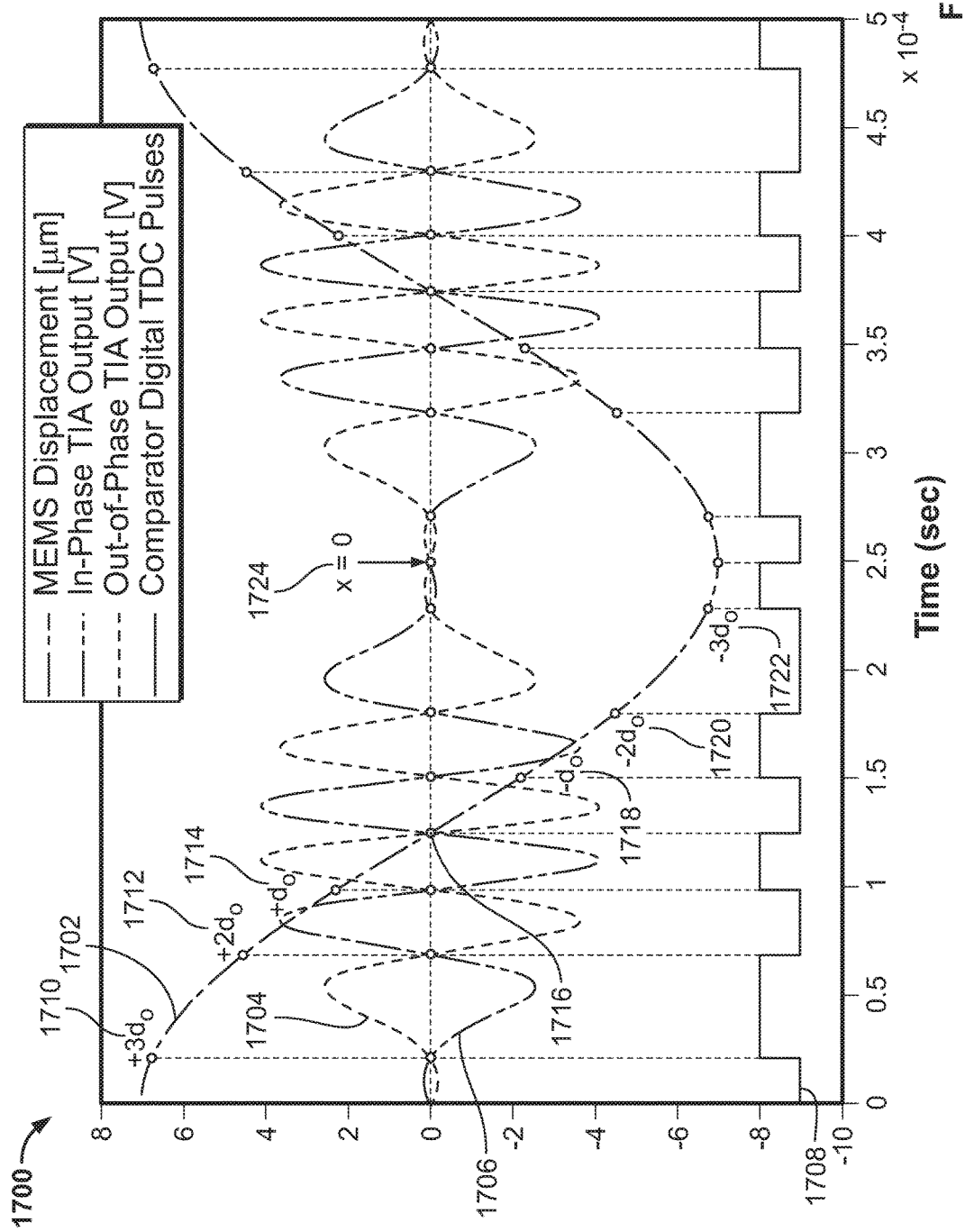
FIG. 17 depicts a graph illustrating signals of the system depicted in FIG. 16, according to an illustrative implementation.

FIG. 17 depicts a graph 1700 illustrating signals of the system 1600 (FIG. 16). The graph 1700 includes a displacement curve 1702, an in-phase TIA output curve 1704 and an out-of-phase TIA output curve 1706. The displacement curve 1702 illustrates the motion of the proof mass 1604 with respect to time. As the proof mass 1604 oscillates, the in-phase TIA output curve 1704 and the out-of-phase TIA output curve 1706 also oscillate and cross each other. The graph 1700 includes an pulse signal 1708 that represents the rectangular-wave signal 1618 generated by the comparator 1616.

The graph 1700 includes points 1710, 1712, 1714, 1716, 1718, 1720, 1722 and 1724, each corresponding to an integral multiple of the quantity $d_0$, which is defined as one-half of the pitch distance of the TDS structures 1606 and 1608 (FIG. 16). As the graph 1700 illustrates, the in-phase TIA output curve 1704 crosses the out-of-phase TIA output curve 1706, and the pulse signal 1708 changes value, when the proof mass 1604 (FIG. 16) is at distances from its rest position that are equal to integer multiples of $d_0$. Thus, the motion of the proof mass 1604 (FIG. 16) can be determined from crossings of the TIA output curves 1704 and 1706 independently of bias voltage applied to the TDS structures 1606 and 1608 (FIG. 16).

Figure 18:
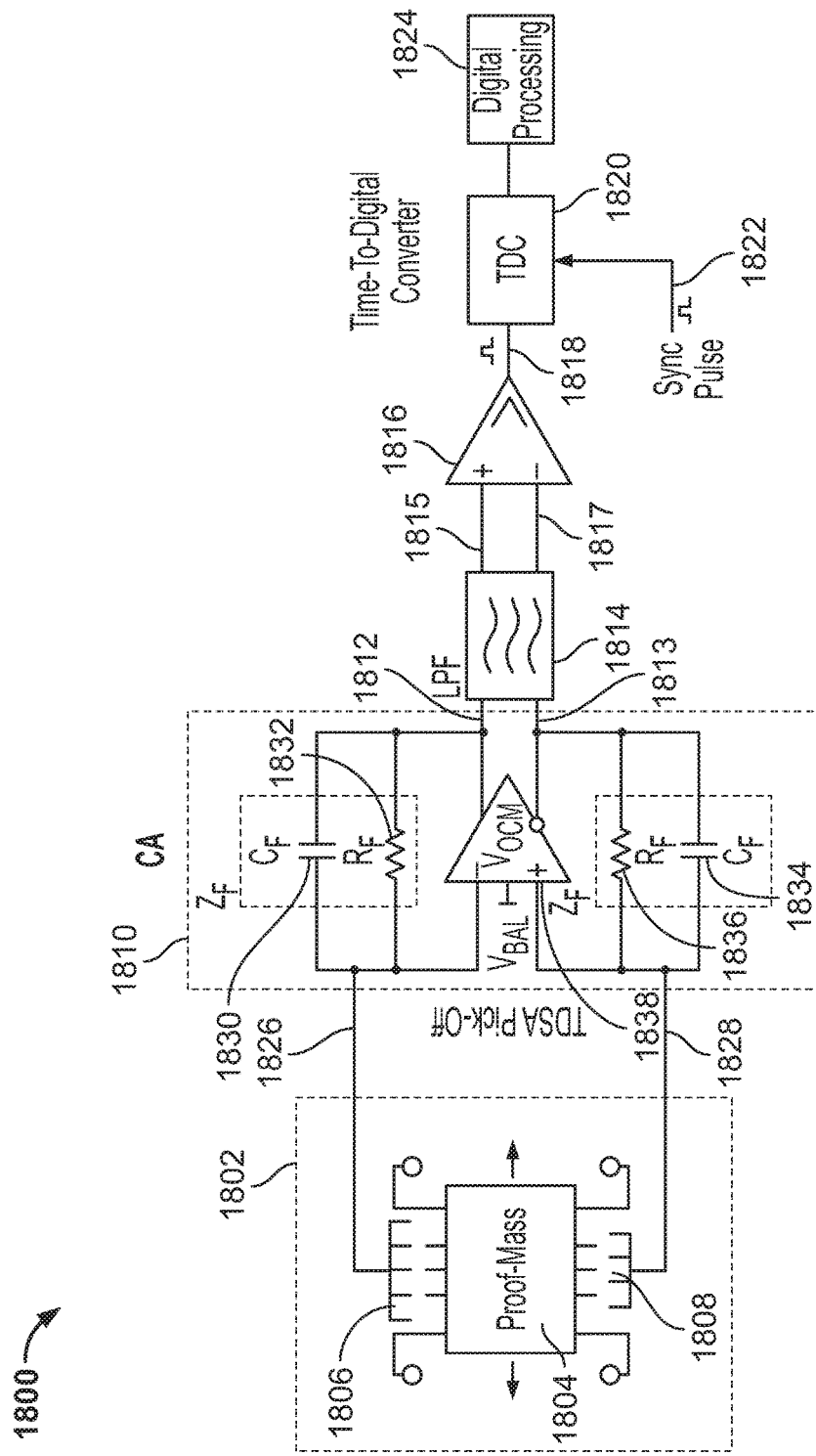
FIG. 18 depicts a system for determining acceleration with a charge amplifier (CA), according to an illustrative implementation.

FIG. 18 depicts a system 1800 for determining acceleration with a CA. The system 1800 includes an inertial device 1802 which can include any or all of the features of the inertial devices described herein (e.g., 100, 202, 602 (FIGS. 1, 2, and 6)). The inertial device 1802 includes a proof mass 1804 which can include any or all of the features of the proof masses as described herein (e.g., 102, 203, 608 (FIGS. 1, 2, and 6)). The inertial device 1802 includes an in-phase TDS structure 1806 and an out-of-phase TDS structure 1808. The TDS structures 1806 and 1808 can include any and all the features of the TDS structures described herein (e.g., 105, 207, 506, 604, 606, 1501, 1503, 1606, 1608 (FIGS. 1, 2, 5, 6, 15, and 16)). The TDS structures 1806 and 1808 produce analog output signals 1826 and 1828, respectively. The analog output signals 1826 and 1828 are received by a differential charge amplifier 1810. The differential charge amplifier 1810 includes an operational amplifier 1838, feedback resistors 1832 and 1836 and feedback capacitors 1834 and 1830. The values of the feedback capacitor 1830 and the feedback resistor 1832 are selected to satisfy equation 49, where $\omega_0$ is the oscillation frequency of the proof mass 1804.

$$\frac{1}{R_F C_F} \ll \omega_\sigma \qquad [49]$$

The values of the feedback capacitor 1834 and the feedback resistor 1836 are also chosen to satisfy equation 49. The charge amplifier 1810 generates an in-phase TIA output signal 1812 and an out-of-phase TIA output signal 1813. The TIA output 1812 and 1813 are received by a low-pass filter 1814 which removes higher-frequency components to generate respective analog signals 1816 and 1817. The analog signals 1815 and 1817 are received by a comparator 1816 which compares the two signals and generates a rectangular-wave signal 1818 with pulse edges corresponding to times at which a difference of the output signals 1812 and 1813 crosses zero.

The rectangular-wave signal 1818 is received by a TDC 1820 which generates digital timestamps of rising and falling edges of the rectangular-wave signal 1818. The TDC 1820 receives a sync signal 1822 comprising a sync pulse and uses the sync pulse as an index for determining the timestamps. The timestamps generated by the TDC 1820 are received by digital circuitry 1824 which implements the cosine algorithm to determine inertial parameters, including acceleration of the inertial device 1802. By using the differential charge amplifier 1810 to measure differential signals of the inertial device 1802, the system 1800 can reject common-mode noise.

Figure 19:
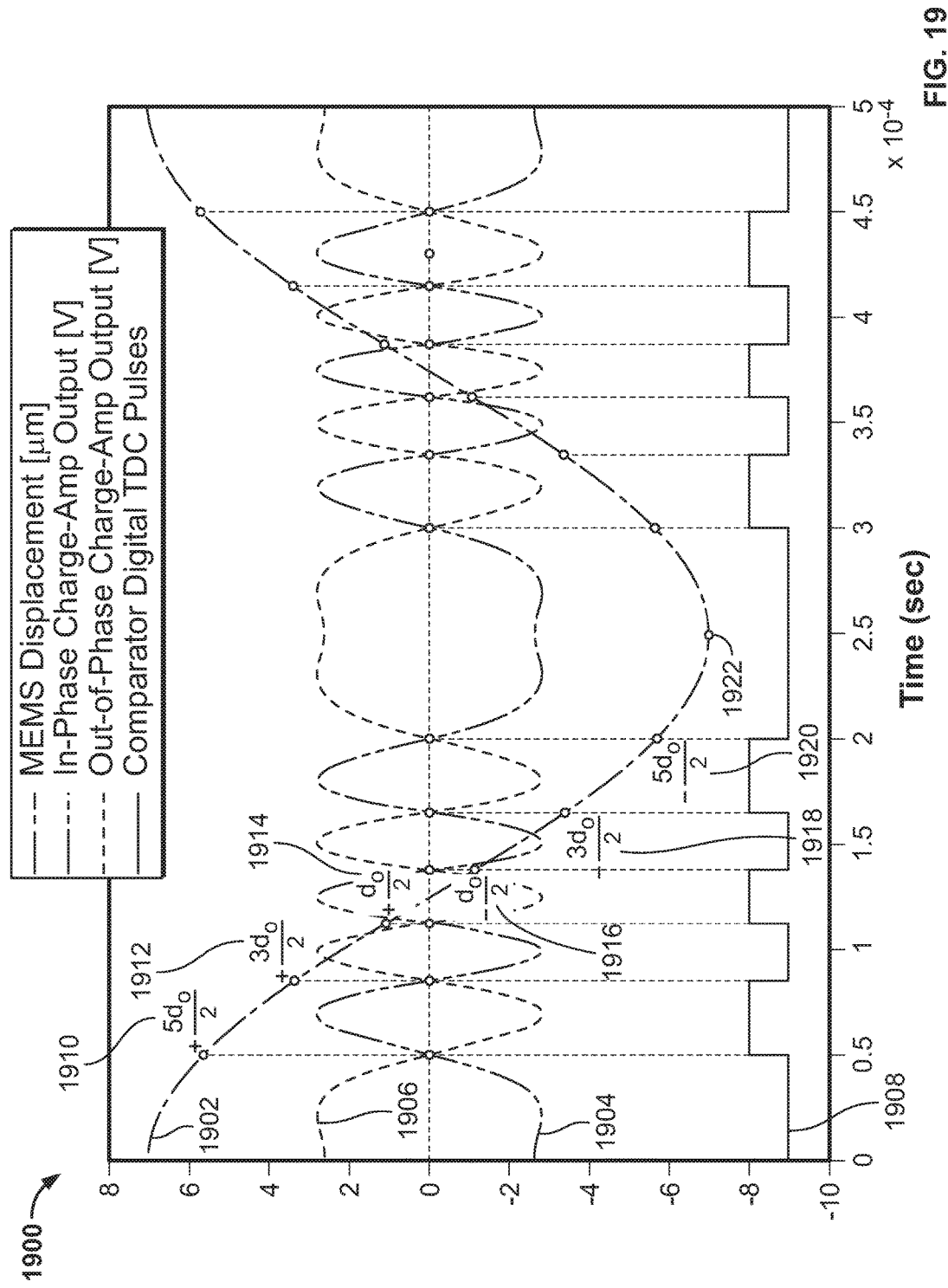
FIG. 19 depicts a graph illustrating signals of the system depicted in FIG. 18, according to an illustrative implementation.

FIG. 19 depicts a graph 1900 illustrating signals of the system 1800 (FIG. 18). The graph 1900 includes a displacement curve 1902, an in-phase TIA output curve 1904 and an out-of-phase TIA output curve 1906. The displacement curve 1902 illustrates the motion of the proof mass 1804 (FIG. 18) with respect to time. As the proof mass 1804 (FIG. 18) oscillates, the in-phase TIA output curve 1904 and the out-of-phase TIA output curve 1906 also oscillate and cross each other. The graph 1900 includes a pulse signal 1908 that represents the rectangular-wave signal 1818 (FIG. 18) generated by the comparator 1816 (FIG. 18).

The graph 1900 includes points 1910, 1912, 1914, 1916, 1918, 1920, 1922 and 1924, each corresponding to a proof mass displacement that satisfies the quantity $d_0(n+\frac{1}{2})$, where $d_0$ is defined as one-half of the pitch distance of the TDS structures 1806 and 1808 (FIG. 18) and n is an integer. As the graph 1900 illustrates, the in-phase TIA output curve 1904 crosses the out-of-phase TIA output curve 1906, and the pulse signal 1908 changes value, when the proof mass 1804 (FIG. 18) is at distances from its rest position that satisfy the quantity $d_0(n+\frac{1}{2})$. Thus, the motion of the proof mass 1804 (FIG. 18) can be determined from crossings of the TIA output curves 1904 and 1906 independently of bias voltage applied to the TDS structures 1806 and 1808 (FIG. 18).

When a charge amplifier is used instead of a transimpedance amplifier, the circuit topology is the same but the feedback time constant of the charge amplifier is selected such that its frequency pole is placed at frequencies much lower than the resonant frequency of the proof mass (e.g., 102, 203, 608, 1604, 1804 (FIGS. 1, 2, 6, 16, and 18)), as shown in equation 49. This ensures that the motion-induced current is integrated to produce an output that is proportional to the time-varying capacitance of the TDS structures (e.g., 105, 207, 506, 604, 606, 1501, 1503, 1606, 1608, 1806, 1808 (FIGS. 1, 2, 5, 6, 15, 16, and 18)). As the time integral of current is charge, integrating the motion-induced current can be also described as charge amplification.

In some examples, a TDS structure (e.g., 105, 207, 506, 604, 606, 1501, 1503, 1606, 1608, 1806, 1808 (FIGS. 1, 2, 5, 6, 15, 16, and 18)) can be coupled to a mechanical oscillator to generate a time-varying periodic capacitive signal. The period of the capacitive signal is based on the geometry of the TDS structure, which is fixed by the fabrication process. This enables an inertial device to have stability and insensitivity to variations in amplitude and frequency of the oscillator. The time-varying capacitive signal is measured due to determine inertial parameters such as acceleration and rotation of the inertial device. In some examples, discrete-time systems and methods such as switched capacitor amplifiers and commutating, or chopping, modulating techniques are used to measure the time-varying capacitive signal. In some examples, a bridge with a general impedance converter (GIC) can be used. In some examples, continuous-time architectures such as a transimpedance amplifier or a charge amplifier can be used.

In some examples, an inertial device (e.g., 100, 202, 602, 1602, 1802 (FIGS. 1, 2, 6, 16, and 18)) including a proof mass (e.g., 102, 203, 608, 1604, 1804 (FIGS. 1, 2, 6, 16, and 18)) and a TDS structure (e.g., 105, 207, 506, 604, 606, 1501, 1503, 1606, 1608, 1806, 1808 (FIGS. 1, 2, 5, 6, 15, 16, and 18)) can measure position of the proof mass by converting a motion-induced capacitive current from the TDS structure to a voltage using the TIA circuit architecture depicted in FIG. 16.

The total capacitive current (e.g., 1626, 1628 (FIG. 16)) is determined by the time-derivative of the charge of the relevant capacitor (e.g., TDS structures, 105, 207, 506, 604, 606, 1501, 1503, 1606, 1608, 1806, 1808 (FIGS. 1, 2, 5, 6, 15, 16, and 18)). Capacitor charge (Q) is the product of capacitance (C) and voltage potential across the capacitor ($V_C$) as shown in equation 50.

$$\dot{q} = i = \dot{C}V_C + C\dot{V}_C \qquad [50]$$

If series resistance is approximately zero, an operational amplifier provides a virtually fixed potential across the capacitor, then the right-most term in equation 50, which includes the first time derivative of the capacitor voltage, can be neglected, resulting in equation 51.

$$i \approx \dot{C}V_C = \frac{dC}{dt}V_C = \frac{dC}{dx}\frac{dx}{dt}V_C = \frac{dC}{dx}\dot{x}V_C \qquad [51]$$

Therefore, the capacitive current (e.g., 1626, 1628 (FIG. 16)) is approximately equal to the product of the gradient of the physical capacitor (dC/dx), the velocity of the proof mass ($\dot{x}$), and the fixed potential across the capacitor ($V_C$). In some examples, the capacitor design can include structures that force the capacitive gradient (dC/dx) to zero at geometrically fixed locations. Thus, as long as the voltage across the capacitor ($V_C$) is not zero and the proof mass (e.g., 102, 203, 608, 1604, 1804 (FIGS. 1, 2, 6, 16, and 18)) has a non-zero velocity at these locations, at least some of the times at which the capacitive current (i) is zero correspond to times at which the proof mass passes these geometrically fixed locations. This enables the zero-crossings of the capacitive current to be used in determining that the proof mass has either crossed the zero-gradient locations or has come to rest (such as at minimum or maximum displacements). The slope of the current signal (i) is given by its time derivative as shown in equation 52.

$$\begin{aligned}\frac{di}{dt} &= \ddot{C}V_C \\ &= \frac{d}{dt}\left\{\frac{dC}{dx}\frac{dx}{dt}V_C\right\} \\ &= \frac{d}{dt}\left\{\frac{dC}{dx}\right\}\frac{dx}{dt}V_C + \frac{dC}{dx}\ddot{x}V_C\end{aligned} \qquad [52]$$

Equation 52 can be rewritten as equation 53.

$$\frac{di}{dt} = \left(\frac{d^2C}{dx^2}\dot{x}^2 + \frac{dC}{dx}\ddot{x}\right)V_C \qquad [53]$$

As a result, the rate of change of the capacitive current (e.g., 1626, 1628 (FIG. 16)) is proportional to the voltage across the capacitor ($V_C$), the curvature of the spatial capacitance ($d^2C/dx^2$), and the square of the proof mass velocity ($\dot{x}^2$). It is also in proportion to the gradient (dC/dx) of the capacitance and the acceleration of the proof mass ($\ddot{x}$). Typically, the peak curvature of the capacitance occurs when the proof mass is near a position in which the capacitive gradient approaches zero and this coincides with a zero acceleration and maximum velocity condition. Therefore, equation 53 can be approximated as shown in equation 54.

$$\frac{di}{dt} \approx \frac{d^2C}{dx^2}\dot{x}^2V_C \qquad [54]$$

An accurate measurement of the time associated with a zero-crossing of the current can be used to determine acceleration of the inertial device (e.g., 100, 202, 602, 1602 and 1802). These zero-crossing times correspond to fixed physical displacements of the proof mass (e.g., 102, 203, 608, 1604, 1804 (FIGS. 1, 2, 6, 16, and 18)) located at integer multiples of one-half of the pitch, where the pitch is the periodic spacing of the teeth in the TDS structure (e.g., 105, 207, 506, 604, 606, 1501, 1503, 1606, 1608, 1806, 1808 (FIGS. 1, 2, 5, 6, 15, 16, and 18)). FIG. 15 depicts an example of differential TDS structures 1501 and 1503 having a pitch 1518.

Uncertainty in the measurement of the zero-crossing times is given by the ratio of the electronic noise amplitude to the rate of the signal crossing. Therefore, maximizing the slope of the current signal (di/dt) can minimize the timing uncertainty of the zero-crossings of the current. Larger values of the capacitive curvature ($d^2C/dx^2$) velocity of the proof mass ($\dot{x}$) and bias by voltage ($V_C$) can increase the slope of the current signal (di/dt) and thus would reduce uncertainty in the time measurements. These parameters can be selected based on a desired rate of signal crossing as well as other parameters to achieve a desired performance of the inertial device (e.g., 100, 202, 602, 1602, 1802 (FIGS. 1, 2, 6, 16, and 18)). A differential TIA can be implemented as depicted in FIG. 16. The time constant of the feedback impedance (e.g., 1630, 1632, 1634, 1636) sets the bandwidth of the TIA 1610. The design of the TIA 1610 can balance several competing variables which can influence the performance of the sensor. For example, a large feedback resistance (e.g., 1632, 1636) improves the signal gain, but also reduces bandwidth and reduces noise. The bandwidth must be large enough to pass the spectral content of the capacitive signal (e.g., 1626, 1628) without attenuation and frequency-dependent phase shift. Signal attenuation will reduce signal slope which in turn will increase the measurement uncertainty of the zero-crossing. Excessive phase shift can distort the measured times leading to harmonic distortion of the output signals (e.g., 1612, 1613) of the TIA 1610.

In some examples, an inertial device (e.g., 100, 202, 602, 1602, 1802 (FIGS. 1, 2, 6, 16, and 18)) can include signal processing circuitry such as a charge amplifier that generates an output voltage that is proportional to the time-varying capacitance signal of a TDS structure (e.g., 105, 207, 506, 604, 606, 801, 1503, 1606, 1608, 1806, 1808). This architecture for signal processing circuitry can be referred to as a capacitance-to-voltage (C-to-V) architecture.

In some examples, bridge circuits may be used to determine times at which a proof mass (e.g., 102, 203, 608, 1604, 1804 (FIGS. 1, 2, 6, 16, and 18)) is at positions at which the capacitance of structures (e.g., 105, 207, 506, 604, 606, 1501, 1503, 1606, 1608, 1806, 1808 (FIGS. 1, 2, 5, 6, 15, 16, and 18)) have equivalent values (i.e., become balanced). In some examples, this balancing may occur when in-phase TDS structures (e.g., 604, 1501, 1606, 1806) have equivalent capacitance values as out-of-phase TDS structures (e.g., 606, 1503, 1608, 1808). For an example, as depicted in the graph 1550 of FIG. 15, the in-phase capacitance curve 1552 crosses the out-of-phase capacitance curve 1554 at odd multiples of displacement increments of one-fourth of the pitch.

One example of a C-to-V signal processing circuit is a charge amplifier (e.g., 1810). The charge amplifier 1810 shares the same circuit topology as the transimpedance amplifier 1610, but the charge amplifier 1810 has a pole location that is at very low frequencies. The pole location is determined by the time constant of the feedback impedance (e.g., 1830, 1832, 1834, 1836). The charge amplifier 1810 has a low frequency pole occurring at a frequency much lower than the mechanical resonant frequency of the proof mass (e.g., 102, 203, 608, 1604, 1804 (FIGS. 1, 2, 6, 16, and 18)). The current amplifier 1810 can operate to integrate current, which is operationally equivalent to charge amplification. In some examples, the pole placement is selected to be much lower than the mechanical resonant frequency of the proof mass (e.g., 102, 203, 608, 1604, 1804 (FIGS. 1, 2, 6, 16, and 18)) and sufficiently low so as not to impose phase shift on the time-varying capacitive signal (e.g., 1826, 1828). The ratio of bias voltage (set by operational amplifier common mode voltage) to the feedback capacitor value determines the gain (i.e., volts per Farad), of the output signal (e.g., 1812, 1813). A smaller value of feedback capacitance (e.g., 1830, 1834) and/or a larger bias voltage will increase the signal gain. In some examples, noise is largely determined by the value of the feedback capacitor (e.g., 1830, 1834), especially if this value is quite small. The feedback capacitor's contribution to output RMS noise is proportional to sqrt($kT/C_F$). Other factors such as operational amplifier current and voltage noise density, parasitic capacitance, and low-pass filtering also affect the signal-to-noise ratio.

By measuring times at which the output (e.g., 1826, 1828) of the differential charge amplifier (e.g., 1810) crosses zero, the inertial parameters of the inertial device (e.g., 100, 202, 602, 1602, 1802 (FIGS. 1, 2, 6, 16, and 18)) can be determined. Because the differential TDS structures (e.g., 1806, 1808) are well-matched with a 180° phase relationship, they will provide reliable crossing events that correspond to fixed physical displacements. When using a charge amplifier, timing uncertainty is minimized by maximizing the capacitor gradients (i.e. first spatial derivative of the capacitance) occurring at odd multiples of one-fourth of the pitch of the TDS structure (e.g., 105, 207, 506, 604, 606, 1501, 1503, 1606, 1608, 1806, 1808 (FIGS. 1, 2, 5, 6, 15, 16, and 18)). In some examples, an inertial device (e.g., 100, 202, 602, 1602, 1802 (FIGS. 1, 2, 6, 16, and 18)) can have a proof mass of (e.g., 102, 203, 608, 1604, 1804) with a 1.2 kHz resonant frequency and a drive displacement amplitude of 12 microns. If this inertial device experiences a 1 g DC acceleration and 0.5 g and 0.2 g sinusoidal inputs at 2.5 Hz and 33.1 Hz respectively, the inertial device can have a noise level of approximately 10 µg/rtHz.

As described with reference to FIG. 6, inertial parameters can be determined from zero-crossing times by using transimpedance amplifiers, charge amplifiers, or switched capacitors to convert analog input signals to analog voltages. In some cases a comparator and a TDC can be used to measure zero-crossing times as digital inputs to digital circuitry implementing zero-crossing times as digital inputs to digital circuitry implementing a cosine algorithm. In some examples an ADC can be used in place of the comparator and TDC to digitize the analog voltages and to produce time measurements in the digital domain. Digital signal processing techniques, such as upsampling and interpretation, may be used to enhance the accuracy of ADC zero-crossing detection.

The methods and systems described herein utilize the periodic nature of the motion of a proof mass (e.g., 102, 203, 608, 1604, 1804 (FIGS. 1, 2, 6, 16, and 18)), in conjunction with TDS structures (e.g., 105, 207, 506, 604, 606, 1501, 1503, 1606, 1608, 1806, 1808 (FIGS. 1, 2, 5, 6, 15, 16, and 18)) that generate capacitive signals (e.g., 1626, 1628, 1826, 1828) with measureable timing events. The timing events can be zero-crossings and can correspond to fixed spatial locations at known multiples of half-pitch and/or quarter-pitch spacing of the TDS structure. The underlying mathematical formulations behind the methods assume that the displacement offset due to an input acceleration of the inertial device of (e.g., 100, 202, 602, 1602, 1802 (FIGS. 1, 2, 6, 16, and 18)) is constant over the duration of the resonant period, and that the sinusoidal proof mass motion is spectrally pure. In practice, the methods rely on approximations that assume that the input offset is quasi-static, exhibiting change much slower than the time scale of the resonant period. If the input offset changes more rapidly, this can result in an increased harmonic distortion of output signals.

The cosine algorithm can be implemented as described below, but can also be implemented with other forms of timing intervals, each having implications for noise, frequency response, and harmonic distortion performance.

The proof mass (e.g., 102, 203, 608, 1604, 1804 (FIGS. 1, 2, 6, 16, and 18)) can be modeled as a simple harmonic oscillator experiencing a quasi-static input acceleration, and the steady-state displacement response of the proof mass takes the form of a sinusoidal signal with displacement amplitude ($\Delta x$) and constant offset ($\Delta d$) as shown in equation 55.

$$x(t) = \Delta x \cdot \cos(\theta(t)) + \Delta d \quad [55]$$

In these examples, quasi-static displacement accelerations are inertial excitations evolving over time scales much longer than the resonant period of oscillation (i.e., frequency is approaching the zero). In these examples, the relationship between input acceleration ($\ddot{x}$) and physical offset is represented by equation 56.

$$\Delta d \approx \mathcal{L}^{-1}\left\{\lim_{s \to 0} H(s)\mathcal{L}\{\ddot{x}\}\right\} \quad [56]$$

$$= \mathcal{L}^{-1}\left\{\lim_{s \to 0} \frac{\mathcal{L}\{\ddot{x}\}}{s^2 + s\frac{\omega_o}{Q} + \omega_o^2}\right\}$$

$$= \frac{\ddot{x}}{\omega_o^2}$$

Figure 20:
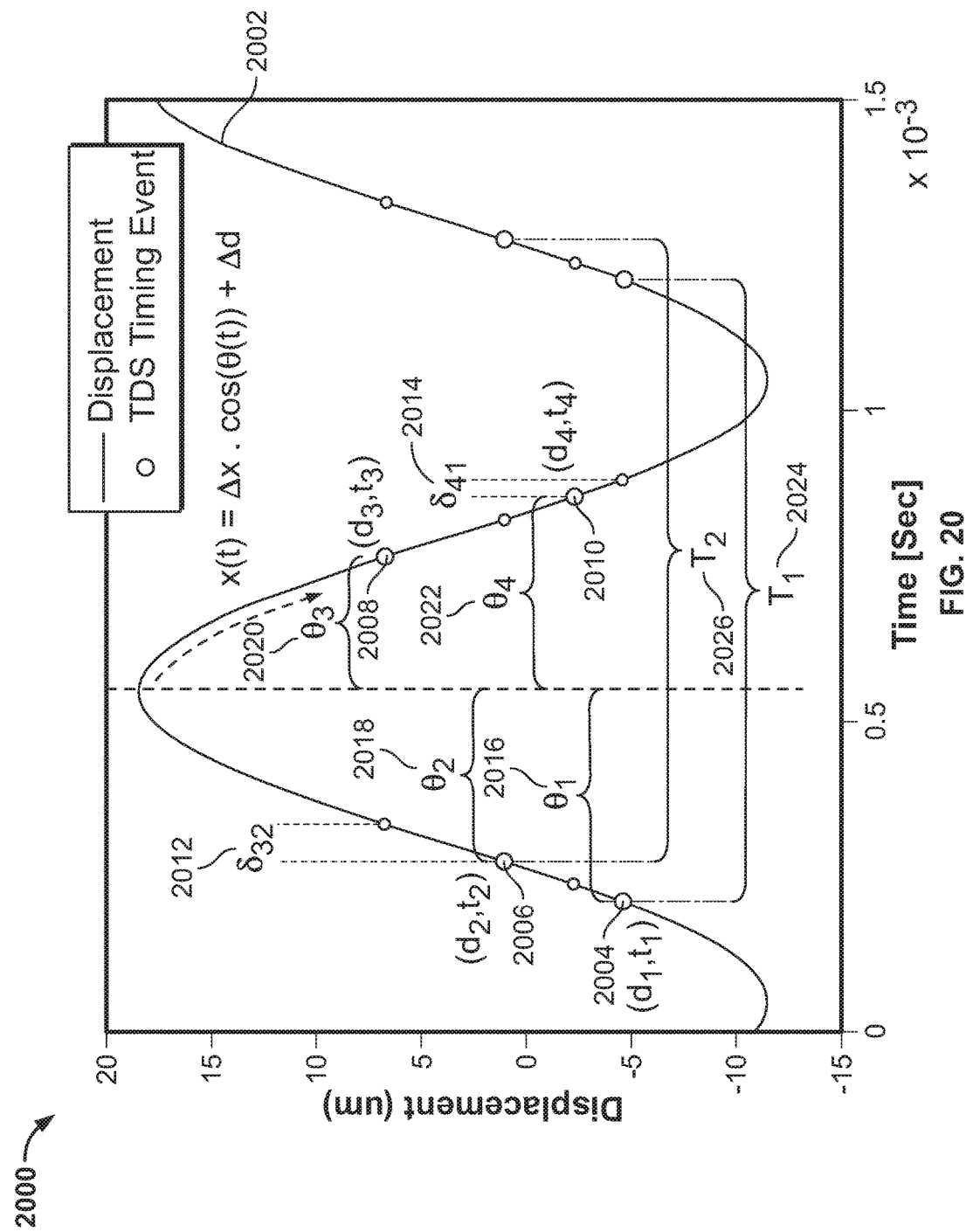
FIG. 20 depicts a graph illustrating displacement of a proof mass and TDS timing events, according to an illustrative implementation.

FIG. 20 depicts a graph 2000 illustrating displacement of a proof mass and TDS timing events. The graph 2000 includes a displacement curve 2002 corresponding to displacement of the proof mass (e.g., 102, 203, 608, 1604, 1804 (FIGS. 1, 2, 6, 16, and 18)). The graph 2000 also includes timing events 2004, 2006, 2008 and 2010 that correspond to threshold crossing times, which can be determined using the systems and methods described with reference to FIGS. 4, 6, 15, 16, 17, 18, and 19. The graph 2000 also includes time intervals 2012, 2014, 2024 and 2026, and these points 2016, 2018, 2020 and 2022 used in the systems and method described herein.

In general the inertial device (e.g., 100, 202, 602, 1602, 1802 (FIGS. 1, 2, 6, 16, and 18)) provides measurements of times at which the proof mass crosses four known physical location (e.g., 2004, 2006, 2008, and 2010) as dictated by the geometry of the TDS structure (e.g., 105, 207, 506, 604, 606, 1501, 1503, 1606, 1608, 1806, 1808 (FIGS. 1, 2, 5, 6, 15, 16, and 18)). These known physical locations correspond to a specific spatial phase points (e.g., 2016, 2018, 2020 and 2024). The measured time intervals (e.g., times at which the proof mass is at 2004, 2006, 2008 and 2010) can be used to determine an input acceleration of the inertial device. Under the quasi-static assumption, the input acceleration can be directly determined while eliminating dependence on displacement amplitude ($\Delta x$) and frequency. This is because information about the period of the oscillation of the proof mass is actively measured each cycle by measuring the time intervals 2024, 2026. The time intervals are measured with respect to the peak of the cosine carrier signal or oscillation of the proof mass, and the static input offset assumption ensures symmetry about the peak. Equations 57, 58, 59, and 60 can be used to express the relationships between physical locations, phase points, measured time intervals and oscillation offset.

$$\Delta x \cdot \cos(\theta_1) + \Delta d = \Delta x \cdot \cos(2\pi f_o t_1) + \Delta d = d_1 \quad [57]$$

$$\Delta x \cdot \cos(\theta_2) + \Delta d = \Delta x \cdot \cos(2\pi f_o t_2) + \Delta d = d_2 \quad [58]$$

$$\Delta x \cdot \cos(\theta_3) + \Delta d = \Delta x \cdot \cos(2\pi f_o t_3) + \Delta d = d_3 \quad [59]$$

$$\Delta x \cdot \cos(\theta_4) + \Delta d = \Delta x \cdot \cos(2\pi f_o t_4) + \Delta d = d_4 \quad [60]$$

The resonant frequency is inversely related to the resonant period and can be measured independently using time intervals 2024 and 2026 as shown in equation 61.

$$f_o = \frac{1}{T_1} = \frac{1}{T_2} \quad [61]$$

The average resonant frequency estimated can be determined from the average measured period as shown in equation 62.

$$f_{avg} = \frac{1}{T_{avg}} = \frac{2}{T_1 + T_2} \quad [62]$$

In equation 63, equations 59 and 58 are added and trigonometric sum-to-product formulas are applied.

$$2\Delta d + \Delta x \cdot \cos(2\pi f_o t_3) + \Delta x \cdot \cos(2\pi f_o t_2) = 2\Delta d + 2\Delta x \cdot \cos(2\pi f_o (t_3 + t_2)) \cos(\pi f_o \delta_{32}) = d_3 + d_2 \quad [63]$$

In equation 64, equations 60 and 57 are added and trigonometric sum-to-product formulas are applied.

$$2\Delta d + \Delta x \cdot \cos(2\pi f_o t_4) + \Delta x \cdot \cos(2\pi f_o t_1) = 2\Delta d + 2\Delta x \cdot \cos(2\pi f_o (t_4 + t_1)) \cos(\pi f_o \delta_{41}) = d_4 + d_1 \quad [64]$$

By subtracting equation 64 from equation 63 and incorporating equation 61, the dependence on offset ($\Delta d$) can be eliminated and an expression for the displacement amplitude can be obtained as shown in equation 65. The subscript indicates the current measurement cycle.

$$d_3 + d_2 - d_4 - d_1 = \quad [65]$$

$$2\Delta x\left[\cos\left(\frac{\pi}{T_2}(t_3 + t_2)\right)\cos\left(\frac{\pi}{T_2}\delta_{32}\right) - \cos\left(\frac{\pi}{T_1}(t_4 + t_1)\right)\cos\left(\frac{\pi}{T_1}\delta_{41}\right)\right]$$

$$\therefore \Delta x_n = \left(\frac{d_3 + d_2 - d_4 - d_1}{2}\right)$$

$$\frac{1}{\cos\left(\frac{\pi}{T_2}(t_3 + t_2)\right)\cos\left(\frac{\pi}{T_2}\delta_{32}\right) - \cos\left(\frac{\pi}{T_1}(t_4 + t_1)\right)\cos\left(\frac{\pi}{T_1}\delta_{41}\right)}$$

By adding equations 63 and 64 and substituting the expression for displacement amplitude, an expression for displacement offset (($\Delta d$) can be obtained as shown in equation 66.

$$\Delta d = \frac{d_1 + d_2 + d_3 + d_4}{4} - \quad [66]$$

$$\frac{\Delta x}{2}\left[\cos\left(\frac{\pi}{T_2}(t_3 + t_2)\right)\cos\left(\frac{\pi}{T_2}\delta_{32}\right) + \cos\left(\frac{\pi}{T_1}(t_4 + t_1)\right)\cos\left(\frac{\pi}{T_1}\delta_{41}\right)\right]$$

Equation 66 can be rearranged as shown in equation 67.

$$\therefore \Delta d = \frac{d_1 + d_2 + d_3 + d_4}{4} - \left(\frac{d_3 + d_2 - d_4 - d_1}{2}\right) \quad [67]$$

$$\left[\frac{\cos\left(\frac{\pi}{T_2}(t_3+t_2)\right)\cos\left(\frac{\pi}{T_2}\delta_{32}\right) + \cos\left(\frac{\pi}{T_1}(t_4+t_1)\right)\cos\left(\frac{\pi}{T_1}\delta_{41}\right)}{\cos\left(\frac{\pi}{T_2}(t_3+t_2)\right)\cos\left(\frac{\pi}{T_2}\delta_{32}\right) - \cos\left(\frac{\pi}{T_1}(t_4+t_1)\right)\cos\left(\frac{\pi}{T_1}\delta_{41}\right)}\right]$$

Using the approximate input-output relationship between acceleration and displacement derived in equation 56, an expression for sensed input acceleration, scaled to units of g, can be derived as shown in equation 68.

$$\ddot{x}_n = \frac{(2\pi f_{avg})^2}{g}\left(\frac{d_1+d_2+d_3+d_4}{4} - \left(\frac{d_3+d_2-d_4-d_1}{4}\right)\left[\frac{\cos\left(\frac{\pi}{T_2}(t_3+t_2)\right)\cos\left(\frac{\pi}{T_2}\delta_{32}\right) + \cos\left(\frac{\pi}{T_1}(t_4+t_1)\right)\cos\left(\frac{\pi}{T_1}\delta_{41}\right)}{\cos\left(\frac{\pi}{T_2}(t_3+t_2)\right)\cos\left(\frac{\pi}{T_2}\delta_{32}\right) - \cos\left(\frac{\pi}{T_1}(t_4+t_1)\right)\cos\left(\frac{\pi}{T_1}\delta_{41}\right)}\right]\right) \quad [68]$$

In some examples, it may be difficult to accurately measure time intervals using a peak of a displacement curve as a reference point. In some examples, this issue can be overcome by taking advantage of several aspects. First, the output of TDS structures (e.g., 105, 207, 506, 604, 606, 1501, 1503, 1606, 1608, 1806, 1808 (FIGS. 1, 2, 5, 6, 15, 16, and 18)) includes measurable zero-crossings for every traversal of a proof mass (e.g., 102, 203, 608, 1604, 1804 (FIGS. 1, 2, 6, 16, and 18)) past a given spatial reference point ($d_0$). Second, the timing intervals for zero-crossings corresponding to the traversal of the same spatial reference point are symmetric about the maxima and minima of the displacement curve or the analog output signal (e.g., 611, 613, 1626, 1628, 1826, 1828 (FIGS. 6, 16, and 18)). Therefore, the timing intervals used in the cosine method (e.g., $T_1$, $T_2$, $T_3$, and $T_4$ of equations 61-68) are one-half of these timing intervals between zero-crossings. As described herein, the $d_0$ spatial reference points can include teeth of the TDS structures (105, 207, 506, 604, 606, 1501, 1503, 1606, 1608, 1806, 1808 (FIGS. 1, 2, 5, 6, 15, 16, and 18)). In some examples, the motion-induced current produced by the TDS structure (e.g., 105, 207, 506, 604, 606, 1501, 1503, 1606, 1608, 1806, 1808 (FIGS. 1, 2, 5, 6, 15, 16, and 18)) is measured using a transimpedance amplifier, and $d_0$ corresponds to the first-half pitch spacing (e.g., for a pitch=4.5 µm count $d_0$=2.25 µm) of the teeth of the TDS structure. It some examples, a capacitance-to-voltage or charge-amplifier conversion device would produce zero-crossings that correspond to odd multiples of the quarter-pitch spacing of the TDS structure. Fabrication-induced variations can modify the effective $d_0$ scale factor used in implementing the cosine algorithm. This is accounted for with a small calibration correction.

In some examples, an inertial device (e.g., 100, 202, 602, 1602, 1802 (FIGS. 1, 2, 6, 16, and 18)) can include a TDC to provide high-resolution measurements of zero-crossing times with respect to a rising edge of a sync signal generated based on a drive-sync signal (which has a 90° lead and is proportional to the velocity of a proof mass (e.g., 102, 203, 608, 1604, 1804 (FIGS. 1, 2, 6, 16, and 18)) of the inertial device. The TDC can have programmable masking windows and edge sensitivity to enable extracting timing of specific events as depicted in FIG. 21.

Figure 21:
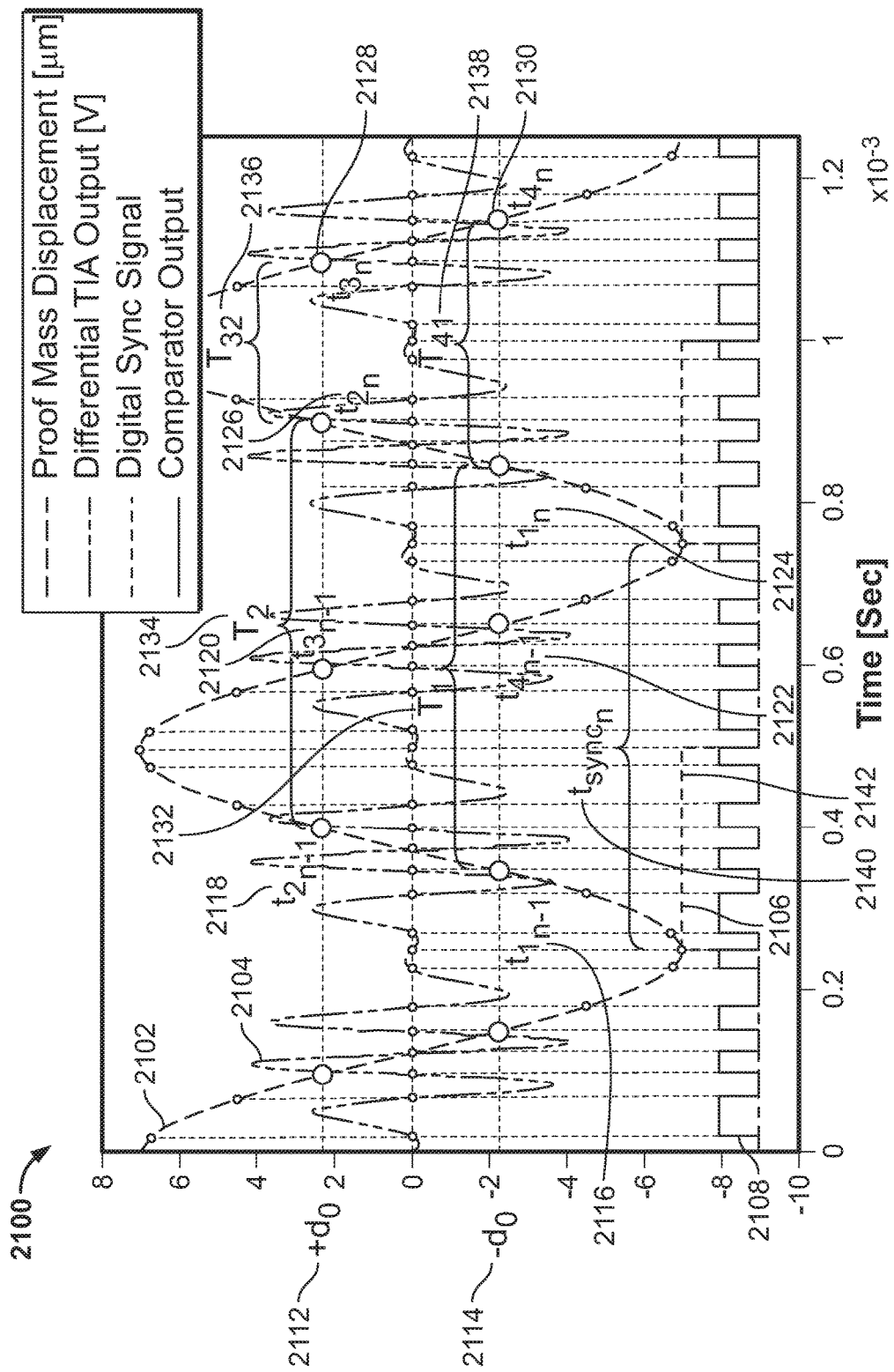
FIG. 21 depicts a graph showing various time intervals that can be extracted from a differential TIA output, according to an illustrative implementation.

FIG. 21 depicts a graph 2100 showing various time intervals that can be extracted from a differential TIA output. The graph 2100 includes a proof mass displacement curve 2102 illustrating the position of a proof mass (e.g., 102, 203, 608, 1604, 1804 (FIGS. 1, 2, 6, 16, and 18)) over time. The graph 2100 also includes a differential TIA output curve 2104 illustrating an analog output (e.g., 624, 626, 1612, 1613 (FIGS. 6 and 16)) of a TIA (e.g., 620, 1610 (FIGS. 6 and 16)) receiving an analog signal (e.g., 611, 613, 1626, 1628 (FIGS. 6 and 16)) from the proof mass. The graph 2100 also includes a comparator output curve 2108 that illustrates the digital output of a comparator (e.g., 1620 (FIG. 16)). As a digital signal, the comparator output curve 2108 consists substantially of two values: a high value and a low value. The comparator output curve 2108 transitions from a low value to a high value when the TIA output curve 2102 crosses zero and has a positive slope. The comparator output curve 2108 transitions from a high value to a low value when the TIA output curve 2014 crosses zero and has a negative slope. Thus, the comparator output curve 2108 is a digital representation of the zero-crossing times of the TIA output curve 2104.

The graph 2100 includes reference levels 2112 and 2114, each corresponding to a displacement of magnitude $d_0$, or one-half the pitch distance, of the proof mass from its neutral position. Because a displacement of magnitude $d_0$ results in a minimum in capacitance (for an in-phase TDS structure such as 1606 (FIG. 16)) or a maximum in capacitance (for an out-of-phase TDS structure such as 1608 (FIG. 16)), the spatial capacitance gradient and thus the capacitive current is zero. Thus, the TIA output curve 2104 crosses zero when the proof mass displacement curve 2102 crosses either of the reference levels 2112 or 2114. The graph 2100 includes times 2116, 2122, 2124, and 2130 at which the displacement curve 2102 crosses the reference level 2114 and times 2118, 2120, 2126, and 2128 at which the displacement curve 2102 crosses the reference level 2112. The graph 2100 also includes time intervals 2132, 2134, 2136, and 2138. The time interval $T_1$ 2132 corresponds to the time interval between the times 2116 and 2124. The time interval $T_2$ 2134 corresponds to the time interval between the times 2118 and 2126. The time interval $T_{32}$ 2136 corresponds to the time interval between the times 2126 and 2128. The time interval $T_{41}$ 2138 corresponds to the time interval between the times 2124 and 2130. The graph 2100 also includes a digital sync signal 2142. In some examples, this can be a sync signal created from a drive sync signal. The sync time interval 2140 corresponds to the time interval between adjacent rising edges of the digital sync signal 2142. The TDC (e.g., 1620 (FIG. 16)) can use the most recent rising edge of the digital sync signal 2142 as a reference for determining digital timestamps of changes in value of the comparator output signal 2108. These timestamps can be used to determine the time intervals 2132, 2134, 2136, and 2138.

In summary, the data determined per cycle includes a sync time 2140 marking the interval between the previous sync rising edge and the most recent zero-crossing times (e.g., 2116, 2118, 2120, 2122) measured with respect to the most recent rising edge of the digital sync signal 2108. One reason the sync time 2140 is useful is for establishing a relationship with past timing events so that time intervals crossing the sync boundaries (e.g., 2132, 2134) can be computed for zero-crossing and period measurements.

Equations 69-78 can be used to compute output acceleration at time n.

$$d_1 = d_4 = -d_o \quad [69]$$

$$d_2 = d_3 = +d_o \quad [70]$$

$$T_{32} = t_{3_n} - t_{2_n} \quad [71]$$

$$T_{41} = t_{4_n} - t_{1_n} \quad [72]$$

$$\delta_{41} = \delta_{32} = 0 \quad [73]$$

$$\theta_1 = \theta_4 = \omega_o \frac{T_{41}}{2} = \pi \frac{T_{41}}{T_1} \quad [74]$$

$$\theta_2 = \theta_3 = \omega_o \frac{T_{32}}{2} = \pi \frac{T_{32}}{T_2} \quad [75]$$

$$T_1 = t_{sync_n} - t_{1_{n-1}} + t_{1_n} \quad [76]$$

$$T_2 = t_{sync_n} - t_{2_{n-1}} + t_{2_n} \quad [77]$$

$$f_{avg} = \frac{1}{T_{avg}} = \frac{2}{T_1 + T_2} \quad [78]$$

Equations 69-78 can be substituted directly into equations 65 and 68 to produce measurements of displacement amplitude and output acceleration one or more times per oscillation cycle of the proof mass (e.g., 102, 203, 608, 1604, 1804 (FIGS. 1, 2, 6, 16, and 18)). A set of simultaneous equations can be written for each reference level (e.g., 2112, 2114) as shown in equations 79 and 80.

$$\Delta x \cdot \cos\left(\pi \frac{T_{32}}{T_2}\right) + \frac{\ddot{x}}{\omega_o^2} = +d_o \quad [79]$$

$$\Delta x \cdot \cos\left(\pi \frac{T_{41}}{T_1}\right) + \frac{\ddot{x}}{\omega_o^2} = -d_o \quad [80]$$

Equations 79 and 80 can be subtracted to solve for displacement amplitude at the $n^{th}$ measurement cycle as shown in equation 81.

$$\Delta x_n = \frac{2 d_o}{\cos\left(\pi \frac{T_{41}}{T_1}\right) - \cos\left(\pi \frac{T_{32}}{T_2}\right)} \quad [81]$$

Similarly, equations 79 and 80 can be added and the expression for displacement amplitude substituted to solve for input acceleration for the inertial device (e.g., 100, 202, 602, 1602, 1802 (FIGS. 1, 2, 6, 16, and 18)), scaled to units of g as shown in equation 82.

$$\ddot{x}_n = \frac{d_o (2\pi f_{avg})^2}{g} \frac{\cos\left(\pi \frac{T_{41}}{T_1}\right) + \cos\left(\pi \frac{T_{32}}{T_2}\right)}{\cos\left(\pi \frac{T_{41}}{T_1}\right) - \cos\left(\pi \frac{T_{32}}{T_2}\right)} \quad [82]$$

One reason the cosine algorithm is useful is that it is relatively insensitive to variations in the amplitude and frequency of the oscillation of the proof mass. Since the cosine algorithm rejects variations in these parameters for timescales much longer than the resonant period of the oscillation, the cosine algorithm generally has excellent drift performance.

The low-drift performance of the systems and methods described herein is significantly attributable to the fact that the timing measurements ultimately relate back to a fixed, known reference dimension (i.e., the pitch of the TDS structures such as 105, 207, 506, 604, 606, 1501, 1503, 1606, 1608, 1806, 1808 (FIGS. 1, 2, 5, 6, 15, 16, and 18)). Recalling that $d_0$ is defined as one-half the pitch, equations 81 and 82 can be rewritten as shown in equations 83 and 84 to isolate the terms involving timing measurement to a ratio that itself defines a ratio of the desired output variable to the geometrically fixed pitch of the TDS structure.

$$\frac{\Delta x_n}{\text{Pitch}} = \frac{1}{\cos\left(\pi \frac{T_{41}}{T_1}\right) - \cos\left(\pi \frac{T_{32}}{T_2}\right)} \quad [83]$$

$$\frac{\ddot{x}_n}{\text{Pitch}} = \frac{(2\pi f_{avg})^2}{2g} \frac{\cos\left(\pi \frac{T_{41}}{T_1}\right) + \cos\left(\pi \frac{T_{32}}{T_2}\right)}{\cos\left(\pi \frac{T_{41}}{T_1}\right) - \cos\left(\pi \frac{T_{32}}{T_2}\right)} \quad [84]$$

Estimating output acceleration noise performance given simulated front-end electronic noise and signal properties (i.e., the slope of the zero-crossings) can be useful for quickly evaluating candidate inertial sensor designs and iterating the design process to achieve desired performance specifications without requiring detailed, time-consuming simulations. The following illustrates a derivation of a simple equation which can be used to evaluate output noise density (g/rtHz). The derivation begins with equation 82, applies perturbation analysis by considering the measured time intervals with additive white Gaussian noise (i.e., jitter, ∈), and includes some simplifying assumptions. Equations 85-90 illustrate the addition of white Gaussian noise to equation 82.

$$\hat{T}_{32} = T_{32} + \epsilon_{32} \quad [85]$$

$$\hat{T}_{41} = T_{41} + \epsilon_{41} \quad [86]$$

$$\hat{T}_1 = T_1 + \epsilon_{P1} \quad [87]$$

$$\hat{T}_2 = T_2 + \epsilon_{P2} \quad [88]$$

$$\hat{T}_{avg} = \frac{\hat{T}_1 + \hat{T}_2}{2} \quad [89]$$

$$= \frac{T_1 + T_2}{2} + \frac{\epsilon_{T1} + \epsilon_{T2}}{2}$$

$$= T_{avg} + \bar{\epsilon}_T$$

$$\ddot{x}_n = \frac{d_o}{g} \left(\frac{2\pi}{\hat{T}_{avg}}\right)^2 \frac{\cos\left(\pi \frac{\hat{T}_{41}}{\hat{T}_1}\right) + \cos\left(\pi \frac{\hat{T}_{32}}{\hat{T}_2}\right)}{\cos\left(\pi \frac{\hat{T}_{41}}{\hat{T}_1}\right) - \cos\left(\pi \frac{\hat{T}_{32}}{\hat{T}_2}\right)} \quad [90]$$

Equation 91 is an approximation of equation 90 based noting that the noise terms of the expansion of $\hat{T}_{avg}^2$ are small compared to $T_{avg}^2$.

$$\ddot{x}_n = \frac{d_o(2\pi)^2}{g} \frac{1}{T_{avg}^2 + 2T_{avg}\epsilon_T + \epsilon_T^2} \frac{\cos\left(\pi\frac{\hat{T}_{41}}{\hat{T}_1}\right) + \cos\left(\pi\frac{\hat{T}_{32}}{\hat{T}_2}\right)}{\cos\left(\pi\frac{\hat{T}_{41}}{\hat{T}_1}\right) - \cos\left(\pi\frac{\hat{T}_{32}}{\hat{T}_2}\right)} \quad [91]$$

$$\approx \frac{d_o}{g}\left(\frac{2\pi}{T_{avg}}\right)^2 \frac{\cos\left(\pi\frac{\hat{T}_{41}}{\hat{T}_1}\right) + \cos\left(\pi\frac{\hat{T}_{32}}{\hat{T}_2}\right)}{\cos\left(\pi\frac{\hat{T}_{41}}{\hat{T}_1}\right) - \cos\left(\pi\frac{\hat{T}_{32}}{\hat{T}_2}\right)}$$

The common trigonometric sum-difference formula shown in equation 92 can be used to expand noise terms as shown in equation 93.

$$\cos(\alpha + \beta) = \cos(\alpha)\cos(\beta) - \sin(\alpha)\sin(\beta) \quad [92]$$

$$\ddot{x}_n \approx \frac{d_o}{g}\left(\frac{2\pi}{T_{avg}}\right)^2 \frac{\begin{array}{l}\cos\left(\pi\frac{T_{41}}{T_1+\epsilon_{T1}}\right)\cos\left(\pi\frac{\epsilon_{41}}{T_1+\epsilon_{T1}}\right) - \\ \sin\left(\pi\frac{T_{41}}{T_1+\epsilon_{T1}}\right)\sin\left(\pi\frac{\epsilon_{41}}{T_1+\epsilon_{T1}}\right) + \\ \cos\left(\pi\frac{T_{32}}{T_2+\epsilon_{T2}}\right)\cos\left(\pi\frac{\epsilon_{32}}{T_2+\epsilon_{T2}}\right) - \\ \sin\left(\pi\frac{T_{32}}{T_2+\epsilon_{T2}}\right)\sin\left(\pi\frac{\epsilon_{32}}{T_2+\epsilon_{T2}}\right)\end{array}}{\begin{array}{l}\cos\left(\pi\frac{T_{41}}{T_1+\epsilon_{T1}}\right)\cos\left(\pi\frac{\epsilon_{41}}{T_1+\epsilon_{T1}}\right) - \\ \sin\left(\pi\frac{T_{41}}{T_1+\epsilon_{T1}}\right)\sin\left(\pi\frac{\epsilon_{41}}{T_1+\epsilon_{T1}}\right) - \\ \cos\left(\pi\frac{T_{32}}{T_2+\epsilon_{T2}}\right)\cos\left(\pi\frac{\epsilon_{32}}{T_2+\epsilon_{T2}}\right) + \\ \sin\left(\pi\frac{T_{32}}{T_2+\epsilon_{T2}}\right)\sin\left(\pi\frac{\epsilon_{32}}{T_2+\epsilon_{T2}}\right)\end{array}} \quad [93]$$

The cosine terms involving the timing jitter ($\epsilon$) are small with zero mean so the small-angle approximation can be applied as shown in equation 94.

$$\ddot{x}_n \approx \frac{d_o}{g}\left(\frac{2\pi}{\hat{T}_{avg}}\right)^2 \frac{\begin{array}{l}\cos\left(\pi\frac{T_{41}}{T_1+\epsilon_{T1}}\right)\cos\left(\pi\frac{\epsilon_{41}}{T_1+\epsilon_{T1}}\right) - \\ \sin\left(\pi\frac{T_{41}}{T_1+\epsilon_{T1}}\right)\sin\left(\pi\frac{\epsilon_{41}}{T_1+\epsilon_{T1}}\right) + \\ \cos\left(\pi\frac{T_{32}}{T_2+\bar{\epsilon}_{T2}}\right)\cos\left(\pi\frac{\epsilon_{32}}{T_2+\epsilon_{T2}}\right) - \\ \sin\left(\pi\frac{T_{32}}{T_2+\bar{\epsilon}_{T2}}\right)\sin\left(\pi\frac{\epsilon_{32}}{T_2+\epsilon_{T2}}\right)\end{array}}{\begin{array}{l}\cos\left(\pi\frac{T_{41}}{T_1+\epsilon_{T1}}\right)\cos\left(\pi\frac{\epsilon_{41}}{T_1+\epsilon_{T1}}\right) - \\ \sin\left(\pi\frac{T_{41}}{T_1+\epsilon_{T1}}\right)\sin\left(\pi\frac{\epsilon_{41}}{T_1+\epsilon_{T1}}\right) - \\ \cos\left(\pi\frac{T_{32}}{T_2+\epsilon_{T2}}\right)\cos\left(\pi\frac{\epsilon_{32}}{T_2+\epsilon_{T2}}\right) + \\ \sin\left(\pi\frac{T_{32}}{T_2+\epsilon_{T2}}\right)\sin\left(\pi\frac{\epsilon_{32}}{T_2+\epsilon_{T2}}\right)\end{array}} \quad [94]$$

The cosine terms involving the timing jitter ($\epsilon$) are small with zero mean so the small-angle approximation can once again be applied. The multiplicative sine terms involving the measured periods ($T_{41}$ and $T_{32}$) are, at their largest, bounded by $\pm 1$. This will be a convenient consideration when examining the variance of $\ddot{x}_n$, and this also causes the noise estimation to be somewhat conservative. Because the period measurements and the denominator of each sinusoidal argument are much larger than the noise, the noise term here can be ignored. Furthermore, the resulting noise terms in denominator are negligible compared to the cosine terms. Applying all of these approximations to equation 94, the individual terms of the resulting expression can be collected into two main terms as shown in equation 95, one representing the approximate expected value of the output acceleration (left term), and the other containing noise error components (right term).

$$\ddot{x}_n \approx \frac{d_o}{g}\left(\frac{2\pi}{T_{avg}}\right)^2 \frac{\cos\left(\pi\frac{T_{41}}{T_1}\right) - \cos\left(\pi\frac{T_{32}}{T_2}\right)}{\cos\left(\pi\frac{T_{41}}{T_1}\right) - \cos\left(\pi\frac{T_{32}}{T_2}\right)} + \quad [95]$$

$$\frac{d_o}{g}\left(\frac{2\pi}{T_{avg}}\right)^2 \frac{\pi\frac{\epsilon_{41}}{T_1} + \pi\frac{\epsilon_{32}}{T_2}}{\cos\left(\pi\frac{T_{41}}{T_1}\right) - \cos\left(\pi\frac{T_{32}}{T_2}\right)} = \overline{\ddot{x}}_n + \text{noise}$$

The cosine terms in the denominator of the noise portion of equation 95 can be replaced with the expression in equation 96 involving the displacement amplitude to result in equation 97.

$$\frac{1}{\cos\left(\pi\frac{T_{41}}{T_1}\right) - \cos\left(\pi\frac{T_{32}}{T_2}\right)} = \frac{\Delta x_n}{2d_o} \quad [96]$$

$$\ddot{x}_n \approx \overline{\ddot{x}}_n + \frac{d_o}{g}\left(\frac{2\pi}{T_{avg}}\right)^2 \frac{\pi\frac{\epsilon_{41}}{T_1} + \pi\frac{\epsilon_{32}}{T_2}}{\cos\left(\pi\frac{T_{41}}{T_1}\right) - \cos\left(\pi\frac{T_{32}}{T_2}\right)} \quad [97]$$

$$= \overline{\ddot{x}}_n + \frac{\Delta x_n}{2g}\left(\frac{2\pi}{T_{avg}}\right)^2 \left(\pi\frac{\epsilon_{41}}{T_1} + \pi\frac{\epsilon_{32}}{T_2}\right)$$

Another simplification can be made because $T_{avg}$, $T_1$, and $T_2$ are approximately equal, as shown in equation 98.

$$\ddot{x}_n \approx \overline{\ddot{x}}_n + \frac{\Delta x_n}{4g}\left(\frac{2\pi}{T_{avg}}\right)^2 (\epsilon_{41} + \epsilon_{32}) \quad [98]$$

Taking the variance of $\ddot{x}_n$ allows the computation of total noise power (note: $\omega_o = 2\pi/T_{avg}$) as shown in equation 99.

$$\sigma_{\ddot{x}_n}^2 \approx E\left[\left(\frac{\Delta x_n}{4g}\omega_o^3(\epsilon_{41} + \epsilon_{32})\right)^2\right][g_{RMS}^2] \quad [99]$$

The jitter properties associated with individual time measurements ($t_1$, $t_2$, $t_3$, $t_4$) are assumed to be uncorrelated. As a consequence the measured interval timing jitter ($\epsilon_{41}$ and $\epsilon_{32}$) is also uncorrelated. Further, it is assumed that the jitter variance of each timing event is identical ($\sigma_{t1} = \sigma_{t2} = \ldots = \sigma_t$, this is approximately true and sufficient for a noise estimation) as shown in equation 100. Using these arguments we conclude, $\sigma_{\epsilon_{41}} = \sigma_{\epsilon_{32}} = \sigma_\epsilon = \sqrt{2}\sigma_t$.

$$\sigma_{\ddot{x}_n} \approx 0.85\frac{\Delta x_n}{4g}\omega_o^3\sqrt{2}\,\sigma_\epsilon = 0.85\frac{\Delta x_n}{2g}\omega_o^3\sigma_t[g_{RMS}] \quad [100]$$

The final noise equation, illustrated in equation 100, includes the product of displacement magnitude ($\Delta x_n$ [m]), the cube of the resonance frequency ($\omega_0^3$ [rad$^3$/sec$^3$]), and the timing event jitter ($\sigma_t$ [sec$_{RMS}$]). The additional factor of 0.85 is an empirical factor that calibrates the estimation with both laboratory and detailed simulation results.

Edge timing jitter ($\sigma_t$) can be readily estimated from the total integrated electronics noise divided by the signal slope at the zero-crossing event. Simulations may be used to provide values for the electronic noise and signal slew rate. Differential or single-ended noise and slews may be used as long as the consistency is observed. TDC timing uncertainty may also be included by root-sum-squaring with the electronics induced jitter as shown in equation 101.

$$\sigma_t = \frac{\text{Total Integrated Electronics Noise}[V_{RMS}]}{\text{Slope at Zero Crossing}[V/sec]} [sec_{RMS}] \quad [101]$$

The one-sided TDS output acceleration noise density may be estimated using equation 100 and dividing the results by the square-root of the sensor bandwidth (i.e., Nyquist sampling rate=Bandwidth=$f_o/2$), giving equation 102. When using the double-sampled TDS cosine algorithm, where one applies the cosine algorithm once for the positive and once for the negative half of the resonant period (thus producing two samples each cycle), one should substitute twice the bandwidth (i.e., bandwidth=$f_o$). Equation 102 can be used for noise performance estimation and compares well with experimental results.

$$\eta_{\hat{x}_n} \approx \frac{0.85 \frac{\Delta x_n}{2g} \omega_o^3 \sigma_t}{\sqrt{\text{Bandwidth}}} \left[\frac{g_{RMS}}{\sqrt{\text{Hz}}}\right] \quad [102]$$

In some examples, an ADC may be used to convert analog outputs (e.g., 626, 1615, 1617, 1815, 1817 (FIGS. 6, 16, and 18)) of AFE's (e.g., 616) such as charge amplifiers (e.g., 618, 1810 (FIGS. 6 and 18)) or transimpedance amplifiers (e.g., 620, 1610 (FIGS. 6 and 16)) to digital representations (e.g., 635 (FIG. 6)). The digital representations (e.g., 635 (FIG. 6)) can be received by digital circuitry that can determine timestamps of threshold crossings and can implement the cosine algorithm of equations 81 and 82 to determine inertial parameters (e.g., acceleration and proof mass displacement) of the inertial device (e.g., 100, 202, 602, 1602, 1802 (FIGS. 1, 2, 6, 16, and 18)).

Figure 22:
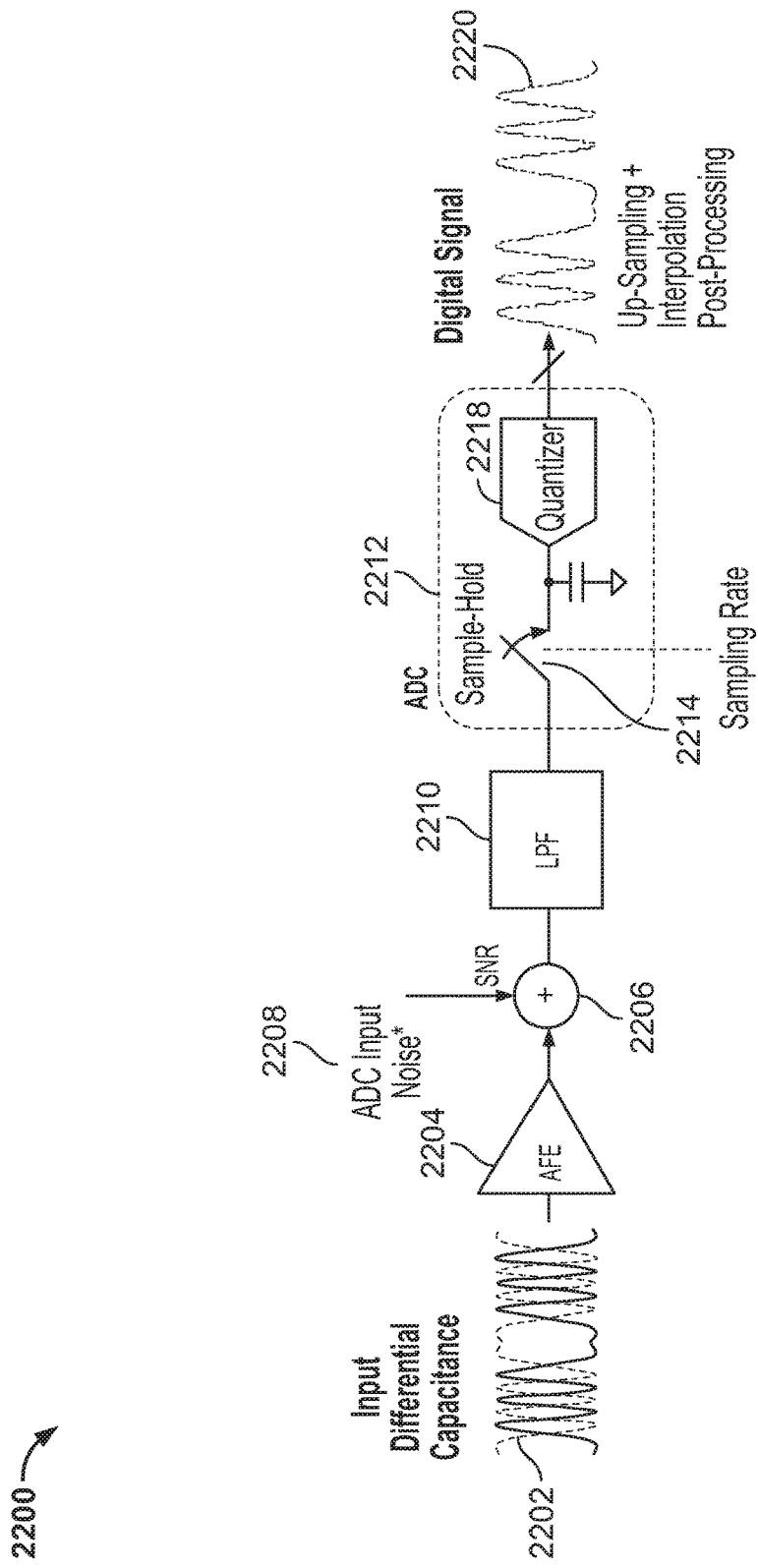
FIG. 22 depicts a summing block illustrating signal flows for using an analog-to-digital converter (ADC) to digitally reproduce an analog input signal, according to an illustrative implementation.

FIG. 22 depicts a summing block 2200 illustrating signal flows for using an ADC to digitally reproduce an analog input signal. The summing block 2200 includes input differential capacitance signals 2202 that can be received from differential TDS structures (e.g., 105, 207, 506, 604, 606, 1501, 1503, 1606, 1608, 1806, 1808 (FIGS. 1, 2, 5, 6, 15, 16, and 18)). The input differential capacitance signals 2202 can be signals such as any of the signals 1611, 1613, 1626, 1628, 1826, 1828 (FIGS. 16 and 18). The differential capacitance signals 2202 are received by an AFE 2204. The AFE 2204 can be a charge amplifier or transimpedance amplifier. The ADC 2204 introduces ADC input noise 2208, the injection of which is schematically represented by the summing block 2206. The output of the summing block 2206 is received by a low-pass filter 2210 which removes higher frequency components of the signal. The output of the low-pass filter 2210 is received by an ADC 2212. The ADC 2212 performs sample-and-hold 2214 at a sampling rate of 400 kS/sec. The ADC 2212 also includes a quantizer 2218. The ADC 2212 produces a digital output signal 2220 that is a digital representation of the difference between the input differential capacitor signals 2202. Digital circuitry can receive the digital signal 2220 and perform upsampling, interpolation, and further post-processing to determine inertial parameters.

The digital circuitry receiving the digital signal 2220 can extract inertial information using one or more of interpolation, trigonometric functions, and inverse trigonometric functions. An example of a trigonometric function that the digital circuitry can implement is the cosine function. Examples of inverse trigonometric functions that the digital circuitry can implement include the arcsine, arccosine, and arctangent functions.

Interpolation can be used to improve the timing accuracy of threshold crossing times of the digital signal 2220 measured by the digital circuitry. The digital circuitry can interpolate and upsample the digital signal 2220 to produce a higher-resolution indication of threshold crossing by the digital signal 2220. The interpolation can include linear interpolation and/or splined interpolation.

The digital circuitry can use a sync signal that is derived from a drive signal or a drive sense signal to synchronize measured threshold crossings with known positions of the proof mass (e.g., 102, 203, 608, 1604, 1804 (FIGS. 1, 2, 6, 16, and 18)). Because the sync signal is derived from the drive or the drive sense signal, there is a known phase relationship between the sync signal and the position of the proof mass. In some examples, the drive signal is 90° out-of-phase with respect to the proof mass motion, and a phase lead or lag can be applied as necessary to properly align the sync signal. In some examples, the sync signal is not required to be exactly aligned to the digital signal (e.g., 2220). The required alignment accuracy is related to the time between zero crossings of the digital signal (e.g., 2220). As long as the sync signal is sufficiently aligned to fall within the correct interval between zero-crossings of the digitized signal, the position of the proof mass within its oscillation can be determined with sufficient accuracy.

The digital circuitry can use a cosine function to determine displacement and/or acceleration as follows. The digital circuitry can determine threshold crossings of the interpolated and upsampled digital signal 2220. The digital circuitry can then determine time intervals between the threshold crossings, and can determine quantities containing ratios of the time intervals. The digital circuitry can then determine results of cosine functions of these quantities, as illustrated in equations 81 and 82. The digital circuitry can implement the cosine method as described with reference to FIGS. 1-21, except that the threshold crossings can be detected by the digital circuitry instead of by a comparator and TDC.

The digital circuitry can use an inverse trigonometric function to determine displacement of the proof mass (e.g., 102, 203, 608, 1604, 1804 (FIGS. 1, 2, 6, 16, and 18)) as follows. The digital circuitry can apply a trigonometric function or other periodic function to a quantity comprising a ratio of the proof mass displacement to the periodicity of the teeth of a TDS structure (e.g., 105, 207, 506, 604, 606, 1501, 1503, 1606, 1608, 1806, 1808 (FIGS. 1, 2, 5, 6, 15, 16, and 18)). The periodicity of the teeth can be the pitch of the arrays of the teeth. By determining an inverse of the determined trigonometric function, the digital circuitry can extract the ratio of the displacement to the periodicity. Because the periodicity is a known constant that is determined during fabrication of inertial device, subsequent determination of the inertial parameters can be obtained by multiplying the extracted ratio by the periodicity. The periodic function need not be a trigonometric function; for non-trigonometric functions, an appropriate inverse function is used. In general, the digital circuitry can extract a ratio of the displacement of the proof mass (e.g., 102, 203, 608, 1604, 1804 (FIGS. 1, 2, 6, 16, and 18)) to any physical position or dimension, and the function does not need to be periodic. When the function is periodic, the ratio of displacement to periodicity is proportional to the phase of the periodic function. Changes in displacement induced by accelerations of the inertial device (e.g., 100, 202, 602, 1602, 1802 (FIGS. 1, 2, 6, 16, and 18)) will result in phase shifts of the periodic function.

Figure 23:
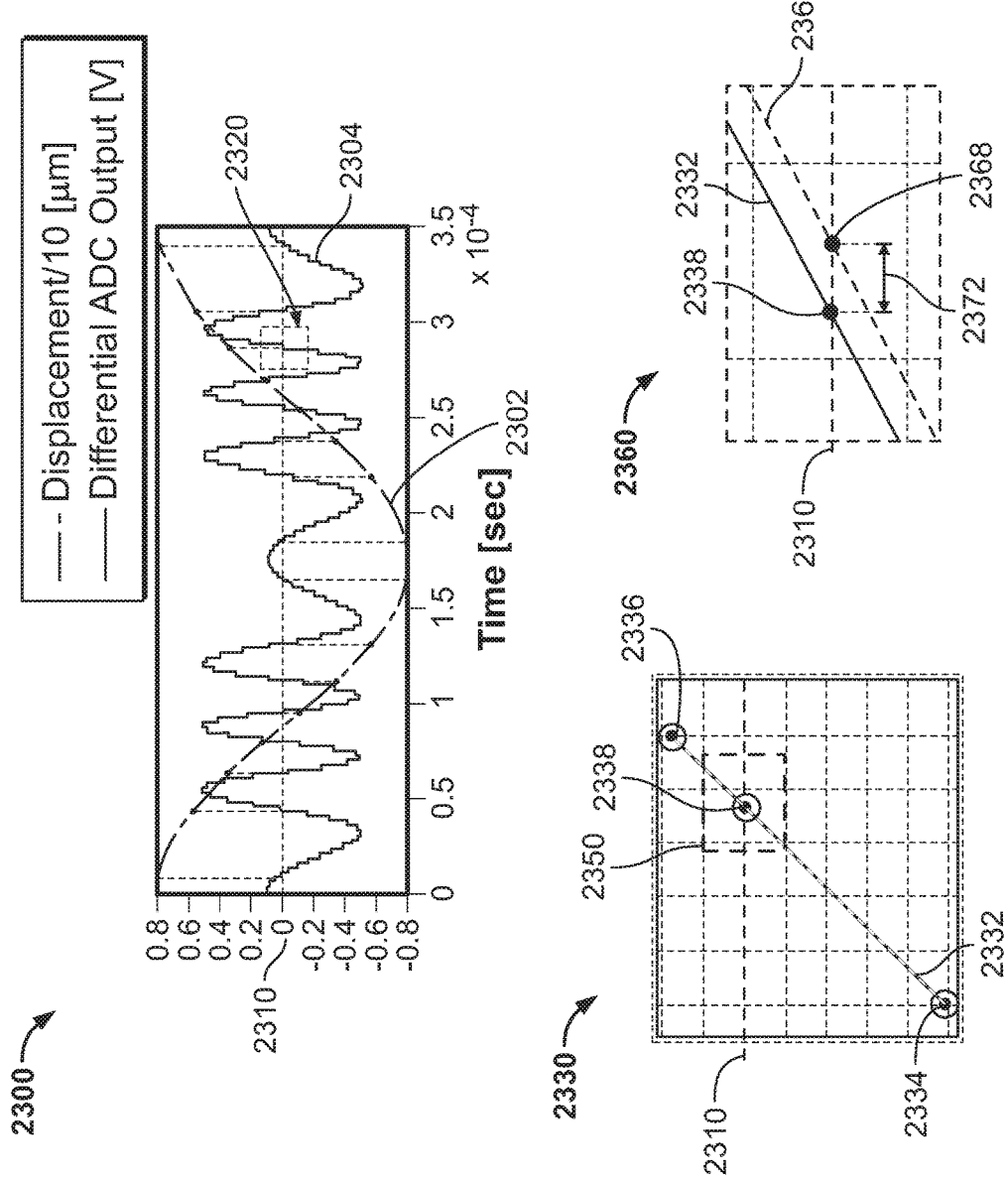
FIG. 23 depicts the use of linear interpolation to determine zero crossings of a digitized signal, according to an illustrative implementation.

FIG. 23 depicts the use of linear interpolation to determine zero crossings of a digitized signal (e.g., 2220 (FIG. 22)). FIG. 23 includes three views 2300, 2330, and 2360, each depicting successively enlarged views of a threshold crossing. The view 2300 includes a displacement curve 2302 depicting the motion of a proof mass (e.g., 102, 203, 608, 1604, 1804 (FIGS. 1, 2, 6, 16, and 18)) and a differential ADC output curve 2304, which can be the digital signal 2220. The view 2300 also includes a threshold 2310 which, in this example, occurs at the 0 V level, and an area of interest 2320 in which the ADC output curve 2304 crosses the threshold 2310. However, the measurement of the time at which the ADC output curve 2304 crosses the threshold 2310 is limited by the time resolution of the ADC unless further processing is performed. Without further processing, all that can be determined is that the ADC output curve 2304 crossed the threshold 2310 at some time between two samples of the ADC.

The view 2330 is an enlarged view of the area of interest 2320 and depicts the use of interpolation to improve the resolution of the zero-crossing time measurement. The view 2330 includes points 2334 and 2336, which are points sampled by the ADC and are thus points on the ADC output curve 2304. The point 2334 is below the threshold 2310, while the point 2336 is above the threshold 2310. Thus, the ADC output curve 2304 crossed the threshold 2310 sometime between point 2334 and point 2336. With the time and voltage values of the points 2334 and 2336 known, linear interpolation can be performed to determine the time at which a straight line 2332 drawn between the points 2334 and 2336 would intersect the threshold 2310. In some examples, splined or polynomial interpolation is performed to determine the time at which a curved line drawn between the points 2334 and 2336 would intersect the threshold 2310. This intersection is illustrated in the view 2330 by a point 2338. The point 2338 is the digitally interpolated estimate of the threshold crossing time of the analog signal represented by the digital ADC output curve 2304. The view 2330 also includes an area of interest 2350 centered on the point 2338.

The view 2360 is an enlarged view of the area of interest 2350 and depicts the error incurred by digital interpolation. The view 2336 includes the curve 2364 which is the analog signal represented by the ADC output curve 2304. The analog curve 2334 crosses the threshold 2310 at a true crossing point 2368. The time interval between the digitally estimated point 2338 and the true crossing point 2368 is represented by time interval 2372. The time interval 2372 is thus the error of the timing measurement obtained by digital interpolation. Because the time interval 2372 is smaller than the sampling rate of the ADC, the interpolation has improved the accuracy and resolution of the threshold crossing time measurements.

Figure 24:
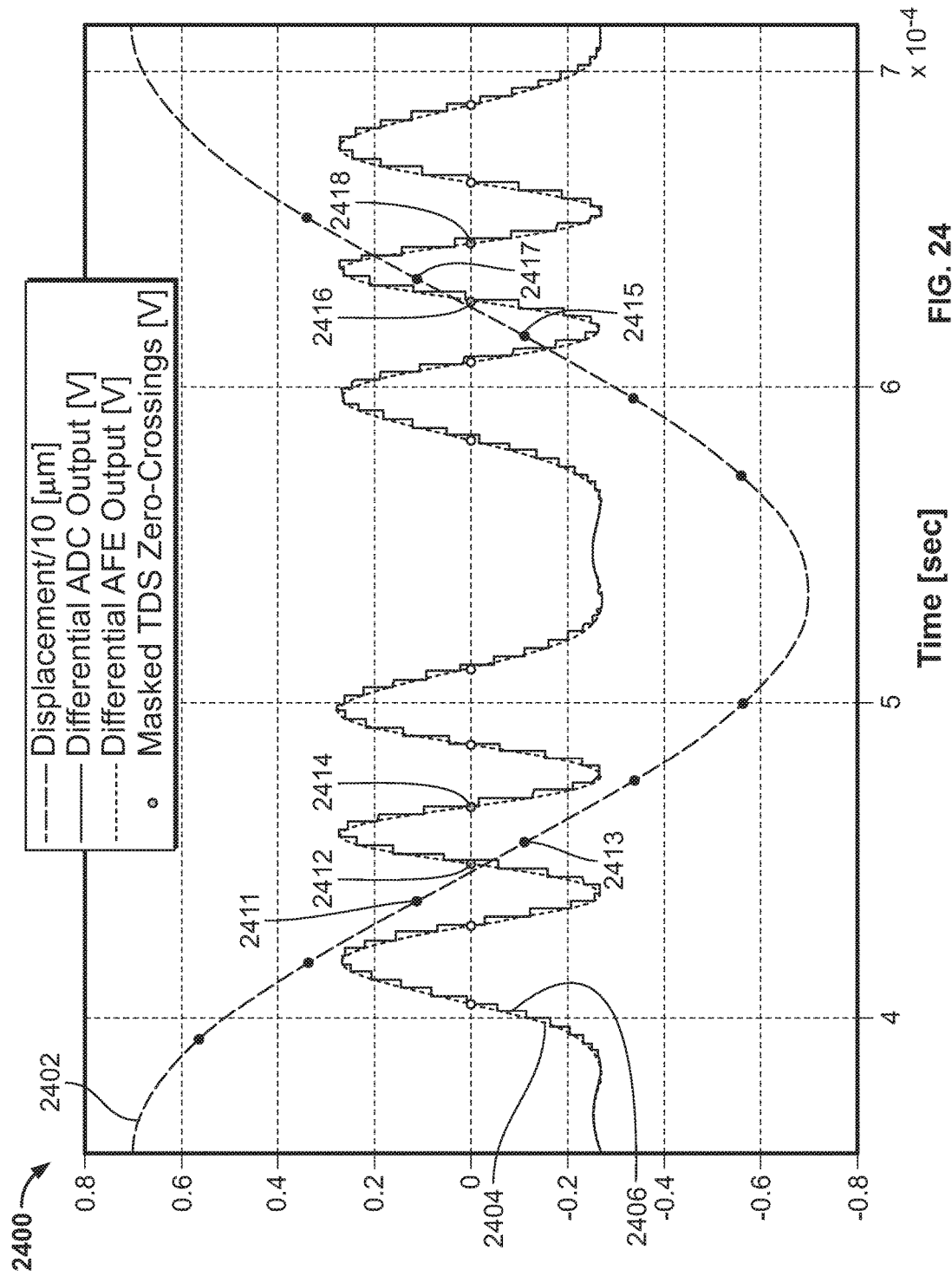
FIG. 24 depicts a graph illustrating zero-crossings of an ADC digital output signal, according to an illustrative implementation.

FIG. 24 depicts a graph 2400 illustrating zero-crossings of an ADC digital output signal. The graph 2400 includes a displacement curve 2402 representing displacement of a proof mass (e.g., 102, 203, 608, 1604, 1804 (FIGS. 1, 2, 6, 16, and 18)) of an inertial device (e.g., 100, 202, 602, 1602, 1802 (FIGS. 1, 2, 6, 16, and 18)). The graph 2400 includes a differential AFE output curve 2404 that represents an output of an AFE (e.g., 626 (FIG. 6)). The graph 2400 also includes an ADC output curve 2404 representing a digital output (e.g., 2220 (FIG. 22)) of an ADC (e.g., 2212 (FIG. 22)). The ADC output curve 2406 is a digital representation of the AFE output curve 2404. The graph 2400 depicts points 2411, 2413, 2415, and 2417 on the displacement curve 2402 that correspond to times at which the proof mass crosses reference points that are multiples of $d_0$ from the neutral position. The differential AFE output curve 2404 includes points 2412, 2414, 2416, and 2418 that are threshold crossings corresponding to the points 2411, 2413, 2415, and 2417, but with a time delay. The time delay is imposed by analog band-limiting filtering.

Figure 25:
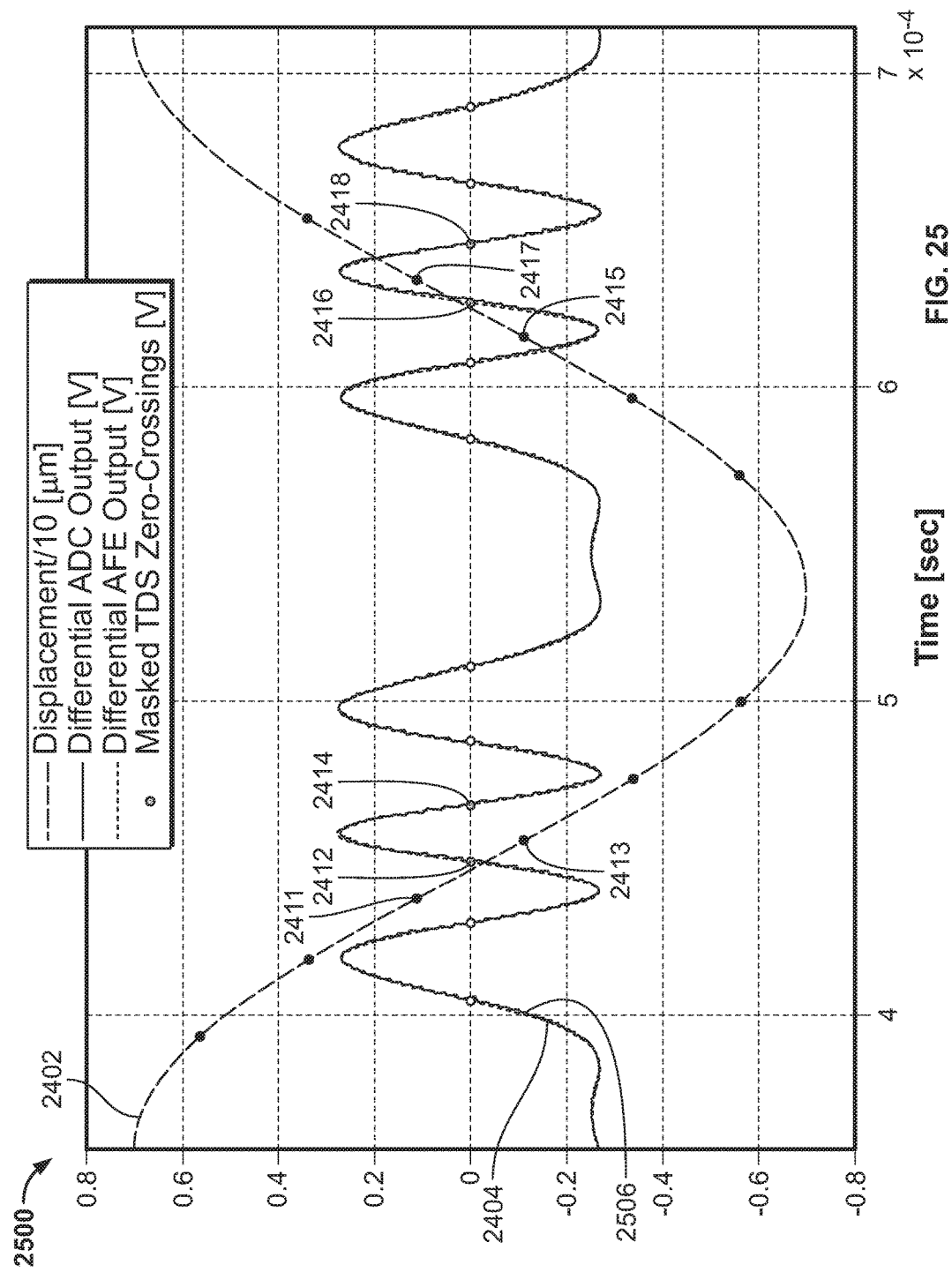
FIG. 25 depicts a graph that shows an upsampled AFE output curve, according to an illustrative implementation.

FIG. 25 depicts a graph 2500 that shows an upsampled AFE output curve. The graph 2500 includes the displacement curve 2402 (FIG. 24), the differential AFE output curve 2404 (FIG. 24), and the points 2411, 2413, 2415, and 2417 (FIG. 24). The graph 2500 also includes an upsampled AFE output curve 2506. The output curve 2506 has been upsampled to a sampling rate triple that of the AFE output curve 2406 (FIG. 24). The upsampled output curve 2506 has a lower timing uncertainty in zero-crossing measurements, which results in better timing resolution. Digital upsampling and interpolation can eliminate spurious artifacts for a given input noise level and can provide better agreement between the ADC output curve 2506 and the AFE output curve 2404.

Digital interpolation and zero-crossing detection in the digital domain can result in performance equivalent to analog zero-crossing detection. As described herein, digital interpolation, upsampling, and filtering a band-limited input signal can produce a higher-resolution rendition of the original input signal. This improves the accuracy of subsequent digital zero-crossing detection. In digital zero-crossing detection, digital circuitry detects when a digital signal crosses zero and applies local linear interpolation to determine a precise crossing time. In some examples, the digital circuitry may apply hysteresis to reduce the effects of signal noise at the decision boundaries. These digital systems and methods can result in accuracy at least as high as analog zero-crossing systems and methods.

The arccosine algorithm and the arcsine algorithm can be used by digital processing circuitry to determine displacement information from a periodic nonlinear signal. Both the arccosine algorithm and the arcsine algorithm operate on the output of an ADC. The difference between the arccosine and arcsine algorithms is that the arccosine algorithm is implemented on signals generated by arrays of teeth that have opposing teeth that are aligned in the neutral position, while the arcsine algorithm is implemented on analog signals generated by arrays of teeth that have teeth that are offset by one-fourth of the tooth pitch (or a spatial phase shift of 90°) at the neutral position.

In some examples, the arccosine algorithm can be implemented using arrays of teeth designed for the arcsine algorithm by including a 90° spatial phase shift. Conversely, the arcsine algorithm can operate on signals generated by arrays of teeth designed for the arccosine algorithm by including a 90° spatial phase shift. Signals generated by arrays of teeth with arbitrary offsets in the neutral position can also be operated on by either the arccosine or the arcsine algorithm by including an appropriate spatial phase shift corresponding to the offset. For teeth that are offset by a phase $\varphi$ in the neutral position, the orthogonal capacitance signals can be described by equations 103-105.

$$C_I(t) \approx A \cos\left(\frac{2\pi}{P}x(t) + \varphi\right) \quad [103]$$

$$C_Q(t) \approx A \sin\left(\frac{2\pi}{P}x(t) + \varphi\right) \quad [104]$$

$$\frac{C_Q(t)}{C_I(t)} \approx \tan\left(\frac{2\pi}{P}x(t) + \varphi\right) \quad [105]$$

Where displacement is described by equation 106, the offset phase $\varphi$ can also be expressed as an effective offset to x(t) as shown in equation 107.

$$x(t) = A\sin(w_0 t) + x_{Inertial}(t) \quad [106]$$

$$C_I(t) \approx A \cos\left(\frac{2\pi}{P}(x(t) + x_0)\right) \quad [107]$$

The quantity $x_0$ is defined by equation 108.

$$x_0 = \varphi\frac{P}{2\pi} \quad [108]$$

The arccosine and arcsine algorithms can be implemented using only one of the two signals $C_I$ and $C_Q$. Thus, by measuring $C_I(t)$, scaling, applying the arccosine function, applying the known phase offset $\varphi$, and scaling by the pitch, the proof mass displacement x(t) can be determined by the arccosine algorithm using equation 103. Similarly, the arcsine algorithm can be implemented according to equation 104 by measuring $C_Q(t)$, scaling, applying the arcsine function, adjusting by the phase offset $\varphi$, and scaling by the pitch to determine x(t).

The arctangent algorithm can be used as well to determine displacement. The arctangent algorithm can be implemented according to equation 105, by measuring the ratio of the capacitances $C_Q$ and $C_I$, applying the arctangent function, scaling by the phase offset $\varphi$, and scaling by the pitch P to determine x(t). The arcsine algorithm and the arccosine algorithm can be implemented using only one of the signals $C_I$ and $C_Q$. In contrast, the arctangent algorithm uses both signals $C_I$ and $C_Q$. Equations 103-105 are written assuming that $C_I$ and $C_Q$ are 90° apart. In general, however, the two signals may have an arbitrary phase difference $\varphi$. In this general case, the two signals can be represented as shown in equations 109-112.

$$C_1(t) \approx A \cos\left(\frac{2\pi}{P}x(t)\right) \quad [109]$$

$$C_2(t) \approx A \cos\left(\frac{2\pi}{P}x(t) + \varphi\right) \quad [110]$$

$$= A\left(\cos\left(\frac{2\pi}{P}x(t)\right)\cos(\varphi) - \sin\left(\frac{2\pi}{P}x(t)\right)\sin(\varphi)\right) \quad [111]$$

$$\frac{C_2(t)}{C_1(t)} = \cos(\varphi) - \tan\left(\frac{2\pi}{P}x(t)\right)\sin(\varphi) \quad [112]$$

The phase offset $\varphi$ is arbitrary but fixed, so that the terms $\cos(\varphi)$ and $\sin(\varphi)$ are fixed constants, and the inverse tangent of the remaining term, $\tan(2\pi x(t)/P)$, can be determined using the arctangent algorithm as described above.

Figure 26:
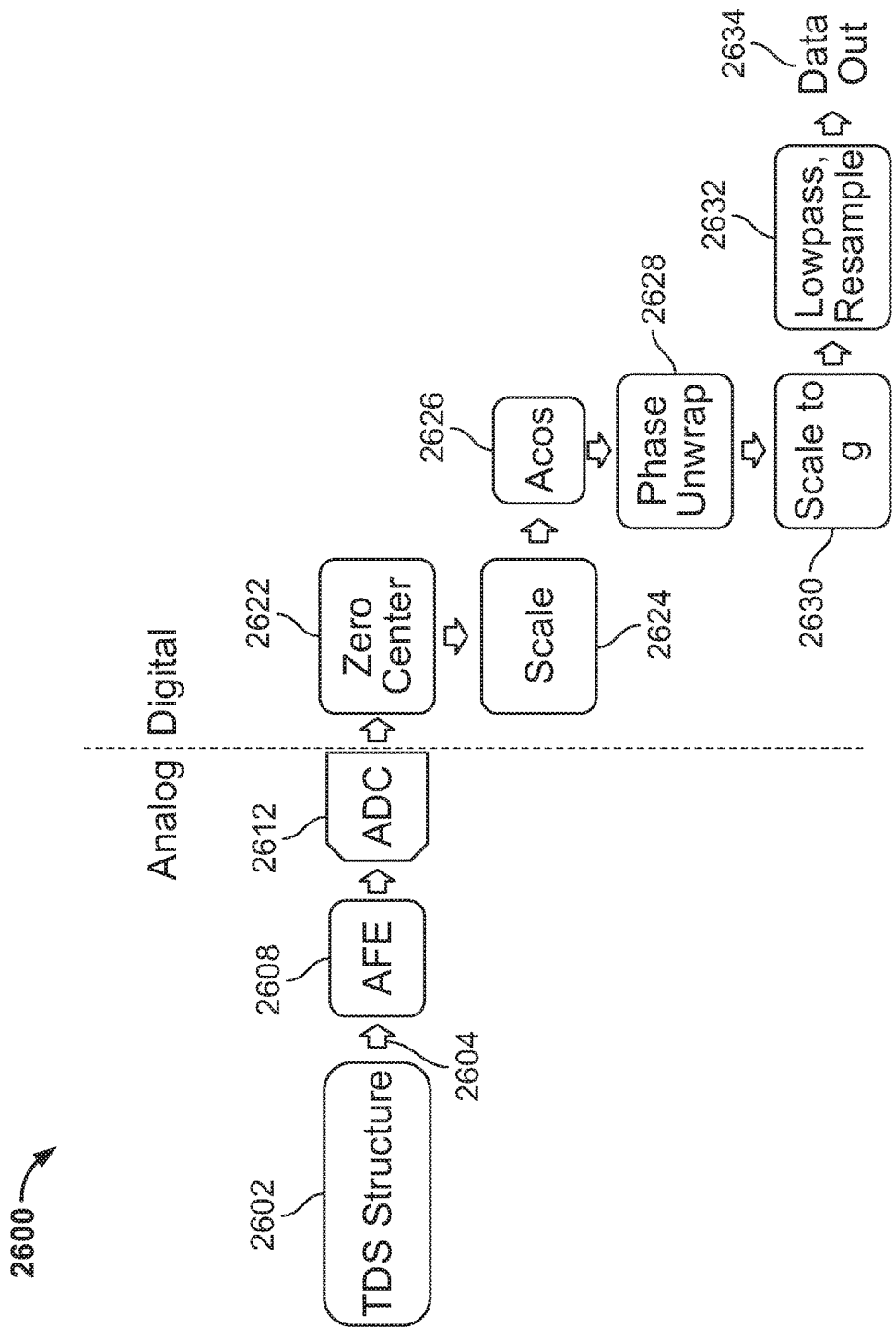
FIG. 26 depicts a block diagram illustrating signal flows of the arccosine algorithm, according to an illustrative implementation.

FIG. 26 depicts a block diagram 2600 illustrating signal flows of the arccosine algorithm. The block diagram 2600 includes a TDS structure 2602 (e.g., any of TDS structures 105, 207, 506, 604, 606, 1501, 1503, 1606, 1608, 1806, 1808 (FIGS. 1, 2, 5, 6, 15, 16, and 18)) that generates an analog output signal 2604 (e.g., any of analog output signals 611, 613, 1626, 1628, 1826, and 1828 (FIGS. 6, 16, and 18)). An AFE 2608 receives the analog output signal 2604. The AFE 2608 can be a charge amplifier (e.g., 618, 1810 (FIGS. 6 and 18)) or a transimpedance amplifier (e.g., 620, 712, 806, 908, 1610 (FIGS. 6, 7, 8, 9, and 16)). An ADC 2612 receives the output of the AFE 2608 and generates a digital output signal. The digital output of the ADC 2612 is received by digital circuitry 2622 that performs zero centering, or offsetting. This zero centering, or offsetting, can include integrating the digital output of the ADC 2612 over a predetermined time interval to determine an integral. The integral corresponds to the mean value over the predetermined time interval. In some examples, the predetermined time interval can be a period of oscillation of a proof mass (e.g., 102, 203, 608, 1604, 1804 (FIGS. 1, 2, 6, 16, and 18)). The zero centering can then include subtracting the integral from the digital output of the ADC 2612.

The output of the digital circuitry 2622 is received by digital circuitry 2624 that scales the received signal, which can include scaling by the quantity A of equations 103-105. Together, the digital circuitry 2622 and 2624 condition the digital output of the ADC 2612. The conditioned digital signal generated by digital circuitry 2624 is received by digital circuitry 2626 that implements an arccosine function to trigonometrically invert the conditioned digital signal. Implementing the arccosine function can include using a lookup table to determine a table entry corresponding to the conditioned digital signal.

Figure 31:
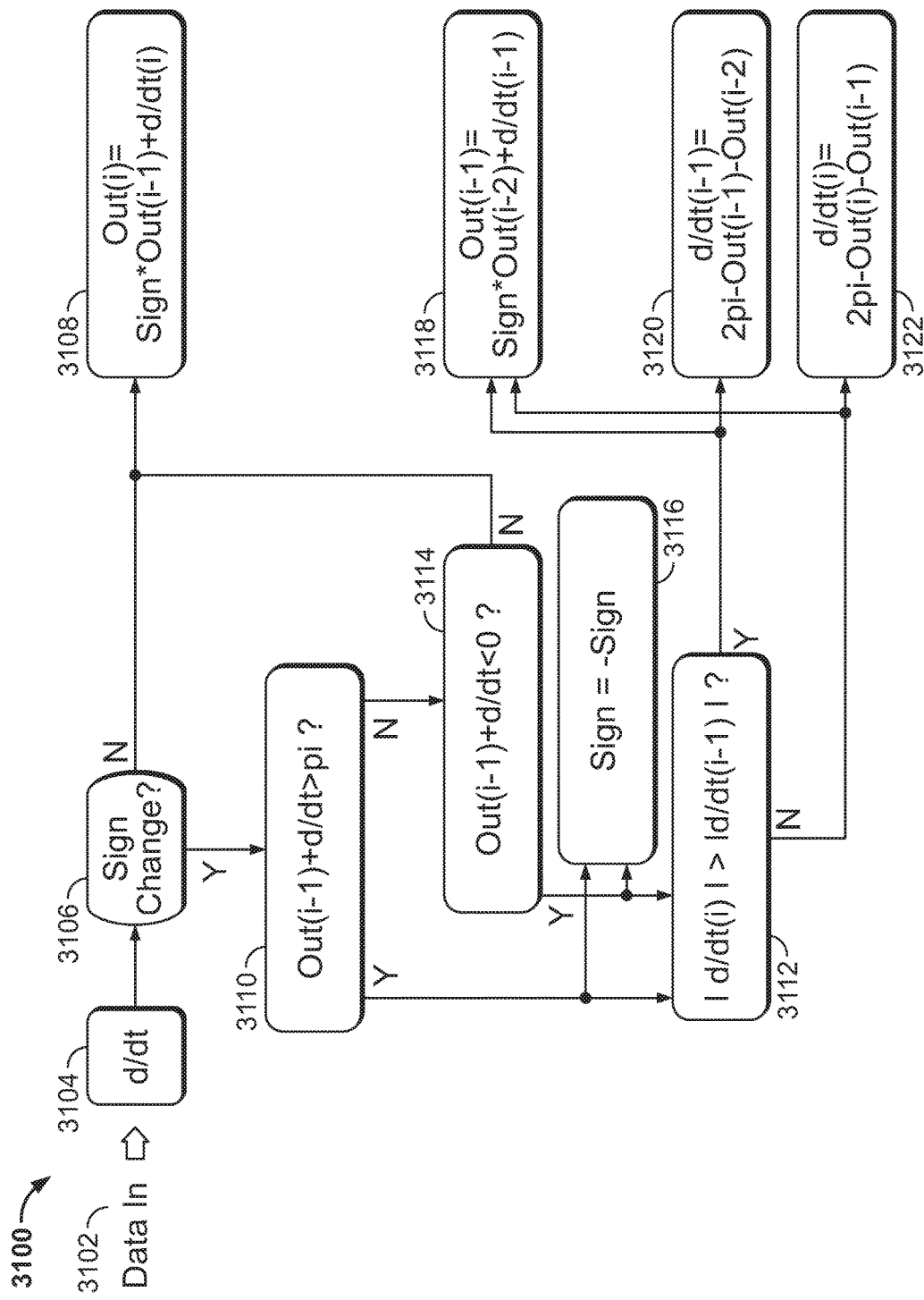
FIG. 31 depicts a method illustrating phase unwrapping in the arccosine and arcsine algorithms, according to an illustrative implementation.

The output of the arccosine digital circuitry 2626 is received by phase unwrap digital circuitry 2628. The phase unwrap circuitry 2628 determines if a phase jump has occurred and adjusts the digital signal appropriately. Further details of the phase unwrap circuitry are depicted in FIG. 31. The phase unwrap circuitry can adjust the digital signal by the phase offset $\varphi$ as shown in equations 103-105. The output of the phase unwrap circuitry 2628 is received by scaling circuitry 2630. The scaling circuitry 2630 scales the digital signal such that it corresponds to acceleration in units of g. The scaled output of the scaling circuitry 2630 is received by signal conditioning circuitry 2632 that performs low-pass filtering and resampling to generate output inertial data 2634. The signal conditioning circuitry 2632 can also perform multiplication by a geometric dimension. The geometric dimension can be a pitch of the TDS structure 2602. The output inertial data 2634 corresponds to an acceleration of the inertial device (e.g., 100, 202, 602, 1602, 1802 (FIGS. 1, 2, 6, 16, and 18)).

In some examples, the arccosine block 2626 is replaced with an arcsine block that implements an arcsine function to trigonometrically invert the conditioned digital signal. Implementing the arcsine function can include using a lookup table to determine a table entry corresponding to the conditioned digital signal. In some examples, operations are performed in orders different than depicted in FIG. 26. For example, the scaling 2624 can be performed before the zero centering 2622. In some examples, the scaling 2624 and zero centering 2622 can be performed on the digital signals 2616 and 2618 before dividing 2620.

The arccosine algorithm is described by equations 113-115.

$$V_1(t) = C_1 \cos(\omega_P(A \cdot \cos(\omega t) + x(t))) \qquad [113]$$

$$V_n(t) = \cos(\omega_P(A \cdot \cos(\omega t) + x(t))) \qquad [114]$$

$$A \cdot \cos(\omega t) + x(t) = \frac{a\cos(V_n(t))}{\omega_P} \qquad [115]$$

The arcsine algorithm is described by equations 116-118.

$$V_2(t) = C_2 \sin(\omega_P(A \cdot \sin(\omega t) + x(t))) \qquad [116]$$

$$V_n(t) = \sin(\omega_P(A \cdot \sin(\omega t) + x(t))) \qquad [117]$$

$$A \cdot \sin(\omega t) + x(t) = \frac{a\sin(V_n(t))}{\omega_P} \qquad [118]$$

Figure 27:
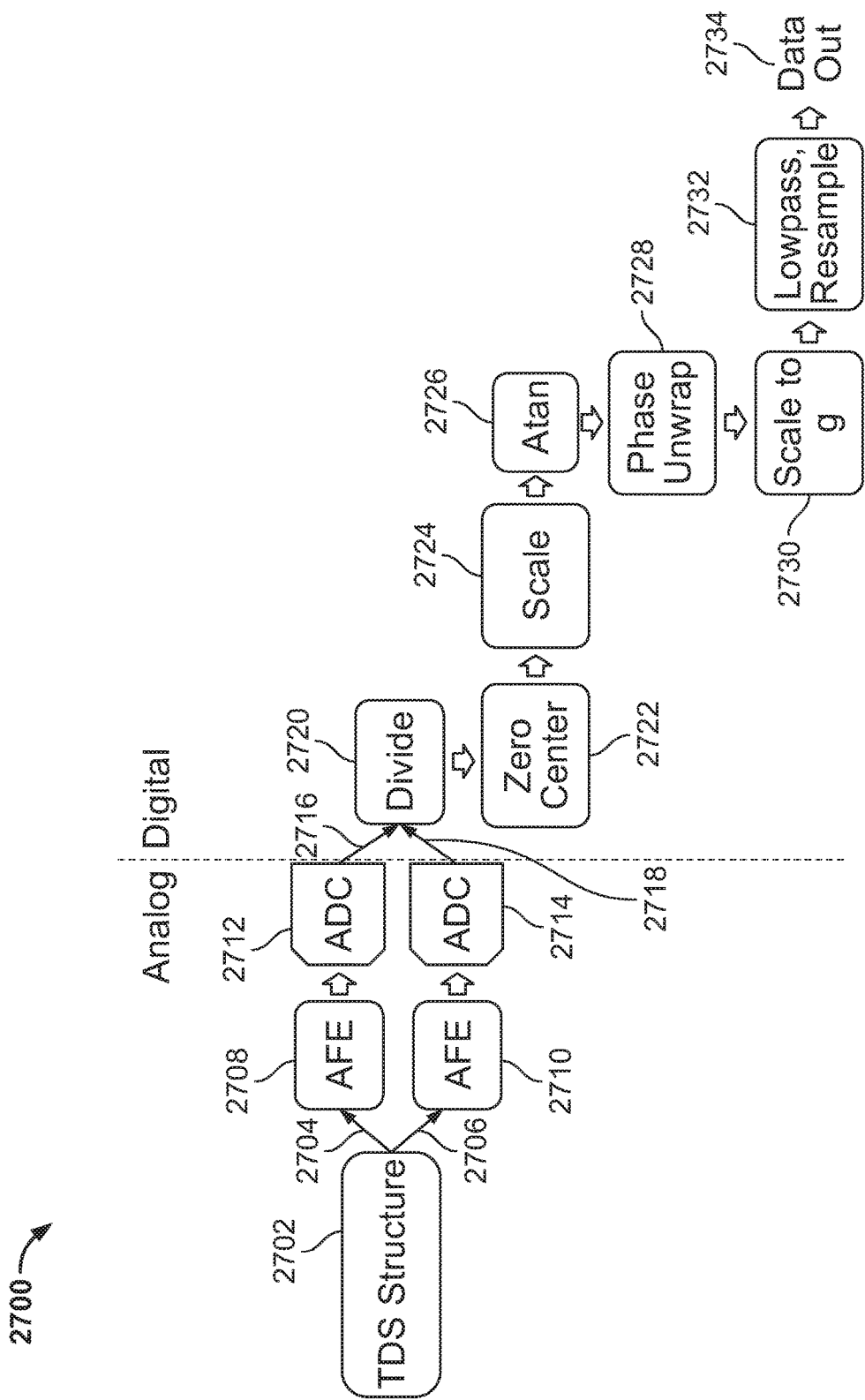
FIG. 27 depicts a block diagram illustrating the signal flows of the arctangent algorithm, according to an illustrative implementation.

FIG. 27 depicts a block diagram 2700 illustrating the signal flows of the arctangent algorithm. The block diagram 2700 includes a TDS structure block 2702 (e.g., any of TDS structures 105, 207, 506, 604, 606, 1501, 1503, 1606, 1608, 1806, 1808 (FIGS. 1, 2, 5, 6, 15, 16, and 18)) that generates analog output signals 2704 and 2706 (each, e.g., any of analog output signals 611, 613, 1626, 1628, 1826, and 1828 (FIGS. 6, 16, and 18)). AFE's 2708 and 2710 receive the analog output signals 2704 and 2706, respectively. Each of the AFE's 2708 and 2710 can be a charge amplifier (e.g., 618, 1810 (FIGS. 6 and 18)) or a transimpedance amplifier (e.g., 620, 712, 806, 908, 1610 (FIGS. 6, 7, 8, 9, and 16)). ADC's 2712 and 2714 receive the output of the AFE's 2708 and 2710, respectively, and generate digital output signals 2716 and 2718, respectively. The digital output signals 2716 and 2718 are received by digital circuitry that divides the two signals 2716 and 2718 to determine a quotient signal. The quotient signal is received by digital circuitry 2722 that performs zero centering, or offsetting. This zero centering, or offsetting, can include integrating the digital output of the ADC 2712 over a predetermined time interval to determine an integral. The integral corresponds to the mean value over the predetermined time interval. The zero centering can then include subtracting the integral from the digital output of the ADC 2712.

The output of the digital circuitry 2722 is received by digital circuitry 2724 that scales the centered signal, which can include scaling by the quantity A of equations 103-105. Together, the digital circuitry 2722 and 2724 condition the digital output of the ADC 2712. The conditioned digital signal generated by circuitry 2724 is received by digital circuitry 2726 that implements an arctangent function to trigonometrically invert the conditioned digital signal. Implementing the arctangent function can include using a lookup table to determine a table entry corresponding to the conditioned digital signal.

The output of the arctangent digital circuitry 2726 is received by phase unwrap digital circuitry 2728. The phase unwrap circuitry 2728 determines if a phase jump has occurred and adjusts the digital signal appropriately. Further details of the phase unwrap circuitry are depicted in FIG. 31. The phase unwrap circuitry can adjust the digital signal by the phase offset φ as shown in equations 103-105. The output of the phase unwrap circuitry 2728 is received by scaling circuitry 2730. The scaling circuitry 2730 scales the digital signal such that it corresponds to acceleration in units of g. The scaled output of the scaling circuitry 2730 is received by signal conditioning circuitry 2732 that performs low-pass filtering and resampling to generate output inertial data 2734. The signal conditioning circuitry 2732 can also perform multiplication by a geometric dimension. The geometric dimension can be a pitch of the TDS structure 2702. The output inertial data 2734 corresponds to an acceleration of the inertial device (e.g., 100, 202, 602, 1602, 1802 (FIGS. 1, 2, 6, 16, and 18)).

In some examples, operations are performed in orders different than depicted in FIG. 27. For example, the scaling 2724 can be performed before the zero centering 2722. In some examples, the scaling 2724 and zero centering 2722 can be performed on the digital signals 2716 and 2718 before dividing 2720.

The arctangent algorithm is described by equations 119-123.

$$V_1(t) = C_1 \cos(\omega_P(A \cdot \sin(\omega t) + x(t))) \qquad [119]$$

$$V_2(t) = C_2 \sin(\omega_P(A \cdot \sin(\omega t) + x(t))) \qquad [120]$$

$$V_n(t) = \frac{\sin(\omega_P(A \cdot \sin(\omega t) + x(t)))}{\cos(\omega_P(A \cdot \sin(\omega t) + x(t)))} \qquad [121]$$

$$= \tan(\omega_P(A \cdot \sin(\omega t) + x(t))) \qquad [122]$$

$$A \cdot \sin(\omega t) + x(t) = \frac{a\tan(V_n(t))}{\omega_P} \qquad [123]$$

The arcsine, arccosine, and arctangent algorithms are similar in that in each, an analog output of a TDS structure is digitized by an ADC after amplification by one or more AFE's. In each method, the analog electronics can include any implementation that converts the physical motion of the sensor to an electronic signal such as current or voltage. This can include, for example, a TIA or a CA. The digital output of the ADC is then processed by digital circuitry to extract the inertial information of interest. In the arcsine and arccosine algorithms, only one analog signal is amplified and digitized, reducing electronics, size and power consumption, in part because only one AFE is required. Also, the arccosine algorithm only requires one periodic capacitive structure (or other periodic sense structure), or two if force-balancing of the proof mass (e.g., 102, 203, 608, 1604, 1804 (FIGS. 1, 2, 6, 16, and 18)) is desired. In contrast, the arctangent algorithm amplifies and digitizes two analog signals and requires two AFE's. The arctangent algorithm requires at least two arrays of TDS structures separated in spatial phase by 90°, or four arrays if force-balancing of the proof mass (e.g., 102, 203, 608, 1604, 1804 (FIGS. 1, 2, 6, 16, and 18)) is desired. Thus, inertial devices (e.g., 100, 202, 602, 1602, 1802 (FIGS. 1, 2, 6, 16, and 18)) utilizing the arcsine and arccosine algorithms, instead of the arctangent algorithm, have reduced complexity and number of electrical contacts to the TDS structure (e.g., 105, 207, 506, 604, 606, 1501, 1503, 1606, 1608, 1806, 1808 (FIGS. 1, 2, 5, 6, 15, 16, and 18)). However, the arctangent algorithm has advantages in determining the phase unwrap, as will be described in more detail below.

Once digitized, the signal is scaled and zero-centered, and an inverse trigonometric function is applied to the data. In the arctangent algorithm, the two digital signals are divided by each other, and the quotient is trigonometrically inverted using an arctangent function. In the arcsine and arccosine algorithms, the single digitized signal is trigonometrically inverted using an arcsine or an arccosine function, respectively. In each of the three methods, the output of the trigonometric inverse function is phase. However, because the analog input signal is periodic, the inverse trigonometric functions are not single-valued.

Because the inverse trigonometric functions are not single-valued, they can have multiple output values for a given input value. When inverse trigonometric functions are implemented in hardware and software, the outputs of these trigonometric functions are restricted to a single-valued range at the origin. However, this can result in degeneracy, because the true phase of the input analog signal may be outside this restricted range. To arrive at a result that is outside this restricted range for an inverse trigonometric function, additional processing must be performed. This additional processing is referred to herein as phase unwrapping or unwrapping. Unwrapping recreates the original phase of the input analog signal, which corresponds to the motion of the proof mass (e.g., 102, 203, 608, 1604, 1804 (FIGS. 1, 2, 6, 16, and 18)). This concept can also apply to non-inertial sensors, whereby any oscillatory wave form is modified by an input signal to be detected.

The disadvantage of the arcsine and arccosine algorithms is that the phase is more difficult to unwrap compared to the arctangent algorithm. In the arctangent algorithm, there is a clear jump in phase near the unwrap boundaries, facilitating detection of phase wrap. In the arcsine and arccosine algorithms, the phase simply changes direction at the unwrapped boundaries, requiring a more involved algorithm to detect a phase wrap event.

While the arctangent algorithm requires a simpler phase unwrap algorithm, it requires more analog circuitry than the arcsine and arccosine algorithms. The arctangent algorithm requires twice the number of AFE blocks compared to the arcsine and arccosine algorithms. The arctangent algorithm also requires a synchronization between ADC's or simultaneous sampling, and two banks of TDS structures at respective phases of 0° and 90°. If force balancing is also desired, four banks of TDS structures at 0°, 90°, 180°, and 270° are required. The arcsine and arccosine algorithms each require only one AFE, one ADC, and one bank of TDS structures. To perform force balancing, only two banks of such structures at 0° and 180° are required for the arcsine and arccosine algorithms.

FIG. 28 depicts a graph 2800 that shows the digital output of the arctangent algorithm for a low amplitude of proof mass oscillation, an amplitude that does not result in phase wrap events. The graph 2800 includes a digital output curve 2802 that represents the output of the arctangent block (e.g., 2726 (FIG. 27)) before phase unwrapping. The curve 2802 is in the shape of a sine wave, representing the oscillation of the proof mass (e.g., 102, 203, 608, 1604, 1804 (FIGS. 1, 2, 6, 16, and 18)), plus any offsets induced by inertial forces (or any signal of interest). The proof mass (e.g., 102, 203, 608, 1604, 1804 (FIGS. 1, 2, 6, 16, and 18)) has been oscillated with an amplitude of 0.4 microns, less than one-half of the pitch distance of the TDS structure (e.g., 105, 207, 506, 604, 606, 1501, 1503, 1606, 1608, 1806, 1808 (FIGS. 1, 2, 5, 6, 15, 16, and 18)). Because the oscillation amplitude is less than one-half the pitch distance (corresponding to a phase of $\pi/2$ radians), the digital output curve 2802 is continuous and without phase wraps.

FIG. 29 depicts a graph 2900 showing the output of the arctangent algorithm when the proof mass (e.g., 102, 203, 608, 1604, 1804 (FIGS. 1, 2, 6, 16, and 18)) has an oscillation amplitude larger than one-half the pitch distance of the TDS structure (e.g., 105, 207, 506, 604, 606, 1501, 1503, 1606, 1608, 1806, 1808 (FIGS. 1, 2, 5, 6, 15, 16, and 18)). The graph 2900 includes a digital output curve 2902 generated by digital circuitry implementing the arctangent algorithm (e.g., 2726). The digital output curve 2902 includes a phase wrap between points 2904 and 2906 and a second phase wrap between points 2908 and 2910. These phase wraps occur when the proof mass position reaches displacements that are integer multiples of one-half the pitch of the TDS structure (e.g., 105, 207, 506, 604, 606, 1501, 1503, 1606, 1608, 1806, 1808 (FIGS. 1, 2, 5, 6, 15, 16, and 18)). The phase determined from the arctangent algorithm is $\pi$ or $-\pi$ radians at these points, and at the phase wrap, transitions in the opposite direction by $2\pi$ radians. For example, at point 2904, the phase is $\pi$, and the output curve 2902 transitions by $-2\pi$ radians to a value of $-\pi$ at point 2906. This transition happens sharply, and occurs between adjacent data points of the digital output curve 2902. This sharp transition can be easily detected by setting a threshold to detect large changes in data between adjacent data points. This sharp transition occurs because the arctangent function is not single-valued and returns only values between $-\pi$ and $\pi$ for any given input. The phase unwrap block can be used to detect these phase wraps and remove their effects.

FIG. 30 depicts a graph 3000 showing a digital output signal of the arcsine algorithm, where the proof mass has an oscillation amplitude greater than one-half the pitch, causing phase wraps. The graph 3000 includes a digital output curve 3002 that is generated by digital circuitry implementing an arcsine function (e.g., 2626 (FIG. 26)). The digital output curve 3002 has phase wraps at points 3006 and 3008, but these phase wraps are continuous, simply involving a reversal in direction of the digital output curve 3002. Digital outputs of the arccosine algorithm exhibit similar phase wraps as the arcsine algorithm. In the arcsine algorithm, the absolute value of the digital output signal is used, so the phase wraps occur when the absolute value of the digital output signal reaches 0 or $\pi/2$ radians. In the arccosine algorithm, the phase wraps occur when the digital output signal reaches 0 or $\pi$ radians, regardless of whether the absolute value of the digital signal is used. However, in the arcsine and arccosine algorithms, the phase does not jump by $2\pi$, but simply changes direction, with the same rate of change as before the phase wrap. Comparing the digital output curve 3002 to a simple data jump threshold is insufficient to detect the phase wrap for the arcsine and arccosine algorithms, because the digital output curve 3002 remains continuous across the phase wraps. However, there is still a sharp transition in the otherwise smoothly changing data.

This sharp transition can be detected by the following method. First, the method determines if a sharp transition has occurred when the digital output curve 3002 has values near 0 or $\pi/2$ for the arcsine algorithm, or 0 and $\pi$ for the arccosine algorithm. Second, the digital circuitry determines whether the transition was due to noise or a genuine phase wrap event. Third, the digital circuitry keeps track of prior phase directions to maintain continuity of the unwrapped function.

In some examples, the digital circuitry can determine when a phase wrap has occurred by monitoring a running difference between consecutive data points. Over a given time I, if the difference between the data point at time i and the data point at time i−1 or the difference between the data point at time i and the data point of time i+1 is above $\pi/2$ or below zero, then the digital circuitry determines that a phase wrap event has occurred in the arcsine algorithm. If the arccosine algorithm is implemented, the digital circuitry compares the two differences to zero and π. The digital circuitry then determines between which data points the phase wrap occurred by comparing neighboring differences. The digital circuitry can determine that the phase wrap occurred between the two data points with the smallest difference. The corresponding succeeding data point is then modified to take into account the portion of the difference that occurred before and after the phase wrap. The sign of the slope of the phase is tracked by altering the sign of the register. The sign is then applied to either subtract or add subsequent differences in order to reconstruct the original phase.

FIG. 31 depicts a method 3100 illustrating phase unwrapping in the arccosine and arcsine algorithms. At 3104, digital circuitry receives input data 3102 and determines the time derivative, or slope. The input data 3102 can comprise a result of trigonometric inversion. In some examples, determining the time derivative can include comparing the current value of the signal to the previous value of the signal and dividing by the difference in time between the two data points. At 3106, the digital circuitry determines if the derivative has changed sign. In some examples, the digital circuitry can do this by comparing the sign of the time derivative at the current time increment and comparing it to the sign of the time derivative at the previous time increment. If the derivative has not changed in sign, at 3108, the digital circuitry stores the output value at the current time increment as the sign multiplied by the output value at the previous time increment, added to the derivative at the current time increment. Because the sign is reversed each time a phase wrap is detected, as described below, the step 3108 adjusts the present value and future values of the output value according to the number of detected phase wrap events.

If, at 3106, the digital circuitry determines that the derivative has changed in sign, the method 3100 proceeds to step 3110. At 3110, the digital circuitry determines whether the sum of the current derivative and the output value at the last time increment is greater than π. If the circuitry determines at 3110 that the sum is not greater than π, the method 3100 proceeds to step 3114. At 3114, the digital circuitry determines whether the sum of the output value at the previous time increment and the current derivative is less than zero. If, at 3114, the digital circuitry determines that the sum is not less than zero, no phase wrap has occurred and the method 3114 proceeds to step 3108. If, at step 3110, the digital circuitry determines that the sum is greater than π, or, if, at step 3114, the digital circuitry determines that the sum is less than zero, the method proceeds to steps 3112 and 3116. At 3116, the sign is reversed, such that the new value of the sign is the opposite of the previously stored value. At 3112, the digital circuitry determines if the absolute value of the current derivative is greater than the absolute value of the previous derivative. If yes, the method 3100 proceeds to steps 3118 and 3120. At 3118, the previous output value is stored as the sign multiplied by the output value at time i−2 and added to the derivative at the previous time i−1. At 3120, the digital circuitry stores the previous derivative as the value obtained from subtracting the output values at times i−1 and i−2 from 2π.

If, at 3112, the digital circuitry determines that the absolute value of the derivative at time i is not greater than the derivative at time i minus 1, the method 3100 proceeds to steps 3118 and 3122. At 3122, the digital circuitry stores the derivative at time i as a value obtained by subtracting the output value at time i and the output value at time i−1 from 2π. In this way, the digital circuitry can implement the method 3100 to unwrap, rephase and reconstruct the digital output signal without phase wrap artifacts.

In some examples, noise in the digital input data 3102 can be sufficiently high to cause errors in tracking the phase. This may occur when noise causes the digital signal to temporarily cross the phase boundaries at zero and/or π/2. This may occur in particular when the noise is much higher than the quantization level (or bit resolution) of the ADC such that the noise is greater than the difference between successive data points near the boundary.

Figure 32:
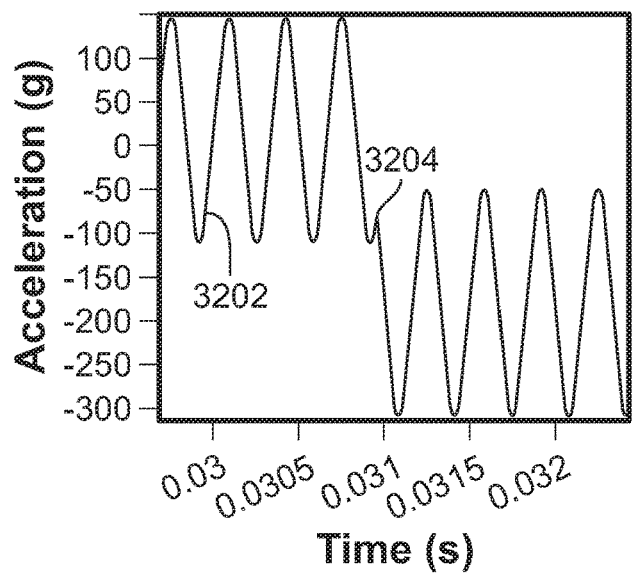
FIG. 32 depicts an example of phase unwrap error due to excessive noise at the phase unwrap boundary, according to an illustrative implementation.

FIG. 32 depicts an example of phase unwrap error due to excessive noise at the phase unwrap boundary. FIG. 32 depicts an acceleration curve 3202 that has been determined using phase unwrapping, but exhibits a phase unwrap error at point 3204, where the phase is not correctly tracked due to noise. To overcome this error, digital circuitry may determine phase crossings by using a larger data difference threshold. For example, instead of comparing local data differences to the phase boundary, a larger threshold may be used. The threshold can be large enough such that no local noise in the data is large enough to cause a false phase transition. The magnitude in this threshold is limited by the full-scale range of the sensor data. In other words, the threshold must not be so large that an actual signal of interest (such as acceleration) can cause a false phase transition by falling within the threshold range. In practice, this can be designed into the system such that, for a given resonant frequency, the signal of interest causes the displacement of the oscillator to stay well within a single pitch distance of the periodic physical structure. An example of scaled capacitance signals generated by such a design is shown in FIG. 33.

Even with proper thresholding, noise can cause occasional errors with the arcsine and arccosine algorithms. This issue is specific to the arcsine and arccosine algorithms, in contrast to the arctangent algorithm. These errors may arise in the output signal near the phase crossing boundaries, because noise tends to become magnified near these phase crossing boundaries. These errors do not occur when using the arctangent algorithm because its sharp a phase transition make false phase transitions unlikely to occur. In particular, the error can be highest when a phase boundary is crossed. This type of error tends to manifest as significant errors confined to the phase crossing boundary region. Because of this, these errors can be systematically reduced by interpolating between neighboring output data points.

Figure 33:
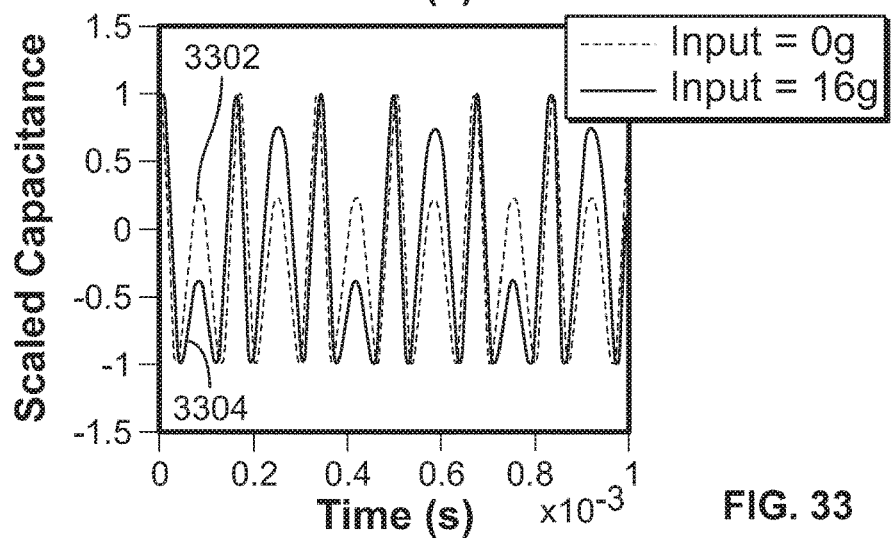
FIG. 33 depicts capacitive signals of an inertial device with a proof mass that is driven to amplitudes that do not cause false phase transitions, according to an illustrative implementation.

FIG. 33 depicts capacitive signals of an inertial device (e.g., 100, 202, 602, 1602, 1802 (FIGS. 1, 2, 6, 16, and 18)) with a proof mass (e.g., 102, 203, 608, 1604, 1804 (FIGS. 1, 2, 6, 16, and 18)) that is driven to amplitudes that do not cause false phase transitions. FIG. 33 depicts a capacitive curve 3302 corresponding to a 0 g acceleration, and a capacitive curve 3304 corresponding to a 16 g acceleration, which is a full-scale acceleration of the inertial device. The proof mass is driven at an oscillation amplitude such that the signal change under acceleration never exceeds +1 or is less than −1, which would result in a phase transition after applying the arccosine function. The threshold may be set that under full acceleration, the phase does not enter the threshold range near the phase boundary. In this case, the threshold may be set much greater than the noise level and may not cause issues with phase tracking.

When implementing the arcsine, arccosine, and arctangent algorithms, the proof mass (e.g., 102, 203, 608, 1604, 1804 (FIGS. 1, 2, 6, 16, and 18)) may be driven at nearly arbitrary amplitudes without having an effect on signal resolution. These methods only require the proof mass to traverse at least the distance of one-half the pitch of the TDS structure (e.g., 105, 207, 506, 604, 606, 1501, 1503, 1606, 1608, 1806, 1808 (FIGS. 1, 2, 5, 6, 15, 16, and 18)). This minimum distance traversal ensures that there is at least one positive and one negative periodic phase boundary crossing. This is equivalent to a requirement that the digitized signal, before applying an inverse trigonometric function and phase unwrap, be scaled to maximum and minimum amplitudes of +1 and −1, respectively, as shown in FIG. 33. The proof mass may be driven at higher amplitudes without any effect on the resolution of the final output signal. This allows flexibility when designing the system for a desired full-scale range of the output signal. In some examples, it is advantageous to drive the proof mass at a minimum amplitude necessary to achieve a given full-scale range, in order to minimize the drive voltage and power, as well as to simplify the phase unwrap algorithm. In addition, drive amplitude does not affect the noise floor in many cases.

Figure 34:
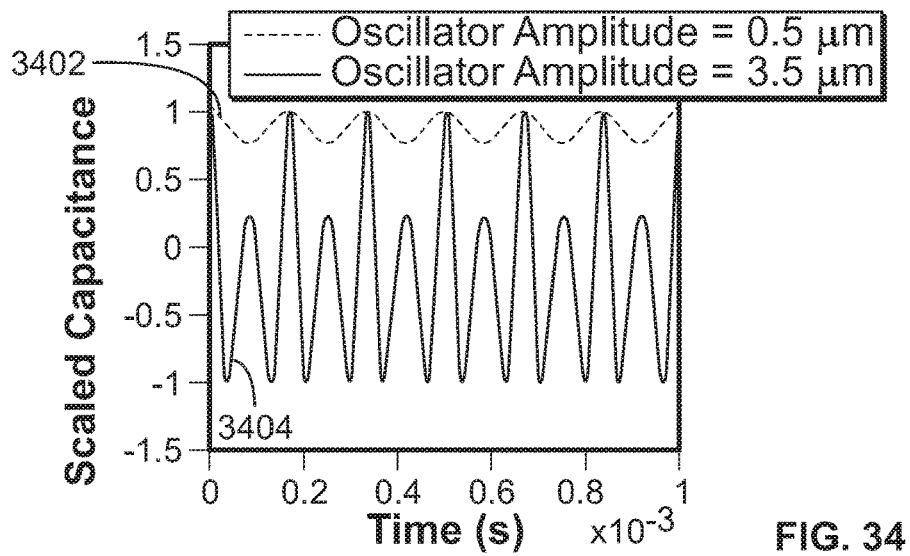
FIG. 34 depicts capacitance curves of an inertial device with a proof mass driven at two different amplitudes, according to an illustrative implementation.

FIG. 34 depicts capacitance curves of an inertial device (e.g., 100, 202, 602, 1602, 1802 (FIGS. 1, 2, 6, 16, and 18)) with a proof mass (e.g., 102, 203, 608, 1604, 1804 (FIGS. 1, 2, 6, 16, and 18)) driven at two different amplitudes. FIG. 34 depicts a capacitive curve 3402 of an oscillating proof mass driven to an amplitude of 0.5 microns and a capacitive curve 3404 of an oscillating proof mass driven to an amplitude of 3.5 microns. When the oscillator is driven to an amplitude of 0.5 microns, the proof mass does not reach a negative phase boundary, and so the capacitive signal cannot be scaled to maximum and minimum values of +1 and −1. When the proof mass is driven to an oscillation amplitude of 3.5 microns, there are multiple phase boundary crossings, allowing the capacitive signal to be properly scaled to maximum and minimum values of +1 and −1, respectively. Additionally, the drive amplitude is such that the digitized capacitive signal (with no input acceleration) ranges halfway between phase boundaries, resulting in an optimized full-scale range. In general, driving the proof mass in quarter-pitch amplitude increments (that are greater than one-half pitch) optimizes a given full scale range. The full scale range itself can be optimized by choosing the resonant frequency of the sensor and thus its mechanical sensitivity (displacement caused by a given input acceleration).

Although it is preferable to drive the proof mass (e.g., 102, 203, 608, 1604, 1804 (FIGS. 1, 2, 6, 16, and 18)) at amplitudes greater than one-half pitch of the TDS structure (e.g., 105, 207, 506, 604, 606, 1501, 1503, 1606, 1608, 1806, 1808 (FIGS. 1, 2, 5, 6, 15, 16, and 18)), this is not necessary. For example, the arcsine or arccosine algorithms with phase unwrapping can be used to determine inertial parameters from the scaled capacitive signal 3402. However, scaling the signal after digitization by the ADC is more complicated when the oscillator is driven at amplitudes less than one-half the pitch. One potential implementation for scaling is a one-time calibration. Another implementation involves occasionally driving the proof mass to higher amplitudes when the inertial device (e.g., 100, 202, 602, 1602, 1802 (FIGS. 1, 2, 6, 16, and 18)) is known to be at rest, or during start up of the inertial device, to measure the appropriate scaling factor. Conversely, the proof mass oscillation amplitude may be arbitrarily high. This would increase the number of phase crossings, which must be tracked. In addition, it is possible to use a full-scale signal range that causes a displacement that exceeds a pitch or a half-pitch interval. Accommodating this range requires the digital circuitry to track phase crossings due to the signal as well as from the mechanical oscillation.

Figure 35:
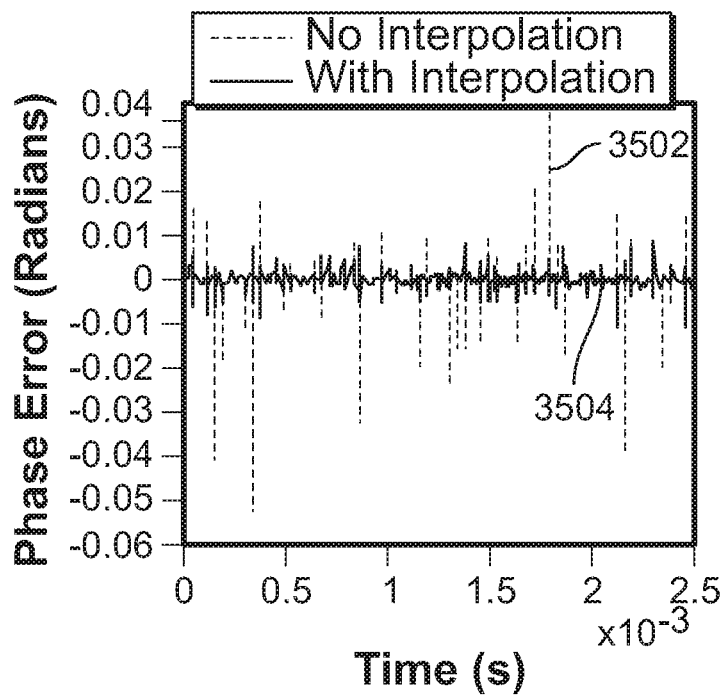
FIG. 35 illustrates the error reduction from interpolation, according to an illustrative implementation.

FIG. 35 illustrates the error reduction from interpolation. FIG. 35 depicts an phase error curve 3502 showing phase error of an inertial device (e.g., 100, 202, 602, 1602, 1802 (FIGS. 1, 2, 6, 16, and 18)) when interpolation is not used, and a phase error occurred 3504 showing phase error of the same inertial device when interpolation has been used. As depicted in FIG. 35, interpolation significantly reduces phase error, and in particular by reducing the large spikes at single data points.

Figure 36:
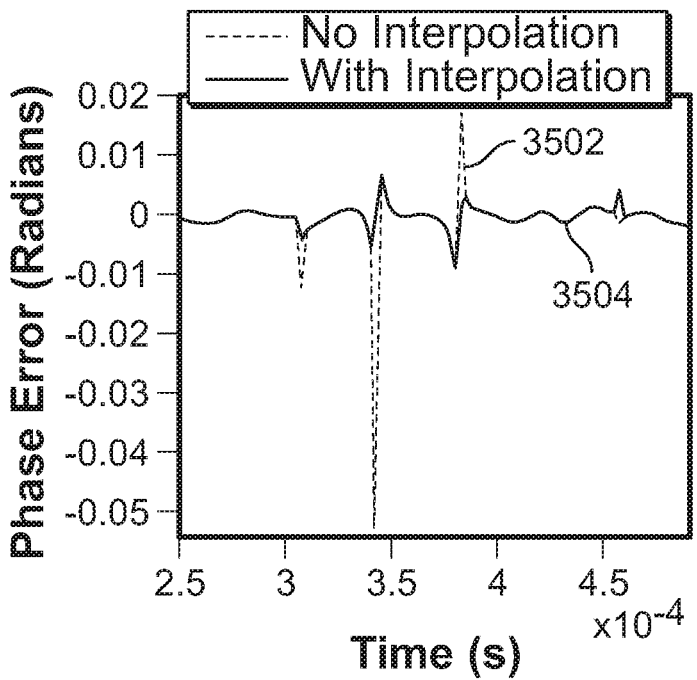
FIG. 36 depicts an enlarged view of the phase error curves depicted in FIG. 35, according to an illustrative implementation.

FIG. 36 depicts an enlarged view of the phase error curves 3502 and 3504 (FIG. 35). As depicted in FIG. 36, interpolation removes disproportionately large phase errors at single data points. With interpolation, some error remains, but this error is periodic with the motion of the proof mass (e.g., 102, 203, 608, 1604, 1804 (FIGS. 1, 2, 6, 16, and 18)). This error occurs as spectral artifacts at harmonics of the oscillation frequency of the proof mass. No such artifacts appear in FIG. 36 below the oscillation frequency, or in the range of interest for desired signals (below resonance). However, for high levels of noise and without interpolation of points of phase boundary crossings, artifacts may occur in the range of interest.

In addition to interpolation, error may be reduced further by implementing a digital low-pass filter before applying the unwrap algorithm. The sample rate of the ADC may be much greater than the frequency range of the desired signal. Therefore, most of the noise is at high frequencies and may be filtered out, provided the frequency content of the proof mass oscillation is preserved. In some examples, the low-pass filter can remove noise at frequencies more than twenty times the drive frequency of the proof mass. This filtering improves the fidelity of the phase unwrap algorithm and reduces the overall noise floor.

With proper thresholding, interpolation, and digital pre-filtering, the arcsine and arccosine algorithms can have equivalent noise performance as the arctangent algorithm.

The arctangent algorithm operates on the output of an ADC to determine inertial parameters. The arctangent algorithm unfolds periodic non-linear signal output from the TDS structures (e.g., 105, 207, 506, 604, 606, 1501, 1503, 1606, 1608, 1806, 1808 (FIGS. 1, 2, 5, 6, 15, 16, and 18)), recovering a digitized representation of the motion of the proof mass (e.g., 102, 203, 608, 1604, 1804 (FIGS. 1, 2, 6, 16, and 18)). The low-frequency displacements that are induced by inertial forces are the desired signals and can be isolated from the oscillation of the proof mass (and any other higher frequency motion) by digital low-pass filtering.

In some examples, the arctangent algorithm requires in-phase (I) and quadrature (Q) signals to be generated by the inertial device (e.g., 100, 202, 602, 1602, 1802 (FIGS. 1, 2, 6, 16, and 18)). These signals have intrinsic phase separation of 90°. These I and Q signals can be produced by arrays of periodic structures that are offset by 90° or one-fourth the pitch of the periodic structures. In some examples, the phase separation need not be exactly 90°, in which case the modified equations can be used. In some examples, to prevent imbalances from capacitive forces and to employ a differential AFE amplifier to reject common-mode noise, four arrays of TDS structures with 0°, 180°, 90° and 270° phase offsets may be used as shown in FIG. 37.

Figure 37:
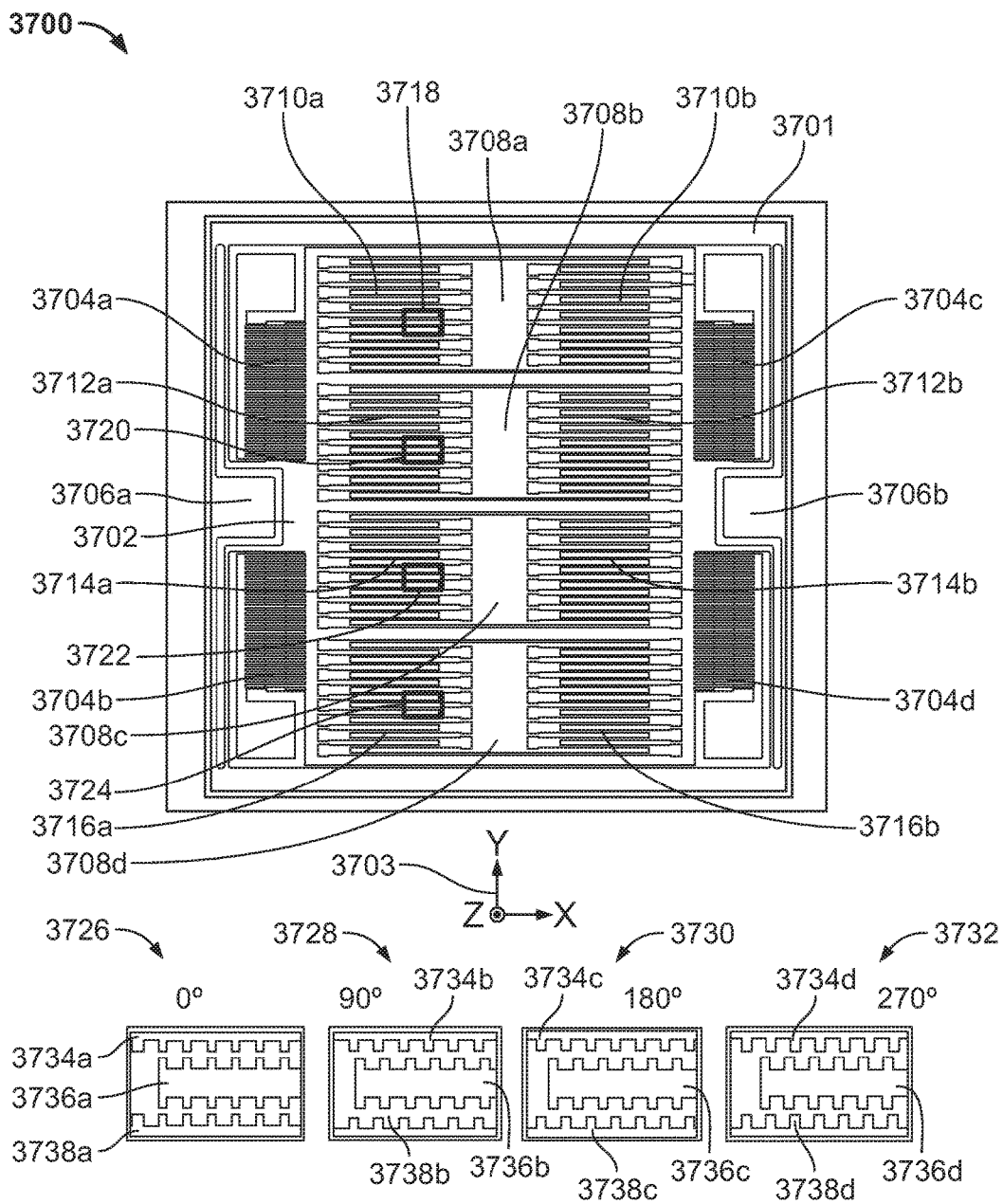
FIG. 37 depicts an inertial device with TDS structures that have four different phase offsets, according to an illustrative implementation.

FIG. 37 depicts an inertial device 3700 with TDS structures (e.g., 105, 207, 506, 604, 606, 1501, 1503, 1606, 1608, 1806, 1808 (FIGS. 1, 2, 5, 6, 15, 16, and 18)) that have four different phase offsets. The inertial device 3700 includes a proof mass 3702 that is oscillated along the x axis by drive combs 3704a, 3704b, 3704c, and 3704d (collectively, drive combs 3704). FIG. 37 depicts a coordinate system 3703 with an x axis, a y axis perpendicular to the x axis, and a z axis perpendicular to each of the x and y axes. The proof mass 3702 is connected to springs and anchors 3706a and 3706b (collectively, anchors 3706). The inertial device 3700 also includes anchors 3708a, 3708b, 3708c, and 3708d (collectively, anchors 3708). The anchors 3706 and 3708 are connected to a top layer and/or bottom layer (not shown).

The inertial device 3700 includes 0° TDS structures 3710a and 3710b (collectively, TDS structures 3710), 90° TDS structures 3712a and 3712b (collectively, TDS structures 3712), 180° TDS structures 3714a and 3714b (collectively, TDS structures 3714), and 270° TDS structures 3716a and 3716b (collectively, TDS structures 3716). FIG. 37 also depicts areas of interest 3718, 3720, 3722, and 3724.

FIG. 37 depicts the enlarged views 3726, 3728, 3730, and 3732, which are enlarged views of the areas of interest 3718, 3720, 3722, and 3724, respectively. The view 3726 depicts a portion of the TDS structure 3710a and shows moveable beams 3734a and 3738a. The moveable beams 3734a and 3738a move along the x axis with respect to a fixed beam 3736a. The view 3726 depicts the proof mass 3702 in the neutral position, and the teeth of the fixed beam 3736a are aligned with the teeth of the moveable beams 3734a and 3738a, corresponding to a spatial phase of 0° and 0 radians.

The view 3728 depicts a portion of the TDS structure 3712a and shows moveable beams 3734b and 3738b. The moveable beams 3734b and 3738b move along the x axis with respect to a fixed beam 3736b. The view 3728 depicts the proof mass 3702 in the neutral position, and the teeth of the fixed beam 3736b are offset from the teeth of the moveable beams 3734b and 3738b by one-fourth of the pitch distance of the TDS structure 3712a, corresponding to a spatial phase of 90° and π/2 radians.

The view 3730 depicts a portion of the TDS structure 3714a and shows moveable beams 3734c and 3738c. The moveable beams 3734c and 3738c move along the x axis with respect to a fixed beam 3736c. The view 3730 depicts the proof mass 3702 in the neutral position, and the teeth of the fixed beam 3736c are offset from the teeth of the moveable beams 3734c and 3738c by one-fourth of the pitch distance of the TDS structure 3714a, corresponding to a spatial phase of 180° and π radians.

The view 3732 depicts a portion of the TDS structure 3716a and shows moveable beams 3734d and 3738d. The moveable beams 3734d and 3738d move along the x axis with respect to a fixed beam 3736d. The view 3732 depicts the proof mass 3702 in the neutral position, and the teeth of the fixed beam 3736d are offset from the teeth of the moveable beams 3734d and 3738d by one-fourth of the pitch distance of the TDS structure 3716a corresponding to a spatial phase of 270° and 3π/2 radians.

The capacitance of the 0° of the TDS structure 3710 as a function of displacement of the proof mass 3702 is shown by equation 124.

$$C(x) = \left\{ A + B \cdot \cos\left[\frac{2\pi}{P}x\right] + C \cdot \cos\left[\frac{4\pi}{P}x\right] + D \cdot \cos\left[\frac{6\pi}{P}x\right] + E \cdot \cos\left[\frac{8\pi}{P}x\right] + F \cdot \cos\left[\frac{10\pi}{P}x\right] + G \cdot \cos\left[\frac{12\pi}{P}x\right] \right\} \quad [124]$$

Because the variables C, D, E, F, and G are approximately two orders of magnitudes of the variables A and B, equation 124 can be approximated by equation 125. While equation 124 more accurately captures the capacitance behavior of the TDS structure 3710, the simpler equation 125 will be used for the conceptual analysis below. The pitch of the teeth of the TDS structure 3710 is indicated by the variable P. The capacitance behavior of the TDS structures 3710, 3712, 3714, and 3716 can be modeled using equation 125, with spatial phase offsets in quarter-pitch increments as shown in equations 126-129.

$$C(x) \approx A + B \cdot \cos\left[\frac{2\pi}{P}x\right] \quad [125]$$

$$C_0(t) = C[x(t)] \quad [126]$$

$$C_{90}(t) = C\left[x(t) + \frac{P}{4}\right] \quad [127]$$

$$C_{180}(t) = C\left[x(t) + \frac{P}{2}\right] \quad [128]$$

$$C_{270}(t) = C\left[x(t) + \frac{3P}{4}\right] \quad [129]$$

The capacitance can be expressed as a function of time by substituting the proof mass (e.g., 102, 203, 608, 1604, 1804 (FIGS. 1, 2, 6, 16, and 18)) motion x(t) into equation 125 as shown in equation 130.

$$C(t) = C[x(t)] \approx A + B \cdot \cos\left[\frac{2\pi}{P}x(t)\right] \quad [130]$$

Using two matched differential AFE's such as transimpedance or charge amplifiers, the capacitances of the 0° TDS structure 3710 and the 180° TDS structure 3714 are combined to define the in-phase signal (I) as shown in equation 131. Similarly, the capacitance signals of the 90° TDS structure 3712 and the 270° TDS structure 3716 are combined to define the quadrature signal (Q) as shown in equation 132.

$$C_I(t) = C_0(t) - C_{180}(t) \approx 2 \cdot B \cdot \cos\left[\frac{2\pi}{P}x(t)\right] \quad [131]$$

$$C_Q(t) = C_{90}(t) - C_{270}(t) \approx 2 \cdot B \cdot \sin\left[\frac{2\pi}{P}x(t)\right] \quad [132]$$

Figure 38:
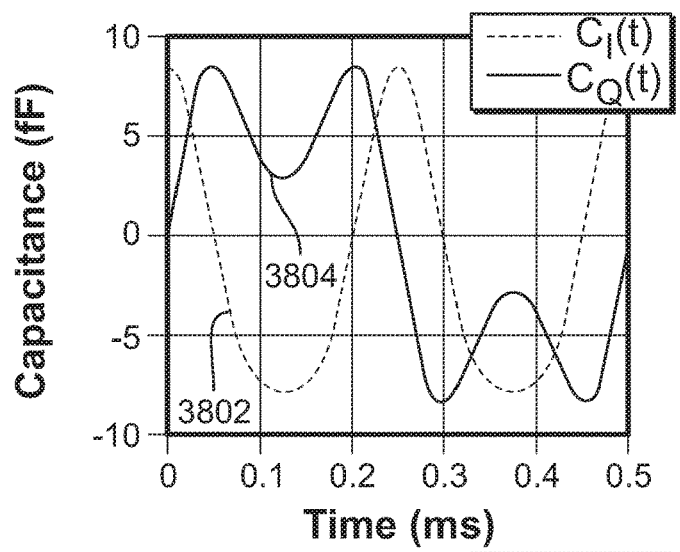
FIG. 38 depicts an in-phase capacitance curve and a quadrature capacitance curve at a drive amplitude of 2 microns, according to an illustrative implementation.
Figure 39:
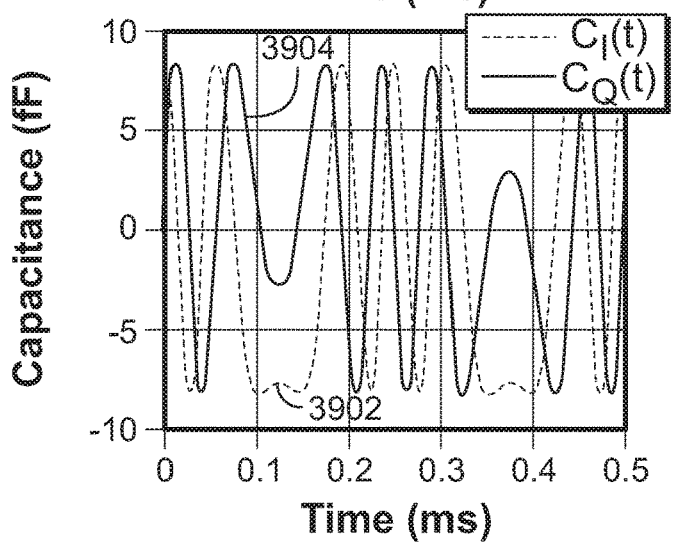
FIG. 39 depicts an in-phase capacitance curve and a quadrature capacitance curve at a drive amplitude of 7 microns, according to an illustrative implementation.
Figure 40:
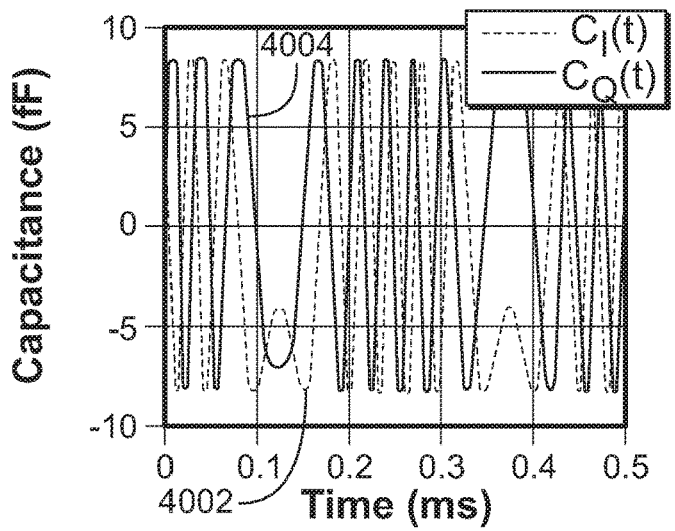
FIG. 40 depicts an in-phase capacitance curve and a quadrature capacitance curve at a drive amplitude of 12 microns, according to an illustrative implementation.

FIGS. 38, 39, and 40 depict the capacitance signals of equations 131 and 132 at various drive amplitudes of the proof mass (e.g., 102, 203, 608, 1604, 1804 (FIGS. 1, 2, 6, 16, and 18)). FIG. 38 depicts an in-phase capacitance curve 3802 and a quadrature capacitance curve 3804 at a drive amplitude of 2 microns. FIG. 39 depicts an in-phase capacitance curve 3902 and a quadrature capacitance curve 3904 at a drive amplitude of seven microns. FIG. 40 depicts an in-phase capacitance curve 4002 and a quadrature capacitance curve 4004 at a drive amplitude of 12 microns. As can be seen in FIGS. 38-40, when the drive amplitude increases, the peak capacitance does not change, but the frequency of the capacitance signal does change. This is true even though the oscillation frequency of the proof mass has not changed.

The displacement of the proof mass (e.g., 102, 203, 608, 1604, 1804 (FIGS. 1, 2, 6, 16, and 18)) can be determined by dividing equations 131 to produce equation 133. Thus, digital circuitry can perform the operations of equation 133 on received capacitance signals $C_Q$ and $C_I$ to determine proof mass displacement.

$$x(t) = \frac{P}{2\pi} \cdot a\tan\left[\frac{C_Q(t)}{C_I(t)}\right] \qquad [133]$$

The digital representation of the motion of the proof mass (e.g., 102, 203, 608, 1604, 1804 (FIGS. 1, 2, 6, 16, and 18)) can include different frequency components, including contributions from the drive comb actuation, from inertial forces, and from acoustic coupling. These components are illustrated in equation 134.

$$x(t) = A \cdot \sin(\omega_0 \cdot t) + x_{Inertial}(t) + x_{Acoustic}(t) \qquad [134]$$

The first term in equation 134, $A \cdot \sin(\omega_0 \cdot t)$, represents the resonant motion of the proof mass caused by comb drives. This component can be extracted using a digital band-pass filter. In some examples, this digital band-pass filter can utilize a third order Butterworth filter centered at two kilohertz with cut-offs at 2.25 and 1.75 kHz. These filter parameters can be used for a drive frequency of 2 kHz. The oscillator amplitude can be isolated from this filtered digital signal using an envelope detector. The third term in equation 134 represents high frequency motion (e.g., 200 Hz-20 kHz), caused by acoustic coupling from a speaker. These signals are at frequencies above the inertial signals, but if acoustic signals exist in the band of the band pass filter, there can corrupt the amplitude signal.

The second term in equation 134, $x_{Inertial}(t)$ represents low-frequency motion of the proof mass (e.g., less than 200 Hz) caused by inertial forces acting on the inertial device. Motion in this frequency range is the desired measurement. The inertial component of the signal is isolated using a digital low-pass filter. In some examples, the low-pass filter can be a fourth order Butterworth filter with a 200 Hz cutoff. The inertial acceleration is thus given by equation 135, where $\omega_0^2$ represents the square of the natural frequency of the proof mass. In some examples, $\omega_0^2$ represents the square of the drive frequency of the proof mass.

$$a(t) = \omega_0^2 \cdot x_{Inertial}(t) \qquad [135]$$

The resonant frequency of the proof mass can be measured in real time because the closed loop drive can accurately track resonance. Initial calibration can be used to determine the resonant frequency. The relative change in sensitivity over time can be tracked by measuring the closed loop drive frequency, with some initial calibration. The relative change in sensitivity can include a fixed offset. If the fixed offset drifts with time, this can affect accuracy of the measurement of inertial parameters. In the arcsine, arccosine, and arctangent algorithms, the unwrap accuracy does not depend on knowledge of the actual resonant frequency. The unwrap accuracy in these algorithms only depends on an accurate measurement of the drive frequency. However, knowledge of the actual resonant frequency does affect the scaling of the unwrapped output to units of 'g' in the arcsine, arccosine, and arctangent algorithms, as well as in the cosine algorithm.

Figure 41:
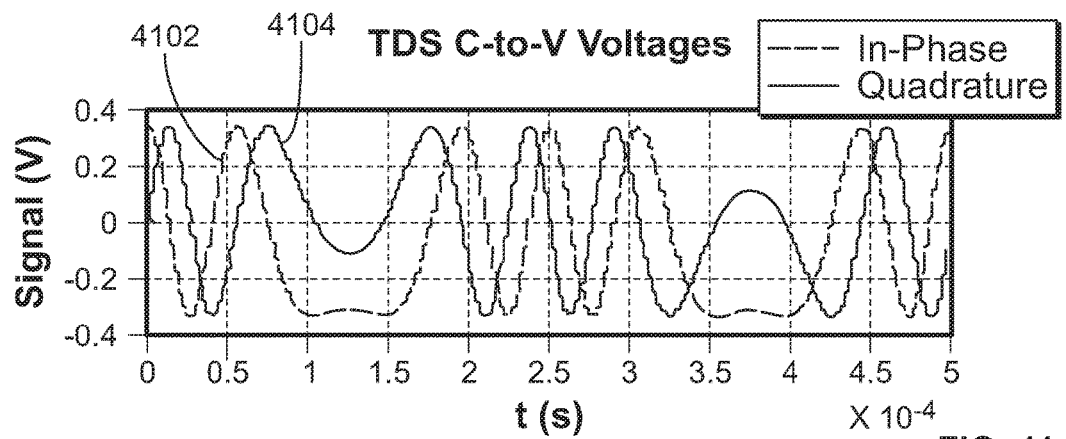
FIG. 41 depicts analog output signals of differential charge amplifiers at a proof mass oscillation of 7 microns, according to an illustrative implementation.
Figure 42:
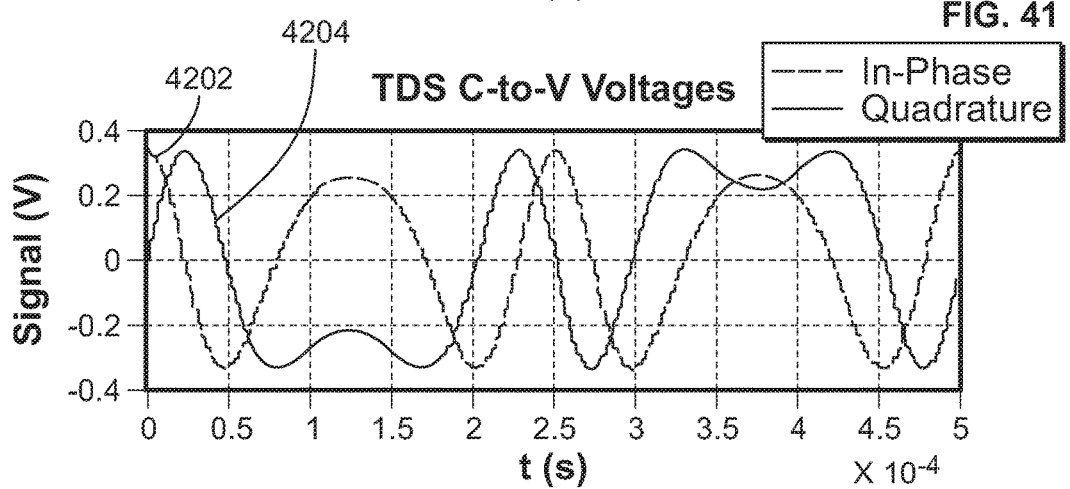
FIG. 42 depicts analog output signals of differential charge amplifiers at a proof mass oscillation of 4 microns, according to an illustrative implementation.

FIGS. 41 and 42 depict analog output signals of differential charge amplifiers at proof mass (e.g., 102, 203, 608, 1604, 1804 (FIGS. 1, 2, 6, 16, and 18)) oscillation of 7 microns and 4 microns, respectively. FIG. 41 includes an in-phase analog signal 4102 and an out-of-phase analog signal 4104. FIG. 42 includes an in-phase analog signal 4202 and an out-of-phase analog signal 4204. The signals 4102, 4104, 4202, and 4204 represent outputs of one or more matched analog to digital converters that can use sigma-delta direct conversion, and/or successive-approximation methods. The curves 4102, 4104, 4202, and 4204 are sampled at 400 kHz over one period of a 2 kHz resonant oscillation of the proof mass. In some examples, the arctangent algorithm requires the amplitudes of the I and Q signals to be equalized. One way to achieve this is to use a peak detection algorithm to determine the maximum amplitude of each signal and then scale each signal appropriately. In addition, the mean value, or DC component, of both I and Q signals should be zero. One way to achieve this is to subtract off the integrated value, or mean value, over one period of oscillation of the proof mass. Another way to achieve the zero mean is to constrain the drive amplitude to discrete levels at which the I and Q signals are naturally zero-valued. In particular, this condition requires that the quantity $2\pi *$ Amplitude/Pitch equal a zero of the zero order Bessel function of the first kind. After this scaling and mean-value adjusting, the I and Q signals can be divided as shown in equation 136.

$$\frac{C_Q(t)}{C_I(t)} = \tan\left[\frac{2\pi}{P} \cdot x(t)\right] \qquad [136]$$

Figure 43:
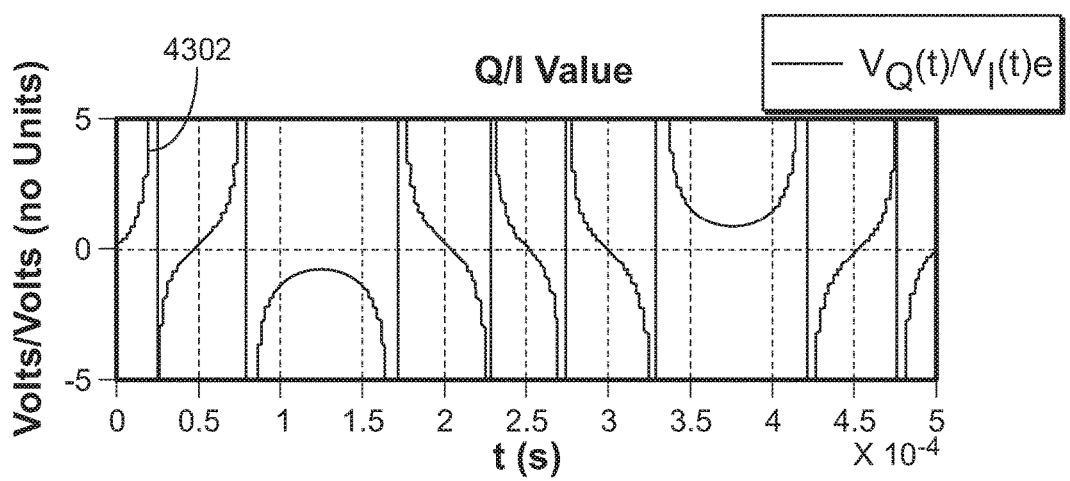
FIG. 43 depicts a ratio of quadrature and in-phase signals, according to an illustrative implementation.

FIG. 43 depicts the ratio of Q and I signals given by equation 136. FIG. 43 includes a curve 4302 that illustrates this ratio and includes phase wrap events. To recover displacement information of the proof mass, equation 136 can be inverted, resulting in equation 137.

$$\frac{x(t)}{P} = \frac{1}{2\pi} \cdot \arctan\left[\frac{C_Q(t)}{C_I(t)}\right] \qquad [137]$$

However, applying the arctangent function of equation 137 requires applying a phase unwrap function. In some examples, this function monitors the output of the arctangent function and adds multiples of $\pm 2\pi$ when absolute jumps between adjacent data points are greater than or equal to $\pi$ radians.

Figure 44:
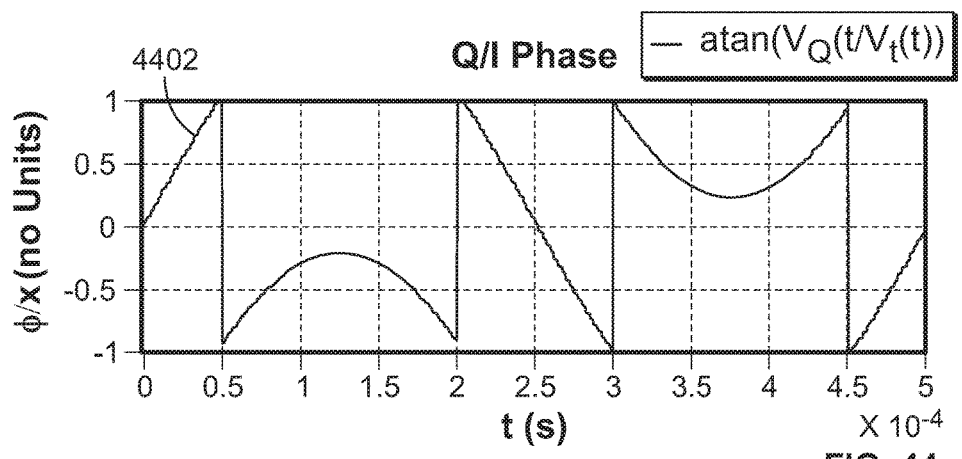
FIG. 44 depicts the arctangent of the quadrature to in-phase signal ratio without unwrapping, according to an illustrative implementation.

FIG. 44 depicts the arctangent of the Q/I ratio without unwrapping, as shown by curve 4402.

Figure 45:
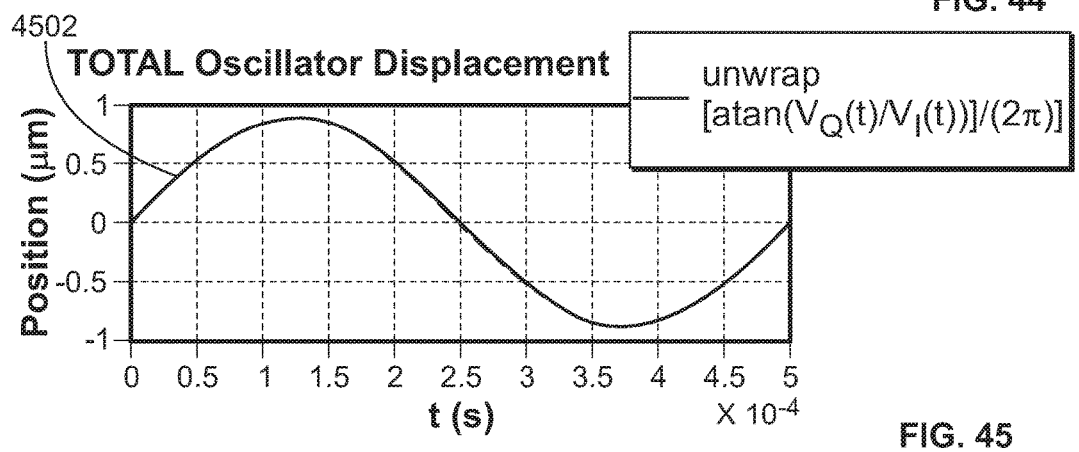
FIG. 45 depicts a proof mass position after unwrapping, according to an illustrative implementation.

FIG. 45 depicts the proof mass position after unwrapping. FIG. 45 includes a calculated displacement curve 4502 that represents a digital estimate of the proof mass position. After unwrapping, the curve 4502 is a smooth sinusoidal curve without phase wraps.

Figure 46:
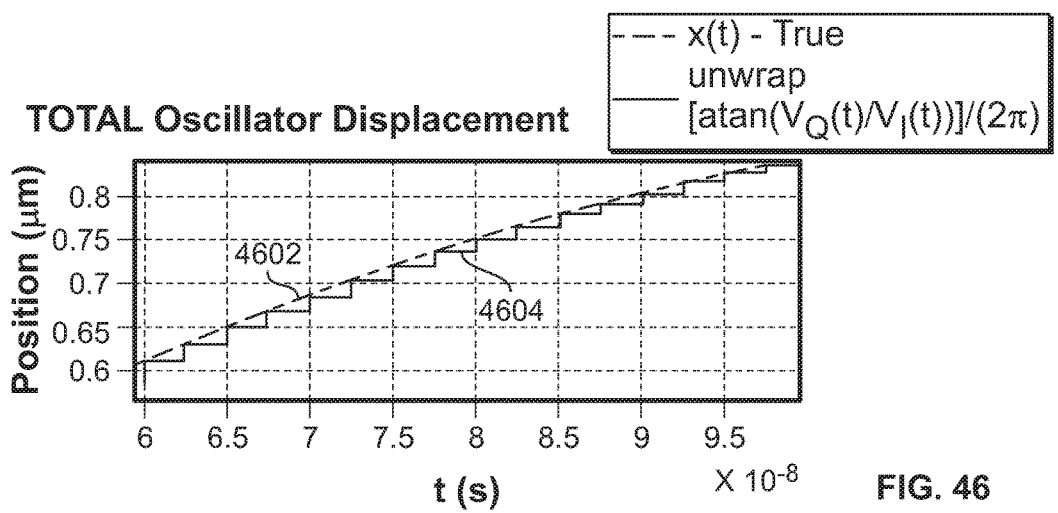
FIG. 46 depicts an enlarged view of a portion of FIG. 45, showing the difference between a true displacement and a digital estimate, according to an illustrative implementation.

FIG. 46 depicts an enlarged view of a portion of FIG. 45, showing the difference between the true displacement and the digital estimate. FIG. 46 includes a displacement curve 4602 that represents the true displacement of the proof mass. FIG. 46 also includes a digital estimate curve 4604 that represents the digital estimate of the position of the proof mass. The curve 4604 drawn in FIG. 46 is an enlarged view of the curve 4502 shown in FIG. 45. FIG. 46 shows the quantization error inherent in any digital representation of a continuous variable.

The arcsine, arccosine, and arctangent algorithms described herein are useful because they produce a digitized, accurate representation of oscillator position as a function of time, scaled by the pitch of a TDS structure (e.g., 105, 207, 506, 604, 606, 1501, 1503, 1606, 1608, 1806, 1808 (FIGS. 1, 2, 5, 6, 15, 16, and 18)). These methods have a bandwidth higher than the drive frequency of the proof mass (e.g., 102, 203, 608, 1604, 1804 (FIGS. 1, 2, 6, 16, and 18)). This high bandwidth prevents inputs from frequencies higher than the resonant frequency from coupling or aliasing into the inertial low-frequency band and affecting the inertial acceleration measurements. In addition, the arcsine, arccosine, and arctangent algorithms accurately map the motion of the proof mass, regardless of whether the motion is sinusoidal. Thus, the arcsine, arccosine, and arctangent algorithms will accurately recover the displacement and acceleration signals, despite spring non-idealities or high-frequency vibrational coupling.

The cosine, arcsine, arccosine, and arctangent algorithms are relatively immune to 1/f noise caused by electronics amplifiers and filters. The algorithms essentially encode the acceleration information on a higher frequency signal, thus up-modulating the acceleration information. Thus, low frequency drift of the electronics does not impact accuracy or drift of the acceleration measurement. The algorithms effectively remove offset and gain drift of electronics from acceleration measurement accuracy. As a result, only white noise significantly impacts resolution of the algorithms (but does not impact drift).

In some examples, analog and/or digital circuitry of the inertial device (e.g., 100, 202, 602, 1602, 1802 (FIGS. 1, 2, 6, 16, and 18)) is included in a single mixed-signal application-specific integrated circuit (ASIC) located on a single substrate. In other examples, analog and/or digital circuitry of the inertial device (e.g., 100, 202, 602, 1602, 1802 (FIGS. 1, 2, 6, 16, and 18)) is distributed between multiple integrated circuits. The multiple integrated circuits can all be located on a single substrate. In some examples, the multiple integrated circuits can be distributed across multiple substrates that are electrically connected. In some examples, some or all of the inertial device (e.g., 100, 202, 602, 1602, 1802 (FIGS. 1, 2, 6, 16, and 18)) is implemented using one or more digital processors.

The systems described herein can be fabricated using MEMS and microelectronics fabrication processes such as lithography, deposition, and etching. The features of the the inertial device (e.g., 100, 202, 602, 1602, 1802 (FIGS. 1, 2, 6, 16, and 18)) are patterned with lithography and selected portions are removed through etching. Such etching can include deep reactive ion etching (DRIE) and wet etching. In some examples, one or more intermediate metal, semiconducting, and/or insulating layers are deposited. The base wafer can be a doped semiconductor such as silicon. In some examples, ion implantation can be used to increase doping levels in regions defined by lithography. The proof mass (e.g., 102, 203, 608, 1604, 1804 (FIGS. 1, 2, 6, 16, and 18)) and TDS structures (e.g., 105, 207, 506, 604, 606, 1501, 1503, 1606, 1608, 1806, 1808 (FIGS. 1, 2, 5, 6, 15, 16, and 18)) can be defined in a substrate silicon wafer, which is then bonded to top and bottom cap wafers, also made of silicon. Encasing the proof mass in this manner allows the volume surrounding the mass to be evacuated. In some examples, a getter material such as titanium is deposited within the evacuated volume to maintain a low pressure throughout the lifetime of the device. This low pressure enhances the quality factor of the resonator. From the proof mass and TDS structures (e.g., 105, 207, 506, 604, 606, 1501, 1503, 1606, 1608, 1806, 1808 (FIGS. 1, 2, 5, 6, 15, 16, and 18)), conducting traces are deposited using metal deposition techniques such as sputtering or physical vapor deposition (PVD). These conducting traces electrically connect active areas of the proof mass and TDS structures to the microelectronic circuits depicted in FIG. 1. Similar conducting traces can be used to electrically connect the microelectronic circuits depicted in FIG. 1 to each other. The fabricated MEMS and microelectronic structures can be packaged using semiconductor packaging techniques including wire bonding and flip-chip packaging.

As used herein, the term "memory" includes any type of integrated circuit or other storage device adapted for storing digital data including, without limitation, ROM, PROM, EEPROM, DRAM, SDRAM, DDR/2 SDRAM, EDO/FPMS, RLDRAM, SRAM, flash memory (e.g., AND/NOR, NAND), memrister memory, and PSRAM.

As used herein, the term "digital circuitry" is meant generally to include all types of digital processing devices including, without limitation, digital signal processors (DSPs), reduced instruction set computers (RISC), general-purpose (CISC) processors, microprocessors, field programmable gate arrays (FPGAs), PLDs, reconfigurable compute fabrics (RCFs), array processors, secure microprocessors, and application-specific integrated circuits ASICs. Such digital processors may be contained on a single unitary integrated circuit die, or distributed across multiple components.

From the above description of the system it is manifest that various techniques may be used for implementing the concepts of the system without departing from its scope. For example, in some examples, any of the circuits described herein may be implemented as a printed circuit. Further, various features of the system may be implemented as software routines or instructions to be executed on a processing device (e.g. a general purpose processor, an ASIC, field programmable gate array (FPGA), etc.) The described embodiments are to be considered in all respects as illustrative and not restrictive. It should also be understood that the system is not limited to the particular examples described herein, but can be implemented in other examples without departing from the scope of the claims.

Similarly, while operations are depicted in the drawings in a particular order, this should not be understood as requiring that such operations be performed in the particular order shown or in sequential order, or that all illustrated operations be performed, to achieve desirable results.

What is claimed is:

1. A method for determining an inertial parameter, comprising:
   receiving, by an analog-to-digital converter, a first periodic analog signal from a first sensor that is responsive to motion of a proof mass;
   converting, by the analog-to-digital converter, the first periodic analog signal to a first periodic digital signal;
   generating, by signal-conditioning circuitry, a conditioned first periodic digital signal by at least:
      scaling the first periodic digital signal to a predetermined amplitude; and
      offsetting the scaled first periodic digital signal;
   applying, by digital circuitry, an inverse trigonometric function to a quantity that is based on the conditioned first periodic digital signal to generate a result; and
   determining the inertial parameter based on the result.

2. The method of claim 1, wherein the first sensor is a first electrode interacting with the proof mass.

3. The method of claim 2, wherein the first electrode electrostatically interacts with the proof mass.

4. The method of claim 1, wherein:
   the inertial parameter comprises a displacement of the proof mass; and
   determining the inertial parameter comprises multiplying an unwrapped inverted signal by a geometric dimension to obtain the displacement of the proof mass.

5. The method of claim 1, further comprising unwrapping the result, and wherein determining the inertial parameter based on the result comprises determining the inertial parameter based on the unwrapped result.

6. The method of claim 1, wherein applying the inverse trigonometric function comprises applying an arcsine function to the quantity.

7. The method of claim 1, wherein applying the inverse trigonometric function comprises applying an arccosine function to the quantity.

8. The method of claim 1, wherein applying the inverse trigonometric function comprises using a lookup table to determine a table entry corresponding to the conditioned first periodic digital signal.

9. The method of claim 5, wherein unwrapping comprises:
determining that a phase wrap has occurred by:
determining that a slope of the result has changed sign;
determining that the result has changed by a predetermined increment; and
determining that the sum of a prior slope and a prior value of the result would exceed a threshold; and
adjusting a present value of the result and one or more future values of the result.

10. The method of claim 4, further comprising:
low-pass filtering the displacement to determine an inertial displacement; and
multiplying the inertial displacement by a square of a natural frequency of the proof mass to determine an acceleration of the proof mass.

11. The method of claim 1, wherein the first periodic digital signal comprises a quotient of a first digital signal and a second digital signal.

12. The method of claim 1, wherein offsetting comprises:
integrating the first periodic digital signal for a predetermined time interval to determine an integral; and
subtracting the integral from the first periodic digital signal.

13. The method of claim 1, further comprising amplifying the first periodic analog signal to a first periodic analog voltage.

14. The method of claim 13, further comprising:
receiving a second analog signal from a second sensor that is responsive to motion of the proof mass;
amplifying the second analog signal to a second analog voltage;
converting the second analog voltage to a second periodic digital signal; and
conditioning the second periodic digital signal by:
scaling the second periodic digital signal to the predetermined amplitude, and
offsetting the second periodic digital signal to the predetermined offset;
wherein the quantity is based on a quotient of the first and second conditioned digital signals.

15. The method of claim 13, further comprising:
receiving a second analog signal from a second sensor that is responsive to motion of the proof mass; and
wherein amplifying the first analog signal to the first analog voltage comprises amplifying a difference between the first and second analog signals to the first analog voltage.

16. The method of claim 15, further comprising:
receiving third and fourth analog signals from third and fourth sensors, respectively, each sensor responsive to motion of the proof mass;
amplifying a second difference between the third and fourth analog signals to a second analog voltage;
converting the second analog voltage to a second digital representation to generate a second periodic digital signal; and
conditioning the second periodic digital signal by:
scaling the second periodic digital signal to the predetermined amplitude, and
offsetting the second periodic digital signal to the predetermined offset;
wherein the quantity comprises a quotient of the first and second conditioned digital signals.

17. The method of claim 16, wherein the second, third, and fourth sensors are second, third, and fourth electrodes, respectively, each electrostatically interacting with the proof mass.

18. A system for determining an inertial parameter, comprising circuitry configured for:
receiving, by an analog-to-digital converter, a first periodic analog signal from a first sensor that is responsive to motion of a proof mass;
converting, by the analog-to-digital converter, the first periodic analog signal to a first periodic digital signal;
generating, by signal-conditioning circuitry, a conditioned first periodic digital signal by at least:
scaling the first periodic digital signal to a predetermined amplitude; and
offsetting the first periodic digital signal;
determining a result of applying an inverse trigonometric function to a quantity, that is based on the conditioned first periodic digital signal; and
determining the inertial parameter based on the result.

19. The system of claim 18, wherein the first sensor is a first electrode interacting with the proof mass.

20. The system of claim 19, wherein the first electrode electrostatically interacts with the proof mass.

21. The system of claim 18, wherein:
the inertial parameter comprises a displacement of the proof mass; and
determining the inertial parameter comprises multiplying an unwrapped inverted signal by a geometric dimension to obtain the displacement of the proof mass.

22. The system of claim 18, further comprising circuitry configured for unwrapping the result, and wherein determining the inertial parameter based on the result comprises determining the inertial parameter based on the unwrapped result.

23. The system of claim 18, wherein determining the result of applying the inverse trigonometric function to the quantity comprises determining the result of applying an arcsine function to the quantity.

24. The system of claim 18, wherein determining the result of applying the inverse trigonometric function to the quantity comprises determining the result of applying an arccosine function to the quantity.

25. The system of claim 18, wherein determining the result of applying the inverse trigonometric function to the quantity comprises determining the result using a lookup table, the result corresponding to the conditioned digital signal.

26. The system of claim 22, wherein unwrapping comprises:
determining that a phase wrap has occurred by:
determining that a slope of the result has changed sign;
determining that the result has changed by a predetermined, increment; and
determining that the sum of a prior slope and a prior value of the result would exceed a threshold; and adjusting a present value of the result and one or more future values of the result.

27. The system of claim 21, further comprising circuitry configured for:
low-pass filtering the displacement to determine an inertial displacement; and
multiplying the inertial displacement by a square of a natural frequency of the proof mass to determine an acceleration of the proof mass.

28. The system of claim 18, wherein the first periodic digital signal comprises a quotient of a first digital signal and a second digital signal.

29. The system of claim 18, wherein offsetting comprises:
integrating the first periodic digital signal for a predetermined time interval to determine an integral; and
subtracting the integral from the first periodic digital signal.

30. The system of claim 18, further comprising circuitry configured for amplifying the first periodic analog signal to a first periodic analog voltage.

31. The system of claim 30, further comprising circuitry configured for:
receiving a second analog signal from a second sensor that is responsive to motion of the proof mass;
amplifying the second analog signal to a second analog voltage;
converting the second analog voltage to a second periodic digital signal; and
conditioning the second periodic digital signal by:
scaling the second periodic digital signal to the predetermined amplitude, and
offsetting the second periodic digital signal to the predetermined offset;
wherein the quantity is based on a quotient of the first and second conditioned digital signals.

32. The system of claim 30, further comprising circuitry configured for:
receiving a second analog signal from a second sensor that is responsive to motion of the proof mass; and
wherein amplifying the first analog signal to the first analog voltage comprises amplifying a difference between the first and second analog signals to the first analog voltage.

33. The system of claim 32, further comprising circuitry configured for:
receiving third and fourth analog signals from third and fourth sensors, respectively, each sensor responsive to motion of the proof mass;
amplifying a second difference between the third and fourth analog signals to a second analog voltage;
converting the second analog voltage to a second digital representation to generate a second periodic digital signal; and
conditioning the second periodic digital signal by:
scaling the second periodic digital signal to the predetermined amplitude, and
offsetting the second periodic digital signal to the predetermined offset;
wherein the quantity comprises a quotient of the first and second conditioned digital signals.

34. The system of claim 33, wherein the second, third, and fourth sensors are second, third, and fourth electrodes, respectively, each electrostatically interacting with the proof mass.

35. The system of claim 18, further comprising the proof mass and the first sensor.

36. The system of claim 32, further comprising the second sensor.

37. The system of claim 33, further comprising the third and fourth sensor.

* * * * *

UNITED STATES PATENT AND TRADEMARK OFFICE
CERTIFICATE OF CORRECTION

PATENT NO. : 10,234,476 B2
APPLICATION NO. : 15/160091
DATED : March 19, 2019
INVENTOR(S) : Richard Lee Waters et al.

Page 1 of 1

It is certified that error appears in the above-identified patent and that said Letters Patent is hereby corrected as shown below:

In the Claims

Column 56, Line 28, after "a" before "that" delete "quantity," insert --quantity--

Column 56, Lines 63 and 64, after "a" before "increment;" delete "predetermined," insert --predetermined--

Signed and Sealed this
Seventh Day of May, 2019

Andrei Iancu
*Director of the United States Patent and Trademark Office*